United States Patent
Zhu et al.

(10) Patent No.: US 11,942,414 B2
(45) Date of Patent: Mar. 26, 2024

(54) INTEGRATED CIRCUITS (ICs) EMPLOYING DIRECTLY COUPLED METAL LINES BETWEEN VERTICALLY-ADJACENT INTERCONNECT LAYERS FOR REDUCED COUPLING RESISTANCE, AND RELATED METHODS

(71) Applicant: QUALCOMM Incorporated, San Diego, CA (US)

(72) Inventors: John Jianhong Zhu, San Diego, CA (US); Junjing Bao, San Diego, CA (US); Giridhar Nallapati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 134 days.

(21) Appl. No.: 17/478,539

(22) Filed: Sep. 17, 2021

(65) Prior Publication Data

US 2023/0108523 A1    Apr. 6, 2023

(51) Int. Cl.
*H01L 23/522* (2006.01)
*H01L 23/00* (2006.01)

(52) U.S. Cl.
CPC ...... *H01L 23/5223* (2013.01); *H01L 23/5226* (2013.01); *H01L 23/5227* (2013.01); *H01L 24/13* (2013.01); *H01L 2224/13025* (2013.01)

(58) Field of Classification Search
CPC ............. H01L 23/5223; H01L 23/5226; H01L 23/5227; H01L 24/13; H01L 2224/13025; H01L 27/0207

(Continued)

(56) References Cited

U.S. PATENT DOCUMENTS 5,616,961 A   4/1997  Kohyama
6,576,848 B1  6/2003  Cronin et al.
(Continued)

FOREIGN PATENT DOCUMENTS

EP    1768180 A2    3/2007
JP    2007158169 A  6/2007

OTHER PUBLICATIONS

International Search Report and Written Opinion for International Patent Application No. PCT/US2022/074683, dated Dec. 21, 2022, 14 pages.

*Primary Examiner* — Thinh T Nguyen
(74) *Attorney, Agent, or Firm* — Withrow & Terranova, PLLC

(57) ABSTRACT

Integrated circuits (ICs), including capacitors and inductors, employing directly coupled metal lines between vertically-adjacent interconnect layers for reduced coupling resistance, and related fabrication methods. By directly coupled, it is meant that there is not an intermediate vertical interconnect access (via) layer with a via(s) interconnecting the metal lines in vertically-adjacent interconnect layers. An overlying and underlying metal line in respective and vertically-adjacent overlying and underlying interconnect layers are directly coupled to each other without the need for an intermediate via layer. For example, directly coupled metal in adjacent interconnect layers of IC can reduce contact resistance between the metal lines and reduce the overall height of the IC. An insulating layer(s) can be disposed in select recessed regions between the overlying interconnect layer and the underlying interconnect layer to insulate an overlying metal line from another vertically-intersecting underlying metal line that are not intended to be electrically coupled together.

15 Claims, 23 Drawing Sheets

(58) Field of Classification Search
USPC .......................................... 257/532; 438/957
See application file for complete search history.

(56) References Cited

U.S. PATENT DOCUMENTS

| | | |
|---|---|---|
| 8,779,592 B2 | 7/2014 | Tang et al. |
| 8,907,497 B2 | 12/2014 | Chang et al. |
| 9,627,310 B2 | 4/2017 | Chang et al. |
| 2008/0251929 A1 | 10/2008 | Kageyama |
| 2012/0326270 A1* | 12/2012 | Thompson et al. ......... H01L 27/0207 257/532 |
| 2020/0312514 A1 | 10/2020 | Vanukuru et al. |

* cited by examiner

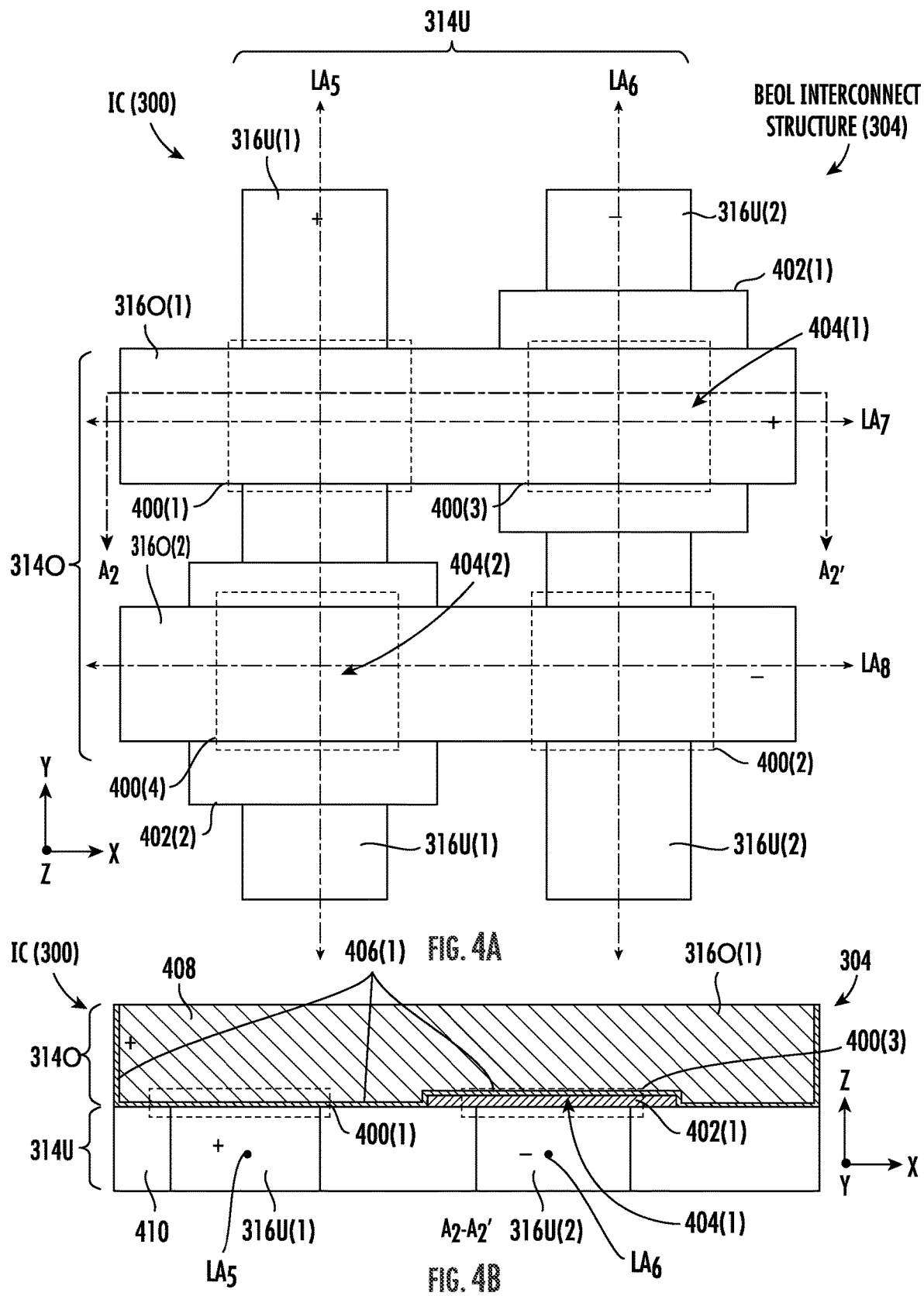

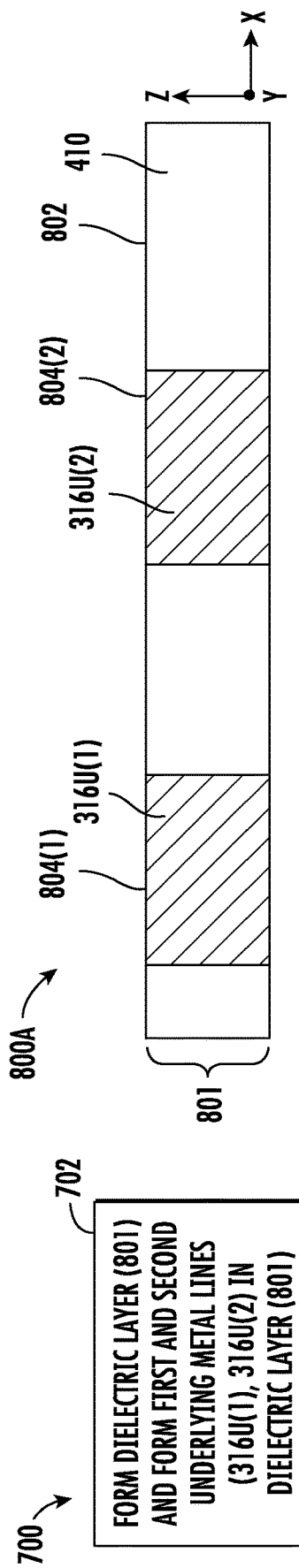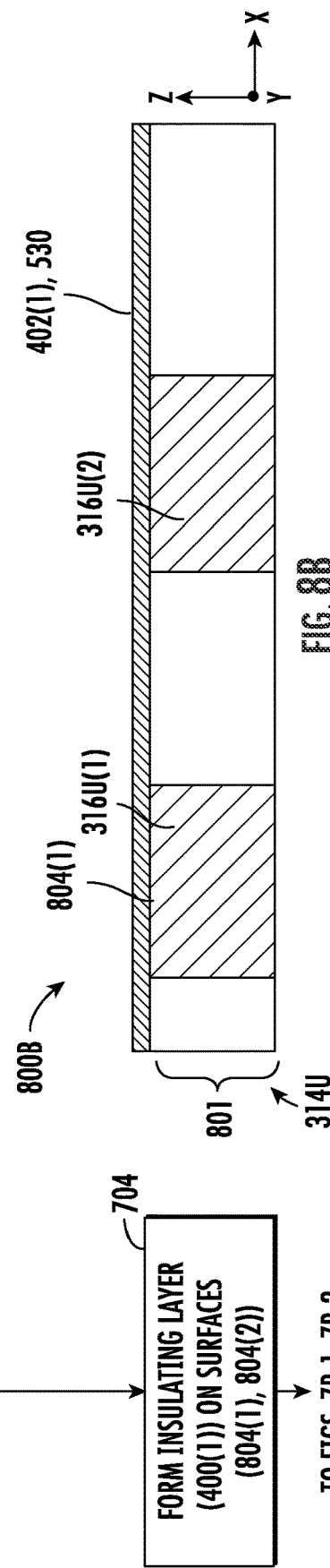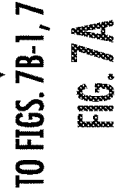

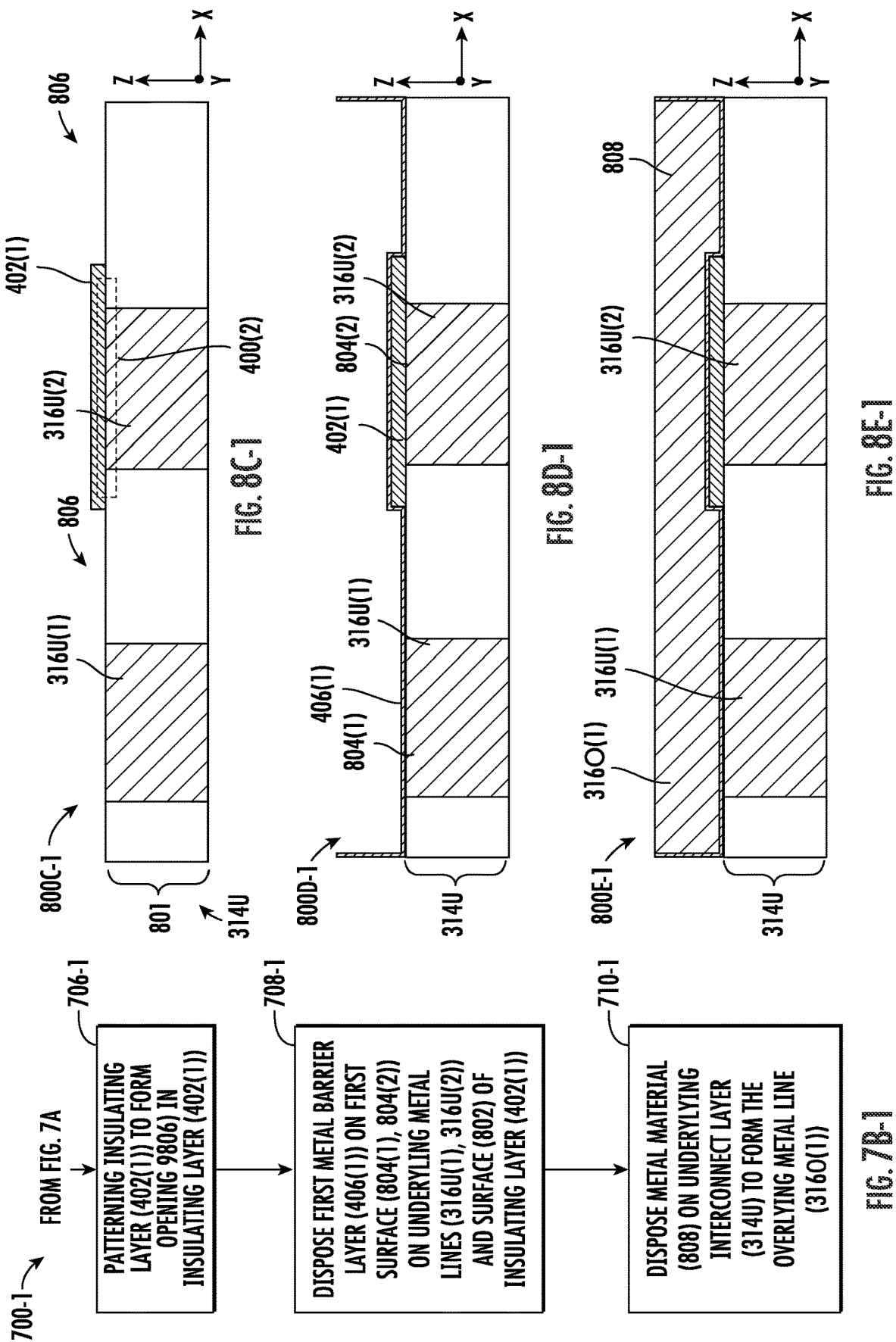

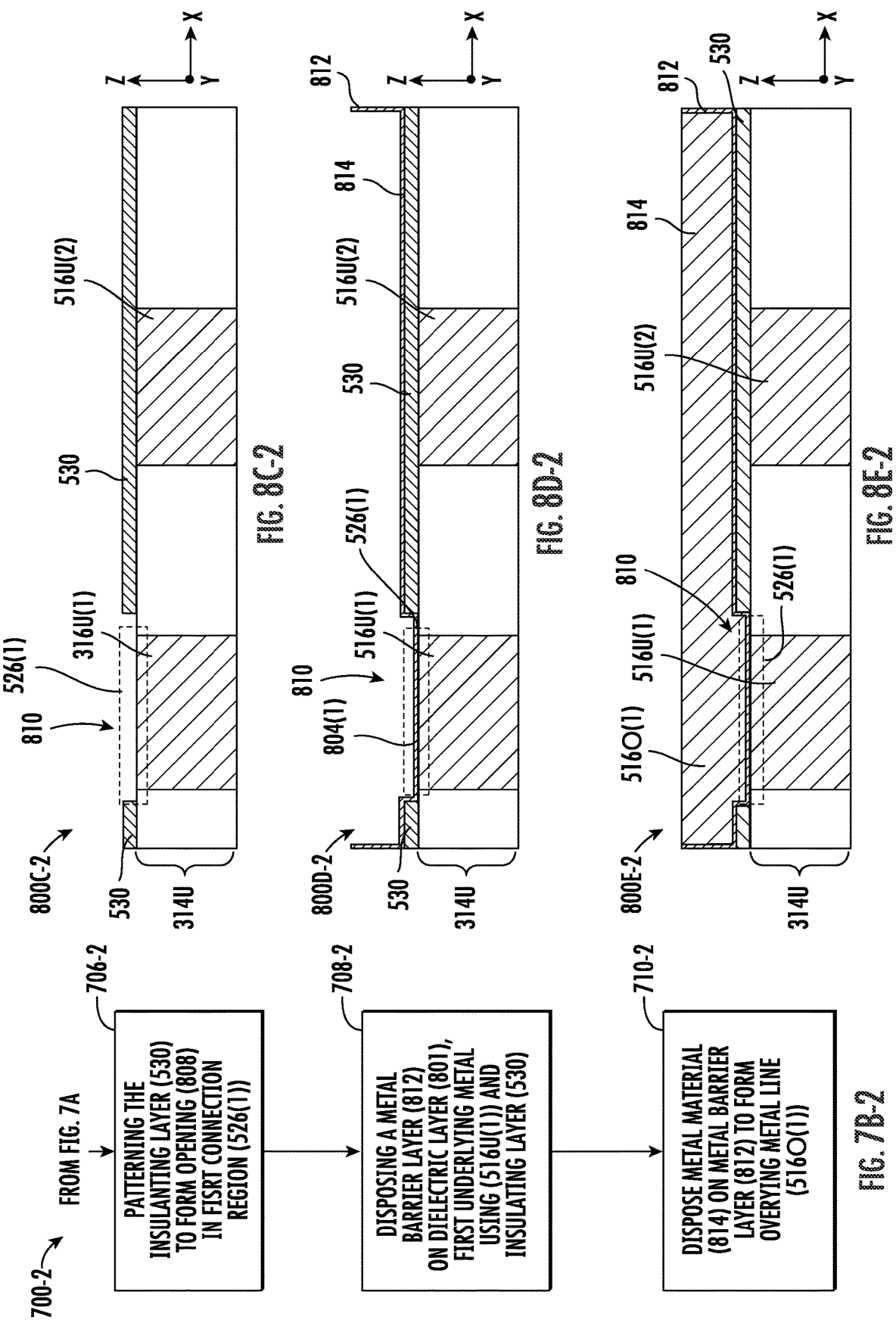

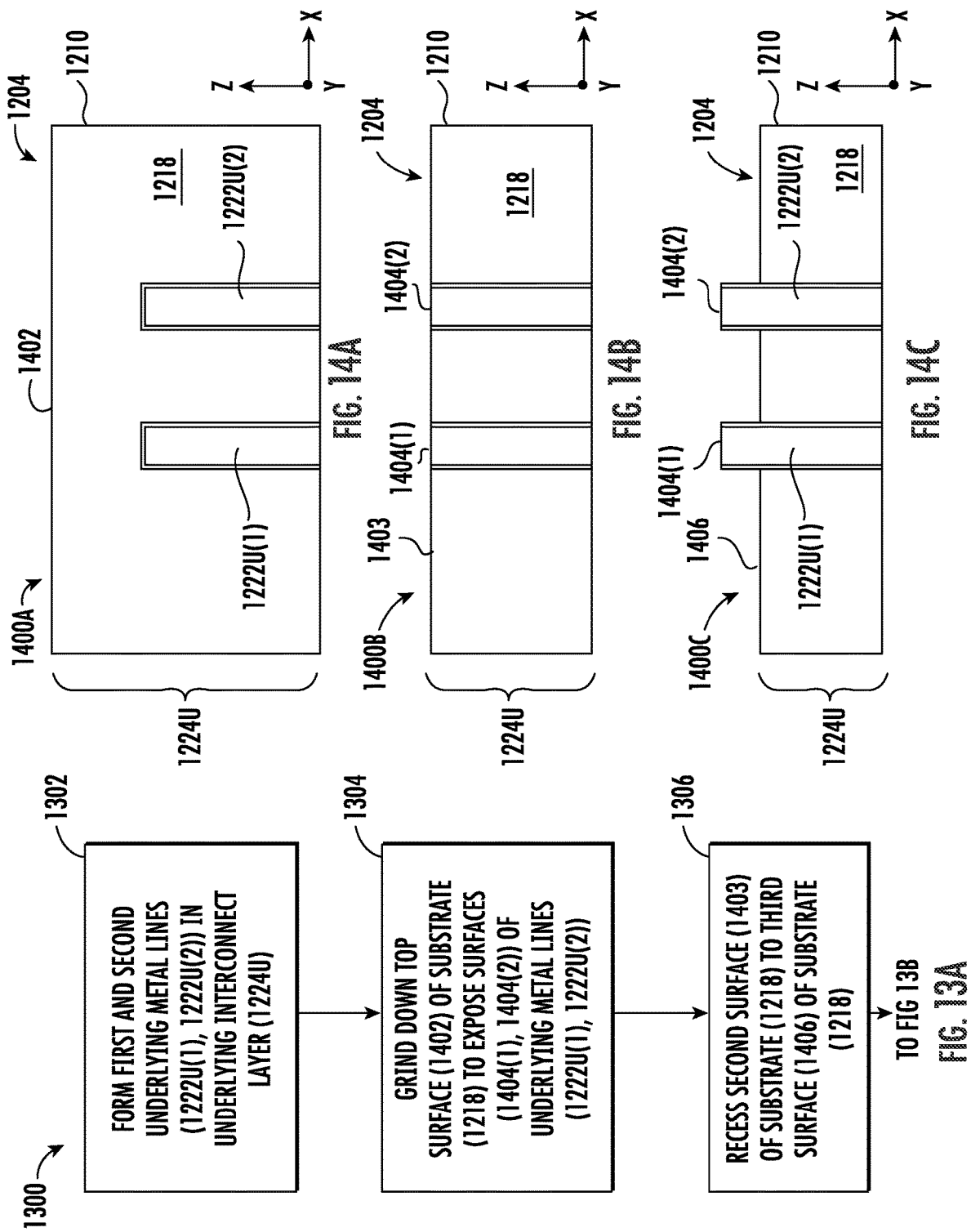

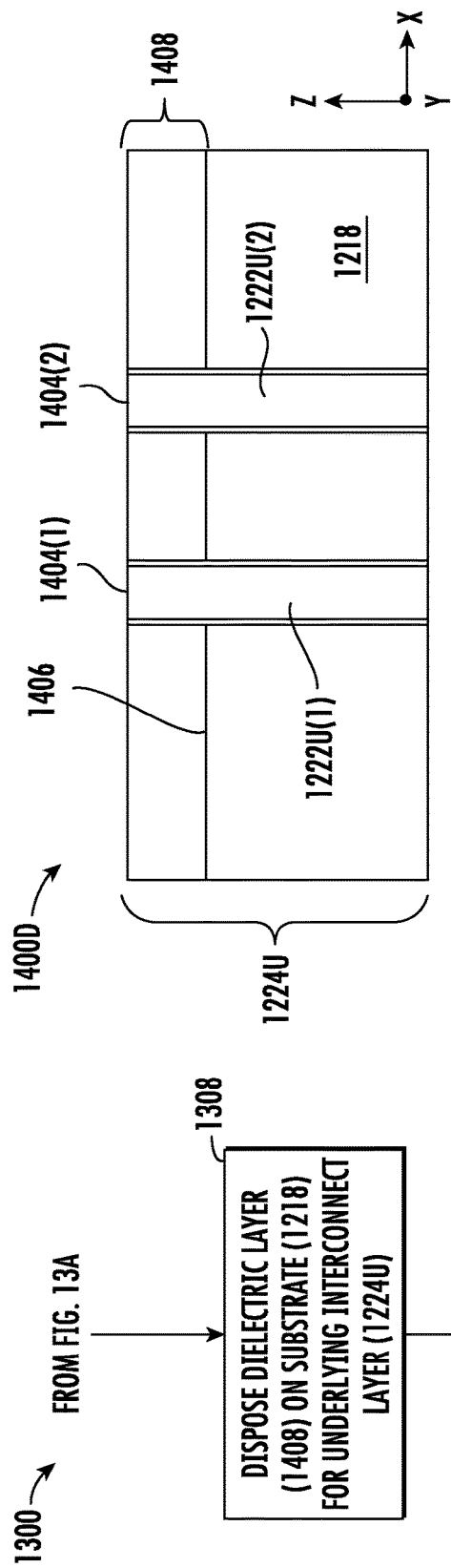
FIG. 14D
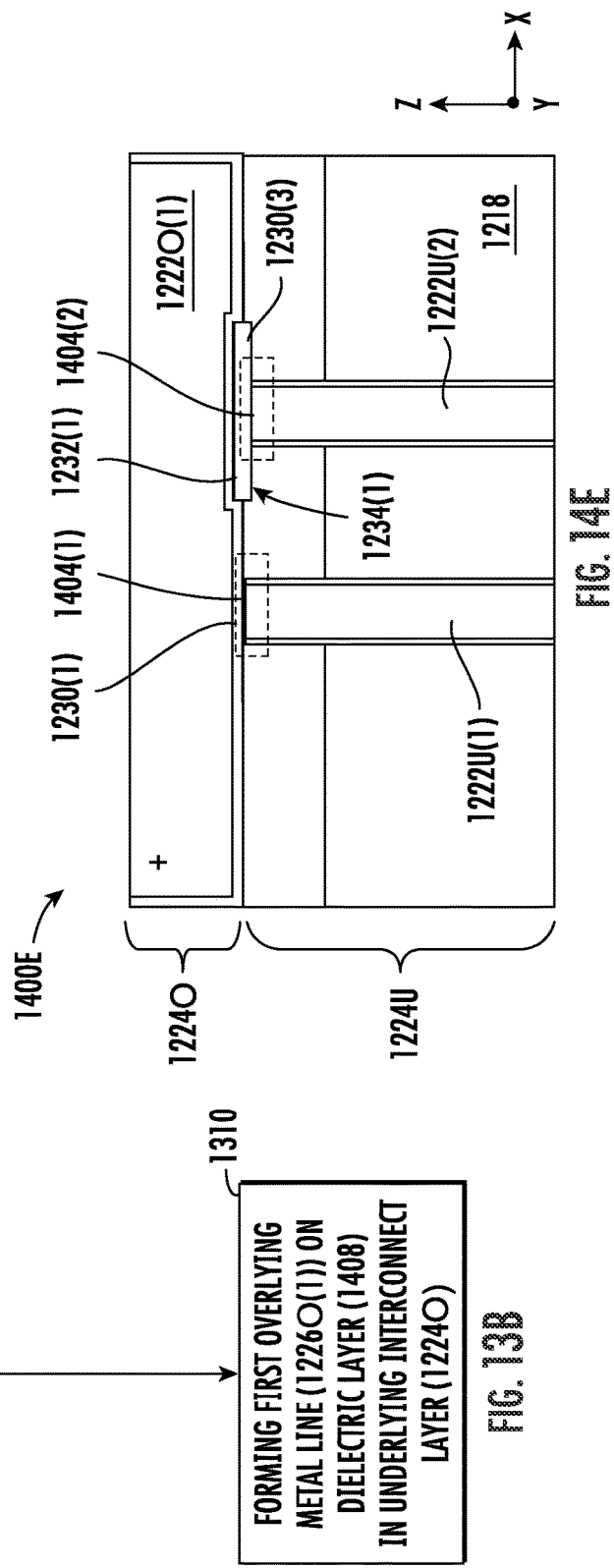
FIG. 14E
FIG. 13B

A4-A4'

A5-A5'

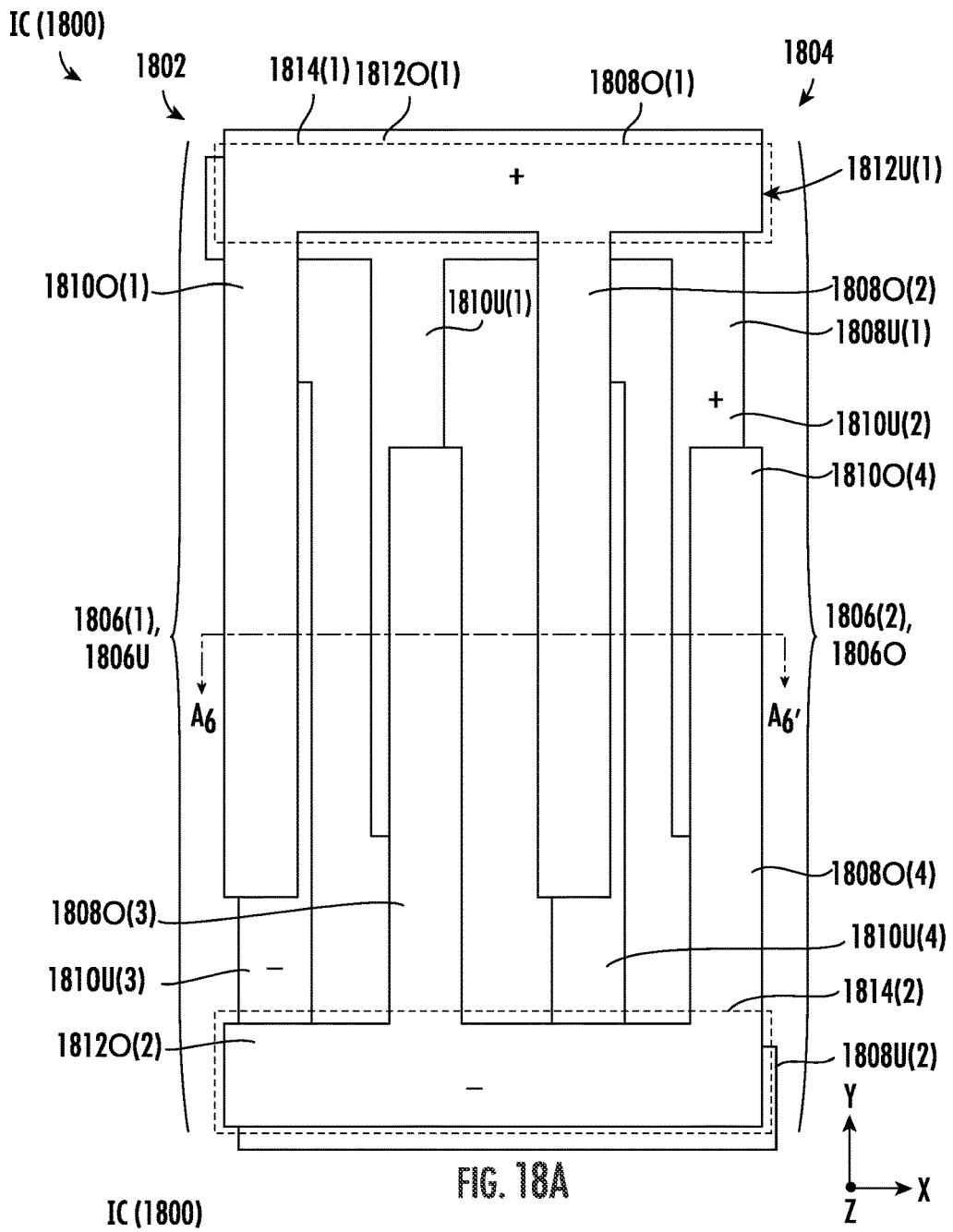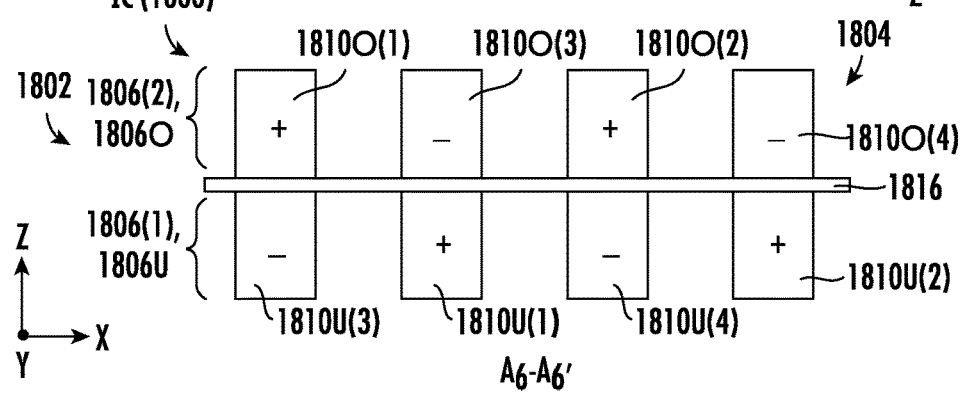

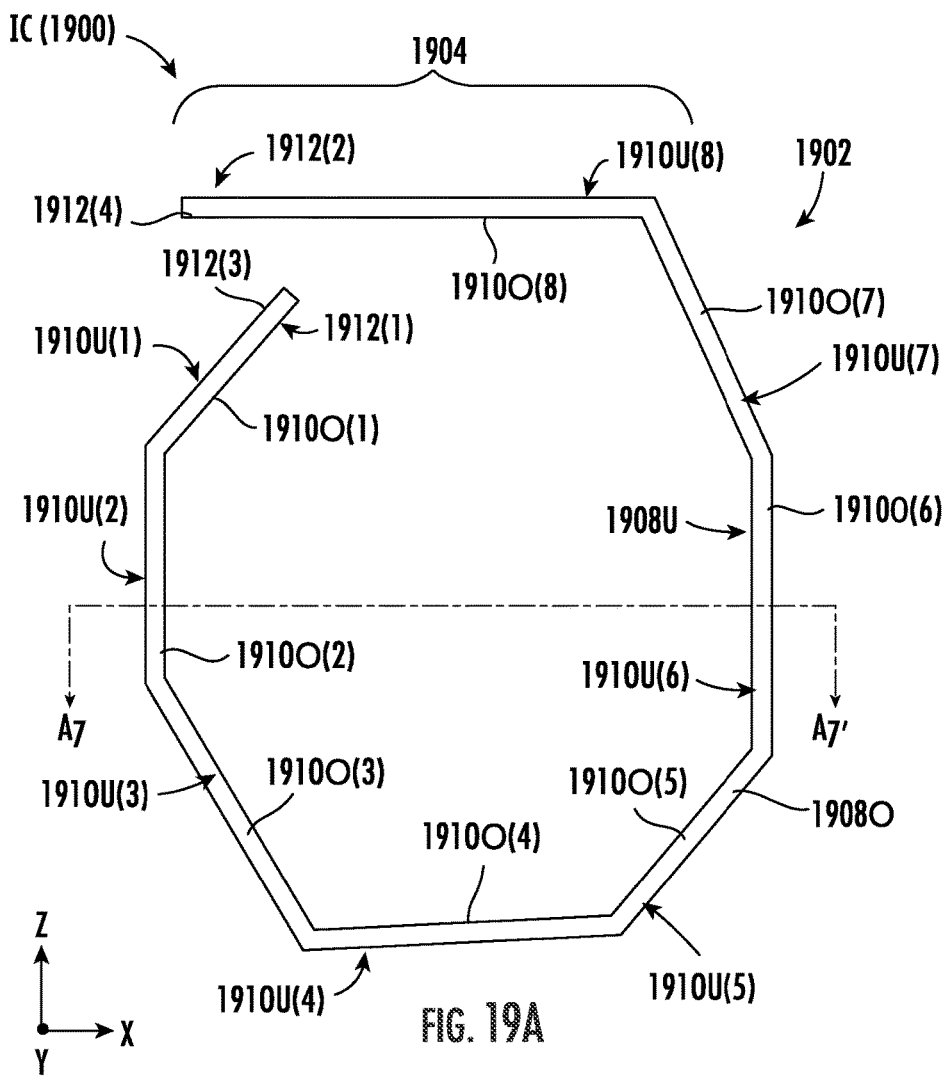
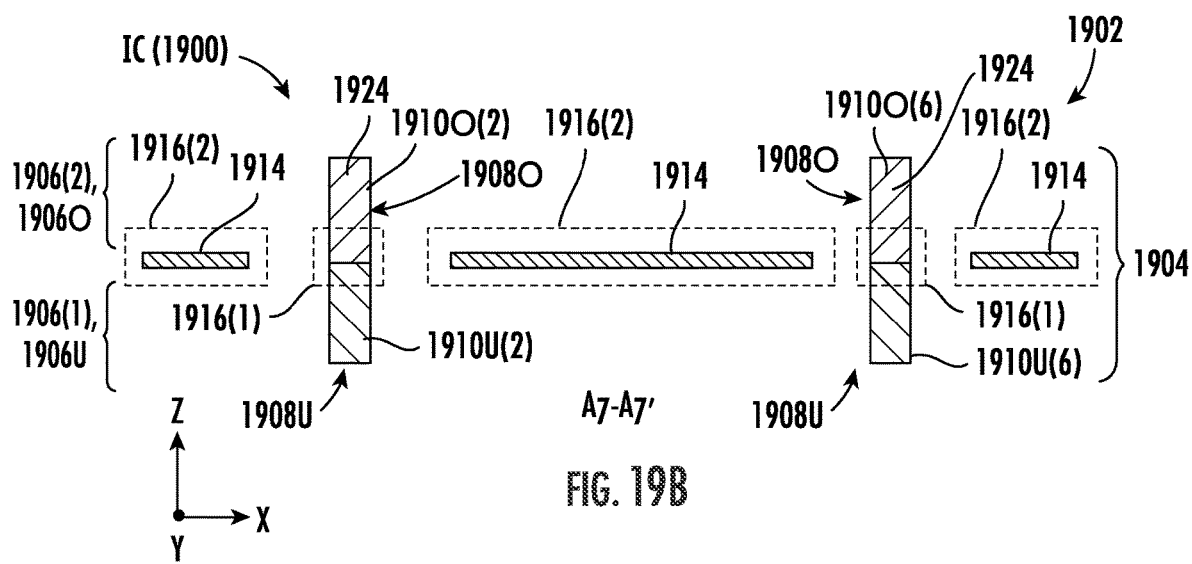
FIG. 19A
FIG. 19B

INTEGRATED CIRCUITS (ICs) EMPLOYING DIRECTLY COUPLED METAL LINES BETWEEN VERTICALLY-ADJACENT INTERCONNECT LAYERS FOR REDUCED COUPLING RESISTANCE, AND RELATED METHODS

BACKGROUND

I. Field of the Disclosure

The field of the disclosure relates to integrated circuits (IC) and related semiconductor dies ("dies") employing an interconnect structure fabricated through a back-end-of-line (BEOL) process for interconnecting semiconductor devices in the die.

II. Background

Computing devices have become increasingly common in modern society. Early computers were the size of a room and employed vacuum tubes to provide rudimentary mathematical calculations. In contrast, modem computing devices provide myriad multimedia, telephony, word processing, and other functions in a relatively small package relying on integrated circuits (ICs). The industry feels market pressure to provide ever increasing processing options in increasingly small products. While ICs have generally obeyed Moore's Law, continued advances in IC functionality in a smaller package is stressing manufacturing capabilities.

Current IC manufacturing processes rely on sequences of masks used in stages to create multi-level ICs. ICs, which are provided in the form of a semiconductor die ("die"), include an active semiconductor layer conventionally fabricated in a front-end-of-line (FEOL) fabrication process. The active semiconductor layer includes semiconductor devices (e.g., transistors). The IC also includes an interconnect structure formed adjacent to the semiconductor layer, typically through a back-end-of-line (BEOL) fabrication process. The interconnect structure includes multiple metallization layers each with metal lines (e.g., metal traces) disposed in a respective metallization layer to provide interconnections between different semiconductor devices and/or external interconnects (e.g., solder balls). Vertical interconnect accesses (vias), such as metal pillars and through-silica-vias (TSVs), are disposed in the metallization layers to provide interconnections between adjacent metal lines in adjacent metallization layers.

As semiconductor device density increases in an IC die, the need for providing more power and ground connections in an IC die increases. The conventional technique to deliver power in an IC is through a power distribution network (PDN) in the interconnect structure that employs multiple metal lines over multiple metallization layers to distribute power. However, such power grids are negatively impacted as the physical size of the metal lines within the metallization layers is reduced due to a reduction in the size of IC die and its related package. Specifically, as the physical size of the conductive material of the metal lines in the metallization layers of the interconnect structure of the IC die diminishes, the contact resistance of the metal lines also increases. To mitigate this increase in resistance, multiple vias can be provided to couple adjacent metal lines in adjacent metallization layers together as part of the same node to reduce the contact resistance. Even so, the metal lines may have a higher resistance than desired. If these metal lines are employed in a PDN of the IC die, the increased resistance can result a higher current-resistance (IR) drop than desired in the PDN.

SUMMARY OF THE DISCLOSURE

Exemplary aspects disclosed in the detailed description include integrated circuits (ICs) employing directly coupled metal lines between vertically-adjacent interconnect layers for reduced coupling resistance. Related fabrication methods are also disclosed. The IC can include capacitors and/or inductors that employ directly-coupled metal lines between vertically-adjacent interconnect layers. By directly coupled, it is meant that there is not an intermediate vertical interconnect access (via) layer with a via(s) interconnecting the metal lines in vertically-adjacent interconnect layers. For example, vertically-adjacent interconnect layers in an IC can be provided as adjacent metallization layers in a back-end-of-line (BEOL) interconnect structure fabricated as part of a back-end-of-line (BEOL) fabrication process. The BEOL interconnect structure is fabricated on a front side of an active semiconductor layer of the IC. For example, it may be desired to provide coupled metal lines (e.g., metal traces) in adjacent metallization layers of the BEOL interconnect structure as part of a power distribution network (PDN) in the IC to reduce contact resistance, and thus reduce current (I)–resistance(R) (IR) drop. As another example, it may be desired to electrically couple metal lines in adjacent metallization layers in a BEOL interconnect structure as part of a capacitor (e.g., a metal-oxide-metal (MoM) capacitor) or coil inductor to reduce resistance and/or area needed in the interconnect structure to provide such devices. In another example, vertically-adjacent interconnect layers of an IC can be provided in an semiconductor substrate with buried metal lines vertically adjacent to a metallization layer formed on a back side of the semiconductor substrate.

Providing coupled metal lines between vertically-adjacent interconnect layers in the IC can avoid the need to fabricate a separate via layer between the adjacent interconnect layers having respective adjacent metal lines to be electrically coupled to each other to form an interconnect between the adjacent metal lines for the desired application. Thus, a separate via layer mask may not be required to form vias in a separate via layer between the adjacent interconnect layers that are designed to have metal lines directly coupled with each other. Providing directly coupled metal lines between adjacent interconnect layers in an IC can also reduce the overall height of the semiconductor die ("die") stack in the IC. This reduction in height can be realized or consumed by additional metallization layers to support a higher density of devices and interconnections in the die.

In one exemplary aspect, to provide directly coupled metal lines between adjacent interconnect layers in a BEOL interconnect structure in an IC, a first, overlying metal line disposed in a first, overlying metallization layer in a BEOL interconnect structure of an IC is in contact with at least a portion of a second, underlying metal line in a second, adjacent, underlying metallization layer in the BEOL interconnect structure. The overlying and underlying metallization layers are overlying and underlying interconnect layers, respectively. The overlying and underlying metal lines extend longitudinally orthogonal to each other in a horizontal direction in their respective metallization layers. Direct contact between the overlying and underlying metal lines can be provided in a connection region at an intersection of the overlying and underlying metal lines in the vertical direction. In this manner, vias are not required to be employed in a separate via layer between the first and second adjacent metallization layers in the BEOL interconnect structure to couple the overlying and underlying metal lines in the adjacent metallization layers to each other. For example, the overlying and underlying metal lines that are formed in direct contact with each other may be a positive power rail or negative/ground power rail as part of a PDN distributed in the overlying and underlying metal lines metallization layers. Direct contact between the overlying and underlying metal lines in adjacent metallization layers as part of a PDN can reduce contact resistance, which may be desired to reduce IR drop in the PDN.

Because an overlying metal line in an overlying metallization layer may extend to be vertically disposed above other underlying metal lines in an underlying metallization layer that should not be directly coupled to each other, a thin insulating layer(s) of a dielectric material can be disposed (e.g., patterned) in select regions below the overlying metal line in the overlying metallization layer to insulate and isolate the overlying metal lines from other underlying metal lines in the underlying metallization layer that also intersect vertically with the overlying metal line. For example, two adjacent overlying metal lines in an underlying metal layer may be positive and negative/ground metal lines respectively for a PDN. It may be desired to couple the positive overlying metal line directly to the positive underlying metal line while ensuring the positive overlying metal line is not in conductive contact with a negative/ground underlying metal line. In this regard, the insulation layers can be formed in a recess formed in the overlying metal line in the overlying metallization layer so as to not require a separate insulating layer between metallization layers to avoid an increase in height of the BEOL interconnect structure. Alternatively, the thin insulation layers can be formed by patterning openings in an insulating layer disposed in a contact region between the underlying and overlying metal lines where these metal lines are to be directly coupled. Patterned openings are formed in the insulating layer where the overlying metal line to be formed in the overlying metallization layer is to be directly coupled to an underlying metal layer in the underlying metallization layer. A metal material that is disposed in the overlying metallization layer to form the overlying metal line is also disposed in the patterned openings that extend through the insulating layer and in direct contact with the underlying metal line. In this manner, the insulating layer is not patterned and remains present in areas where the underlying and overlying metal lines should not be electrically coupled to each other.

Note that not all metallization layers in the BEOL interconnect structure are required to be provided without an intermediate via layer between adjacent metallization layers. It may be desired that only a subset of metallization layers in the interconnect structure be provided that include direct connections between adjacent metal lines in such subset of metallization layers.

In another exemplary aspect, the IC could include directly coupled metal lines in adjacent interconnect layers in a vertical direction on a back side of a semiconductor structure of the IC. For example, the semiconductor structure includes an active semiconductor layer disposed on a semiconductor substrate. The semiconductor substrate can be an underlying interconnect layer that includes buried metal lines as underlying metal lines. For example, the buried metal lines may be part of a PDN of the IC. The buried metal lines in the semiconductor substrate can be coupled to a back side of source and/or drain contacts of field effect transistors (FETs) to distribute power to such FETs. One or more metallization layers as additional interconnect layers could be formed on a back side of the semiconductor substrate that include metal lines as overlying metal lines that are directly coupled to buried metal lines in the semiconductor substrate. The other exemplary aspects of directly coupling overlying metal lines to underlying metal lines discussed above for a BEOL interconnect structure can also be applicable to directly coupled metal lines in adjacent interconnect layers in the vertical direction on the back side of the active semiconductor layer of the IC. Again, providing directly coupled metal lines between the semiconductor substrate and an adjacent interconnect layer on the back side of the IC can reduce metal line contact resistance and also reduce the height of the IC by eliminating the need for an intermediate via layer between the semiconductor substrate and an adjacent interconnect layer.

In one exemplary aspect, a capacitor is provided. The capacitor comprises an interconnect structure. The interconnect structure comprises an underlying interconnect layer that comprises a first underlying metal finger structure comprising a plurality of first underlying metal lines extending in parallel to each other, and a second underlying metal finger structure comprising a plurality of second underlying metal lines extending in parallel to each other. The first underlying metal finger structure is interdigitated with the second underlying metal finger structure. The interconnect structure also comprises an overlying interconnect layer disposed adjacent to the underlying interconnect layer in a vertical direction that comprises a first overlying metal finger structure comprising a plurality of first overlying metal lines extending in parallel to each other, and a second overlying metal finger structure comprising a plurality of second overlying metal lines extending in parallel to each other. The first overlying metal finger structure is interdigitated with the second overlying metal finger structure. The first overlying metal finger structure intersects the first underlying metal finger structure in the vertical direction in a first connection region. The first overlying metal finger structure coupled to the first underlying metal finger structure in the first connection region. The second overlying metal finger structure intersects the second underlying metal finger structure in the vertical direction in a second connection region. The second overlying metal finger structure coupled to the second underlying metal finger structure in the second connection region.

In another exemplary aspect, an inductor is provided. The inductor comprises an interconnect structure that comprises an underlying interconnect layer, which comprises an underlying metal coil structure comprising a plurality of underlying metal segment lines coupled to each other in a coil-shaped pattern. The interconnect structure also comprises an overlying interconnect layer disposed adjacent to the underlying interconnect layer in a vertical direction, comprising an overlying metal coil structure comprising a plurality of overlying metal segment lines coupled to each other in a coil-shaped pattern. The overlying metal coil structure intersects the underlying metal coil structure in the vertical direction in a first connection region. The interconnect structure also comprises an insulating layer disposed between the overlying metal coil structure and the underlying metal coil structure in a second connection region. The overlying metal coil structure coupled to the underlying metal coil structure in the first connection region.

In another exemplary aspect, an IC is provided. The IC comprises an underlying interconnect layer that comprises a first underlying metal line extending in a first horizontal direction, and a second underlying metal line extending in a second horizontal direction parallel to the first horizontal direction. The IC also comprises an overlying interconnect layer disposed adjacent to the underlying interconnect layer in a vertical direction, the overlying interconnect layer comprising a first overlying metal line extending in a third horizontal direction orthogonal to the first horizontal direction. The first overlying metal line intersects the first underlying metal line in the vertical direction in a first connection region. The first overlying metal line intersects the second underlying metal line in the vertical direction in a second connection region. The first overlying metal line is coupled to the first underlying metal line in the first connection region. The IC also comprises a first insulating layer disposed between the first overlying metal line and the second underlying metal line in the second connection region.

BRIEF DESCRIPTION OF THE FIGURES

FIG. 4A is a top view of an IC that includes an overlying interconnect layer disposed on an underlying interconnect layer without an intermediate via layer, wherein first and second overlying metal lines in the overlying interconnect layer are coupled to respective first and second underlying metal lines in first and second connection regions in first and second vertical intersections of the metal lines, and further includes insulating layers disposed in recesses in other connection regions to insulate and isolate the first and second overlying metal lines from the respective second and first underlying metal lines;

FIG. 4B is a cross-sectional side view of the IC in FIG. 4A;

FIGS. 7A and 7B-1 is a flowchart illustrating another exemplary process of fabricating an IC that includes adjacent overlying and underlying interconnect layers without an intermediate via layer, wherein an overlying metal line in the overlying interconnect layer is directly coupled to an underlying metal line in a select connection region, and further includes insulating layers disposed in recesses in other connection regions to insulate and isolate the first and second overlying metal lines from the respective second and first underlying metal lines, including but not limited to the ICs in FIGS. 4A-4B;

FIGS. 7A and 7B-2 is a flowchart illustrating another exemplary process of fabricating an IC that includes adjacent overlying and underlying interconnect layers without an intermediate via layer, wherein an overlying metal line in the overlying interconnect layer is directly coupled to an underlying metal line in a select connection region, and further includes insulating layers disposed in recesses outside the first and second connection regions to insulate and isolate the first and second overlying metal lines from the respective second and first underlying metal lines, including but not limited to the ICs in FIGS. 5A-5B;

FIGS. 8A-8E-1 illustrate exemplary fabrication stages in the process in FIGS. 7A and 7B-1;

FIGS. 8A-8E-2 illustrate exemplary fabrication stages in the process in FIGS. 7A and 7B-2;

FIGS. 13A and 13B is a flowchart illustrating another exemplary process of fabricating an IC that includes that includes a FET formed in an active semiconductor layer of a FEOL structure, a BEOL interconnect structure on a front side of the FEOL structure, and an adjacent interconnect layers on a back side of the FEOL structure that include buried metal lines in a semiconductor substrate coupled to metal lines in an adjacent metallization layer without an intermediate via layer, including but not limited to the IC in FIGS. 12A and 12B;

FIGS. 14A-14E illustrate exemplary fabrication stages in the process in FIGS. 13A and 13B;

FIG. 18A is a top view of another exemplary IC that includes a capacitor formed in an interconnect structure that includes an underlying interconnect layer that includes interdigitated first and second underlying metal finger structures and an overlying interconnect layer that includes interdigitated first and second overlying metal finger structures extending in the same direction to the first and second underlying metal fingers, wherein the first overlying metal finger structure is coupled to the first underlying metal finger structure in the first connection region, with the first overlying metal finger structure coupled to the first underlying metal finger structure in a first intersecting connection region, and the second overlying metal finger structure coupled to the second underlying metal finger structure in a second intersecting connection region, without an intermediate via layer;

FIG. 18B is a cross-sectional side view of the IC in FIG. 18A;

FIG. 19A is a top view of another exemplary IC that includes an inductor formed in an interconnect structure that includes an underlying interconnect layer that includes an underlying metal coil structure and an overlying interconnect layer that includes an overlying metal coil structure without an intermediate via layer disposed between the underlying interconnect layer and the overlying underlying interconnect layer, and wherein the overlying metal coil structure coupled to the underlying metal coil structure to form a multiple interconnect layer inductor, FIG. 19B is a cross-sectional side view of the IC in FIG. 19A;

DETAILED DESCRIPTION

Figure 1:
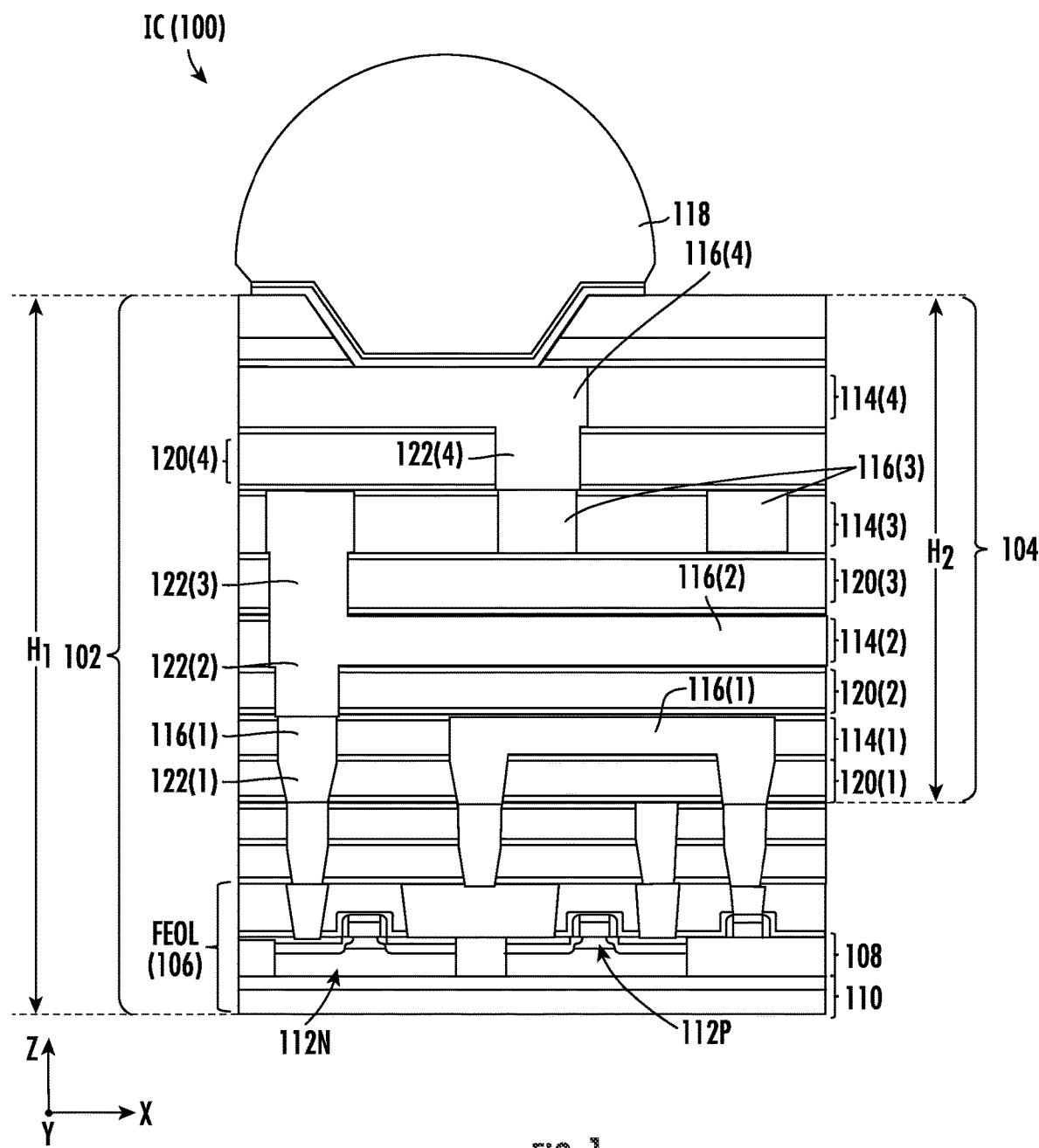
FIG. 1 is a side view of an integrated circuit (IC) that includes a semiconductor die ("die") stack that includes a back-end-of-line (BEOL) interconnect structure comprising metallization layers separated by vertical interconnect access (via) layers containing vias interconnecting adjacent metal lines in adjacent metallization layers.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed in the detailed description include integrated circuits (ICs) employing directly coupled metal lines between vertically-adjacent interconnect layers for reduced coupling resistance. Related fabrication methods are also disclosed. The IC can include capacitors and/or inductors that employ directly-coupled metal lines between vertically-adjacent interconnect layers. By directly coupled, it is meant that there is not an intermediate vertical interconnect access (via) layer with a via(s) interconnecting the metal lines in vertically-adjacent interconnect layers. For example, vertically-adjacent interconnect layers in an IC can be provided as adjacent metallization layers in a back-end-of-line (BEOL) interconnect structure fabricated as part of a back-end-of-line (BEOL) fabrication process. The BEOL interconnect structure is fabricated on a front side of an active semiconductor layer of the IC. For example, it may be desired to provide coupled metal lines (e.g., metal traces) in adjacent metallization layers of the BEOL interconnect structure as part of a power distribution network (PDN) in the IC to reduce contact resistance, and thus reduce current (I)–resistance(R) (IR) drop. As another example, it may be desired to electrically couple metal lines in adjacent metallization layers in a BEOL interconnect structure as part of a capacitor (e.g., a metal-oxide-metal (MoM) capacitor) or coil inductor to reduce resistance and/or area needed in the interconnect structure to provide such devices. In another example, vertically-adjacent interconnect layers of an IC can be provided in an semiconductor substrate with buried metal lines vertically adjacent to a metallization layer formed on a back side of the semiconductor substrate.

Providing coupled metal lines between vertically-adjacent interconnect layers in the IC can avoid the need to fabricate a separate via layer between the adjacent interconnect layers having respective adjacent metal lines to be electrically coupled to each other to form an interconnect between the adjacent metal lines for the desired application. Thus, a separate via layer mask may not be required to form vias in a separate via layer between the adjacent interconnect layers that are designed to have metal lines directly coupled with each other. Providing directly coupled metal lines between adjacent interconnect layers in an IC can also reduce the overall height of the semiconductor die ("die") stack in the IC. This reduction in height can be realized or consumed by additional metallization layers to support a higher density of devices and interconnections in the die.

Figure 2A:
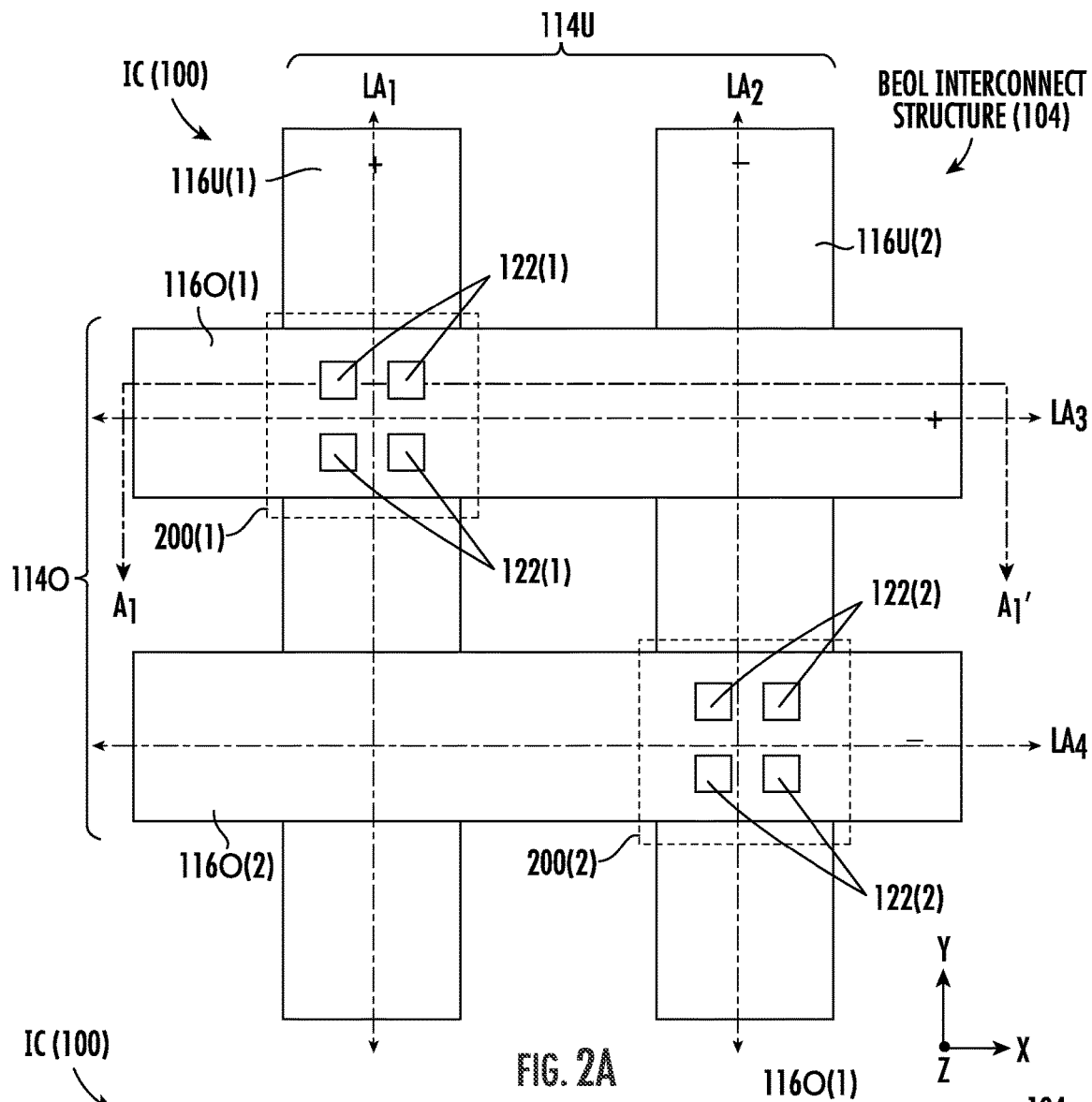
FIG. 2A is a top view of an exemplary IC that includes an overlying interconnect layer disposed on an underlying interconnect layer, wherein first and second overlying metal lines in the overlying interconnect layer are coupled through vias in a via layer to respective first and second underlying metal lines in the underlying interconnect layer.
Figure 2B:
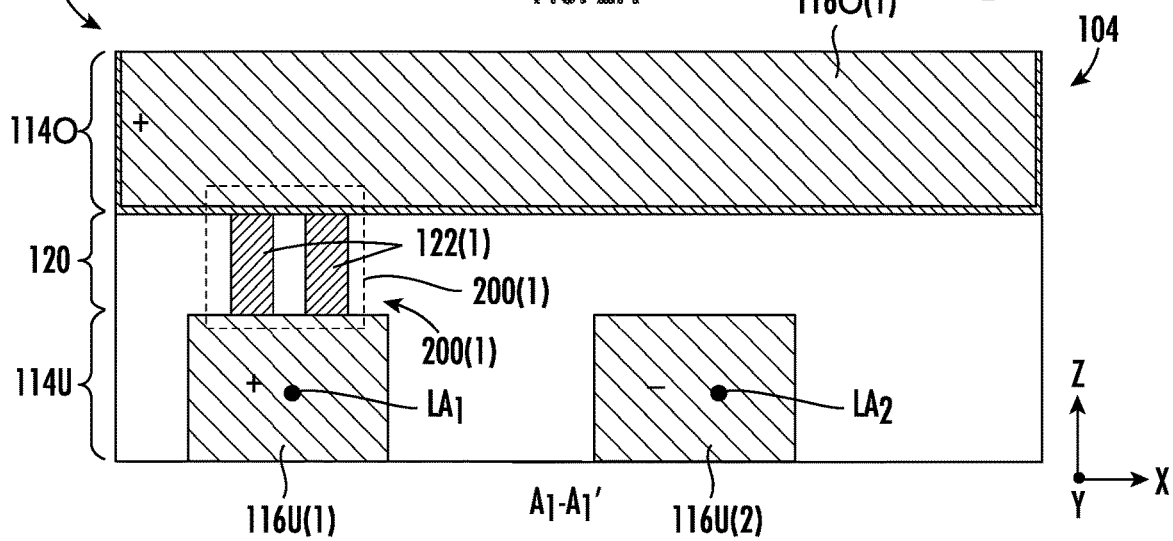
FIG. 2B is a cross-sectional side view of the IC in FIG. 2A.
Figure 3:
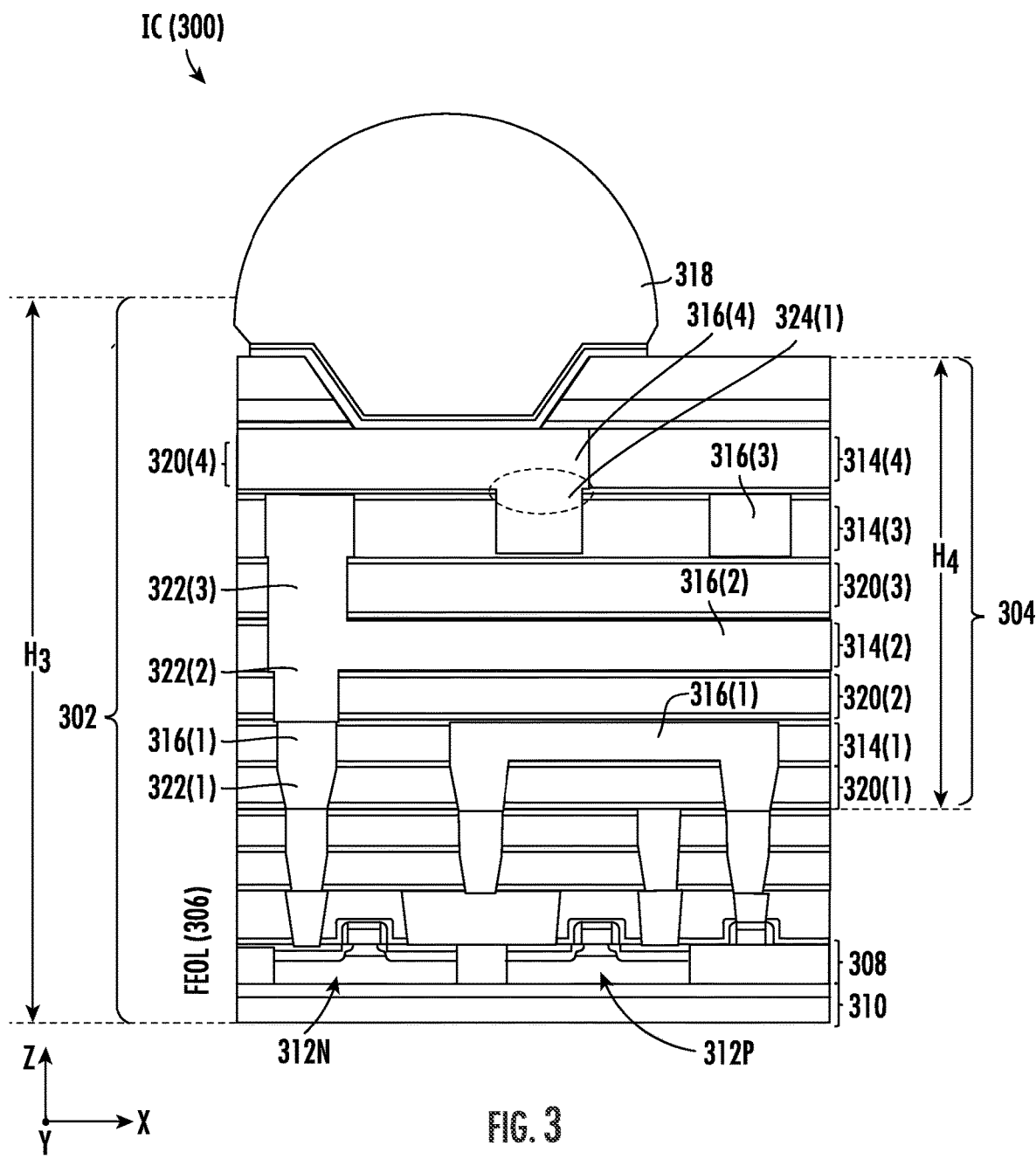
FIG. 3 is a side view of an exemplary IC that includes a die stack that includes a BEOL interconnect structure that includes adjacent overlying and underlying interconnect layers as metallization layers without an intermediate via layer, wherein an overlying metal line in the overlying interconnect layer is directly coupled to an underlying metal line in a select connection region.

Before discussing examples of an IC that includes an adjacent overlying and underlying interconnect layers without an intermediate via layer, including capacitors and inductors, wherein an overlying metal line in the overlying interconnect layer is directly coupled to an underlying metal line in a select connection region starting at FIG. 3, an IC that includes overlying and underlying interconnect layers with respective overlying and metal lines therein coupled together through an intermediate via layer with vias is first described below with regard to FIGS. 1-2B.

In this regard, FIG. 1 is a side view of an integrated circuit (IC) 100 that includes a semiconductor die ("die") stack 102 that includes a back-end-of-line (BEOL) interconnect structure 104 disposed on a front-end-of-line (FEOL) structure 106. The FEOL structure 106 includes an active semiconductor layer 108 that is formed on a substrate 110. P-type field-effect transistors (FETs)(PFETs) and N-type (FETs) (NFETs) 112P, 112N are formed in the active semiconductor layer 108. The BEOL interconnect structure 104 includes a plurality of interconnect layers 114(1)-114(4) that each include one or more metal lines 116(1)-116(4) that can provide direct or indirect interconnections between the FETs 112P, 112N and external interconnects 118 (e.g., a solder bump) adjacent to an upper interconnect layer 114(4) of the BEOL interconnect structure 104. The interconnect layers 114(1)-114(4) in the BEOL interconnect structure 104 of the IC 100 are also known in this example as "metallization layers." The metal lines 116(1)-116(4) extend longitudinally in either the horizontal X- or Y-axis directions in FIG. 1. The BEOL interconnect structure 104 also includes a plurality of vertical interconnect access (via) layers 120(1)-120(4) that are disposed adjacent to respective interconnect layers 114 (1)-114(4). Vias 122(1)-122(4) (e.g., metal pillars) are formed in via layers 120(1)-120(4) to provide interconnects between metal lines 116(1)-116(4) in adjacent interconnect layers 114(1)-114(4). Thus, the overall height $H_1$ of the IC 100 in FIG. 1 is a function of the height of the FEOL structure 106 and the BEOL interconnect structure 104. The height $H_2$ of the BEOL interconnect structure 104 is a function of the number and height of the individual interconnect layers 114(1)-114(4) and via layers 120(1)-120(4).

FIGS. 2A and 2B are top and cross-sectional side views, respectively, an overlying interconnect layer 114O in the BEOL interconnect structure 104 in the IC 100 in FIG. 1 adjacent to an underlying interconnect layer 114U. FIG. 2B is a cross-sectional side view across the $A_1$-$A_1'$ cross-section line in FIG. 2A. As shown in FIG. 2B, the overlying interconnect layer 114O and underlying interconnect layer 114U are adjacent interconnect layers among the interconnect layers 114(1)-114(4) in the BEOL interconnect structure 104. For example, the underlying interconnect layer 114U could be interconnect layer 114(2) in FIG. 1, and the overlying interconnect layer 114O could be interconnect layer 114(3) in FIG. 1. By "overlying" and "underlying" in this example, it is meant that the overlying interconnect layer 114O is disposed above the underlying interconnect layer 114U in the vertical direction (Z-axis direction) in FIGS. 2A and 2B. As shown in FIG. 2A, a first underlying metal line 116U(1) and second underlying metal line 116U (2) are disposed in the underlying interconnect layer 114U with each extending along respective longitudinal axes $LA_1$, $LA_2$ in the horizontal direction (Y-axis direction) parallel to each other. As also shown in FIG. 2A, a first overlying metal line 116O(1) and second overlying metal line 116O(2) are disposed in the overlying interconnect layer 114O with each extending along respective longitudinal axes $LA_3$, $LA_4$ in the horizontal direction (X-axis direction) parallel to each other and orthogonal to the longitudinal axes $LA_1$, $LA_2$ in which the first underlying metal line 116U(1) and second underlying metal line 116U(2) extend.

As shown in FIG. 2B, to interconnect the first underlying metal line 116U(1) to the first overlying metal line 116O(1), the via layer 120 is provided in the BEOL interconnect structure 104 between the underlying interconnect layer 114U and overlying interconnect layers 114O. One or more vias 122(1) are disposed in the via layer 120 in a a first connection region 200(1) where the first underlying metal line 116U(1) and the first overlying metal line 116O(1) intersect in the horizontal X- and Y-axis directions. The vias 122(1) are in contact with the first underlying metal line 116U(1) and the first overlying metal line 116O(1) in the first connection region 200(1) to electrically couple the first underlying metal line 116U(1) and the first overlying metal line 116O(1) together. For example, the first underlying metal line 116U(1) and the first overlying metal line 116O(1) may be electrically coupled together as part of positive supply rails in a power distribution network (PDN) in the IC 100 in FIG. 1 for routing a supply voltage. Similarly, as shown in FIG. 2A, one or more vias 122(2) are also disposed in the via layer 120 in a second connection region 200(2), wherein the second underlying metal line 116U(2) and the second overlying metal line 116O(2) intersect in the horizontal X- and Y-axis directions. The vias 122(2) are in contact with the second underlying metal line 116U(2) and the second overlying metal line 116O(2) in the second connection region 200(2) to electrically couple the second underlying metal line 116U(2) and the second overlying metal line 116O(2) together. For example, the second underlying metal line 116U(2) and the second overlying metal line 116O(2) may be electrically coupled together as part of ground or negative supply rails in a PDN in the IC 100 in FIG. 1.

Using the example of the IC 100 in FIGS. 1 and 2A-2B, as the package size of the IC 100 decreases, the pitch and width over the underlying metal lines 116U(1), 116U(2) and overlying metal lines 116O(1), 116O(2) may also need to decrease. This can result in an increase in contact resistance, because the first and second connection regions 200(1), 200(2) will also decrease in size. Thus, the number and size of the vias 122(1), 122(2) that can be formed in the first and second connection regions 200(1), 200(2) may decrease, thus increasing contact resistance. For example, if the underlying metal lines 116U(1), 116U(2) and overlying metal lines 116O(1), 116O(2) are part of a PDN in the IC 100, an increase in contact resistance will result in an increase in current-resistance (IR) drop in an undesired manner. The presence of the via layer 120 in the BEOL interconnect structure 104 in the IC 100 as shown in FIG. 2A also contributes to the overall height of the BEOL interconnect structure 104, as discussed above with regard to FIG. 1. As the package size of the IC 100 decreases, the height budget for the IC 100 may also decrease.

Thus, to mitigate or decrease contact resistance between metal lines in a BEOL interconnect structure of an IC, the IC 300 in FIG. 3 is provided. Similar to the IC 100 in FIG. 1, the IC 300 in FIG. 3 includes a die stack 302 that includes a BEOL interconnect structure 304 disposed on a FEOL structure 306. The FEOL structure 306 includes an active semiconductor layer 308 that is formed on a substrate 310. P-type field-effect transistors (FETs) (PFETs) and N-type (FETs) (NFETs) 312P, 312N are formed in the active semiconductor layer 308. The BEOL interconnect structure 304 includes a plurality of interconnect layers 314(1)-314(4) that each include one or more metal lines 316(1)-316(4) providing interconnects between the FETs 312P, 312N and external interconnects 318 (e.g., a solder bump) formed on adjacent to an upper interconnect layer 314(4) of the BEOL interconnect structure 304. The metal lines 316(1)-316(4) are made from a metal material, such as copper for example. The interconnect layers 314(1)-314(4) in the BEOL interconnect structure 304 of the IC 300 are also known in this example as "metallization layers." The metal lines 316(1)-316(4) extend longitudinally in either the horizontal X- or Y-axis directions in FIG. 3. The BEOL interconnect structure 304 also includes a via layers 320(1)-320(3) that are disposed adjacent to respective interconnect layers 314(1)-314(3). Vias 322(1)-322(3) (e.g., metal pillars) are formed in the via layers 320(1)-320(3) to provide interconnects between metal lines 316(1)-316(3) in adjacent interconnect layers 314(1)-314(3).

However, unlike the BEOL interconnect structure 104 in FIG. 1, the BEOL interconnect structure 304 in FIG. 3 does not include a via layer between the interconnect layers 314(3) and 314(4) in this example. Instead, the interconnect layer 314(4) is disposed direction adjacent to the interconnect layer 314(3) in the vertical direction (Z-axis direction) without an intervening via layer. As will be discussed in more detail below, the overlying metal line 316(4) in interconnect layer 314(4) is directly coupled to the underlying metal line 316(3) in interconnect layer 314(3) in a connection region 324(1) where the overlying metal line 316(4) and the underlying metal line 316(3) intersect in the X- and Y-axes. In this manner, vias are not employed to connect the overlying metal line 316(4) to the underlying metal line 316(3). The overlying metal line 316(4) is directly coupled to the underlying metal line 316(3) in the connection region 324(1). As a result, a greater surface area of the overlying metal line 316(4) and the underlying metal line 316(3) may be coupled together to decrease contact resistance. Further, the overall height $H_3$ of the IC 300 in FIG. 3 is reduced as compared to the height $H_1$ of the IC 100 in FIG. 1, because the elimination of the via layer between the interconnect layers 314(3), 314(4) reduces the height $H_4$ of the BEOL interconnect structure 304 as compared to the height $H_2$ of BEOL interconnect structure 104 in FIG. 1.

To further illustrate the direct coupling of the underlying and overlying metal lines 316U, 316O in the IC 300 in FIG. 3, FIGS. 4A and 4B are provided. FIGS. 4A and 4B are top and cross-sectional side views, respectively, of the overlying interconnect layer 314O in the BEOL interconnect structure 304 in the IC 300 in FIG. 3 adjacent to an underlying interconnect layer 314U. FIG. 4B is a cross-sectional side view across the $A_2$-$A_2'$ cross-section line in FIG. 4A. As shown in FIG. 4B, the overlying interconnect layer 314O and underlying interconnect layer 314U can be the adjacent interconnect layers 314(3), 314(4) in the BEOL interconnect structure 304 in FIG. 3. By "overlying" and "underlying" in this example, it is meant that the overlying interconnect layer 314O is disposed above the underlying interconnect layer 314U in the Z-axis direction in FIGS. 4A and 4B. As shown in FIG. 4A, a first underlying metal line 316U(1) and second underlying metal line 316U(2) are disposed in the underlying interconnect layer 314U with each extending along respective longitudinal axes $LA_5$, $LA_6$ in the Y-axis horizontal direction parallel to each other. As also shown in FIG. 4A, a first overlying metal line 316O(1) and a second overlying metal line 316U(2) are disposed in the overlying interconnect layer 314O with each extending along respective longitudinal axes $LA_7$, $LA_8$ in the X-axis horizontal direction parallel to each other and orthogonal to the longitudinal axes $LA_5$, $LA_6$ in which the first underlying metal line 316U(1) and second underlying metal line 316U(2) extend.

As shown in FIG. 4B, in this example, to interconnect the first underlying metal line 316U(1) to the first overlying metal line 316O(1), the first overlying metal line 316O(1) is disposed directly in contact with the first underlying metal line 316U(1). This is a result of the overlying interconnect layer 314O being disposed on the underlying interconnect layer 314U in the BEOL interconnect structure 304 without employing an intermediate via layer. The first overlying metal line 316O(1) is directly coupled to the first underlying metal line 316U(I) in a first connection region 400(1) where the first overlying metal line 316O(1) and the first underlying metal line 316U(1) intersect in the horizontal X- and Y-axis directions. For example, the first underlying metal line 316U(1) and the first overlying metal line 316O(1) may be electrically coupled together as part of a positive supply rails in a PDN in the IC 300 in FIG. 3 for routing a supply voltage. Similarly, as shown in FIG. 4A, the second overlying metal line 316O(2) is directly coupled to the second underlying metal line 316U(2) in a second connection region 400(2) where the second overlying metal line 316O(2) and the second underlying metal line 316U(2) intersect in the horizontal X- and Y-axis directions. For example, the second underlying metal line 316U(2) and the second overlying metal line 316O(2) may be electrically coupled together as part of ground or negative supply rails in a PDN in the IC 300 in FIG. 3.

As shown in FIG. 4A, the first overlying metal line 316O(1) also intersects the second underlying metal line 316U(2) in a third connection region 400(3). However, it may not be desired to electrically couple (i.e., short) the first overlying metal line 316O(1) to the second underlying metal line 316U(2). For example, the first overlying metal line 316O(1) may be a positive power rail and the second underlying metal line 316U(2) may be a ground or negative power rail that cannot be shorted. Similarly, as shown in FIG. 4A, the second overlying metal line 316O(2) also intersects the first underlying metal line 316U(1) in a fourth connection region 400(4). It may also not be desired to electrically couple (i.e., short) the second overlying metal line 316O(2) to the first underlying metal line 316U(1). For example, the second overlying metal line 316O(2) may be ground or negative power rail and the first underlying metal line 316U(1) may be a positive power rail that cannot be shorted. Because the intermediate via layer is eliminated between the overlying and underlying interconnect layers 3140, 314U, the first overlying metal line 316O(1) and the second underlying metal line 316U(2), and the second overlying metal line 316O(2) and the first underlying metal line 316U(1), will be disposed directly in contact with each other causing a short if isolation is not provided.

In this regard, as shown in FIGS. 4A and 4B, the BEOL interconnect structure 304 includes a first insulating layer 402(1) that is disposed between first overlying metal line 316O(1) and the second underlying metal line 316U(2) in the third connection region 400(3). The first insulating layer 402(1) is formed from a dielectric material. As shown in FIG. 4A, the BEOL interconnect structure 304 also includes a second insulating layer 402(2) that is disposed between second overlying metal line 316O(2) and the first underlying metal line 316U(1) in the fourth connection region 400(4). In this example, as shown in FIG. 4B, the first insulating layer 402(1) is disposed in a first recess 404(1) in the first overlying metal line 316O(1) in the third connection region 400?(3) that is adjacent to the third connection region 400(3). The first insulating layer 402(1) is a dielectric material. The first insulating layer 402(1) isolates and insulates the second underlying metal line 316U(2) from the first overlying metal line 316O(1) to avoid an electrical connection between the second underlying metal line 316U(2) and the first overlying metal line 316O(1). By providing the first recess 404(1) in the first overlying metal line 316O(1) in the third connection region 400(3), an extra layer of insulating material is not required to be disposed between the entire interface between the overlying and underlying interconnect layers 3140, 314U that would contribute to additional height $H_4$ in the BEOL interconnect structure 304 in FIG. 3.

As also shown in FIG. 4B, in this example, the first overlying metal line 316O(1) is disposed on a thin first metal barrier layer 406(1) that is disposed on the underlying interconnect layer 314U. For example, the first metal barrier layer 406(1) may be Tantalum Nitride for example. The first metal barrier layer 406(1) provides a direct electrical connection between the first overlying metal line 316O(1) and the first underlying metal line 316U(1) while also providing a barrier layer that can reduce or prevent diffusion of the metal material 408 of the first overlying metal line 316O(1) into the underlying interconnect layer 314U during fabrication processes where temperatures sufficient to cause metal diffusion can occur. For example, the underlying interconnect layer 314U in this example includes a dielectric material 410 that the underlying metal lines 316U(1), 316U(2) are formed in to insulate and isolate the underlying metal lines 316U(1), 316U(2). If metal material 408 from the first overlying metal line 316O(1) diffuses into the dielectric material 410 of the underlying interconnect layer 314U, the diffused metal may cause an untended short with underlying metal lines 316U that are not intended, such as between the first overlying metal line 316O(1) and the second underlying metal line 316U(1) in this example.

Also, though not directly shown in FIG. 4B, but shown in the top view of FIG. 4A, the second insulating layer 402(2) is also disposed in a second recess 404(2) in the second overlying metal line 316O(2) that is adjacent to the fourth connection region 400(4). The second insulating layer 402(2) is formed from a dielectric material. The second insulating layer 402(2) isolates and insulates the first underlying metal line 316U(1) from the second overlying metal line 316O(2) to avoid an electrical connection between the first underlying metal line 316U(1) and the second overlying metal line 316O(2). The details regarding the first recess 404(1) in the first overlying metal line 316O(1) discussed above with regard to FIG. 4B are also applicable to the second recess 404(2) disposed in the second overlying metal line 316O(2). Also, though not directly shown in FIGS. 4A and 4B, in this example, the second overlying metal line 316O(2) is disposed on a thin metal barrier layer like the first metal barrier layer 406(1) that is disposed on the underlying interconnect layer 314U. The thin metal barrier layer provides a direct electrical connection between the second overlying metal line 316O(2) and the second underlying metal line 316U(2) while also providing a barrier layer that can reduce or prevent diffusion of a metal material of the second overlying metal line 316O(2) into the underlying interconnect layer 314U during fabrication processes where temperatures sufficient to cause metal diffusion can occur. As discussed above, the underlying interconnect layer 314U in this example includes a dielectric material 408 that the underlying metal lines 316U(1), 316U(2) are formed to insulate and isolate the underlying metal lines 316U(1), 316U(2). If metal material from the second overlying metal line 316O(2) diffuses into the dielectric material 410 of the underlying interconnect layer 314U, the diffused metal may cause an untended short with underlying metal lines 316U that are not intended, such as between the second overlying metal line 316O(2) and the first underlying metal line 316U(1) in this example.

Figure 5A:
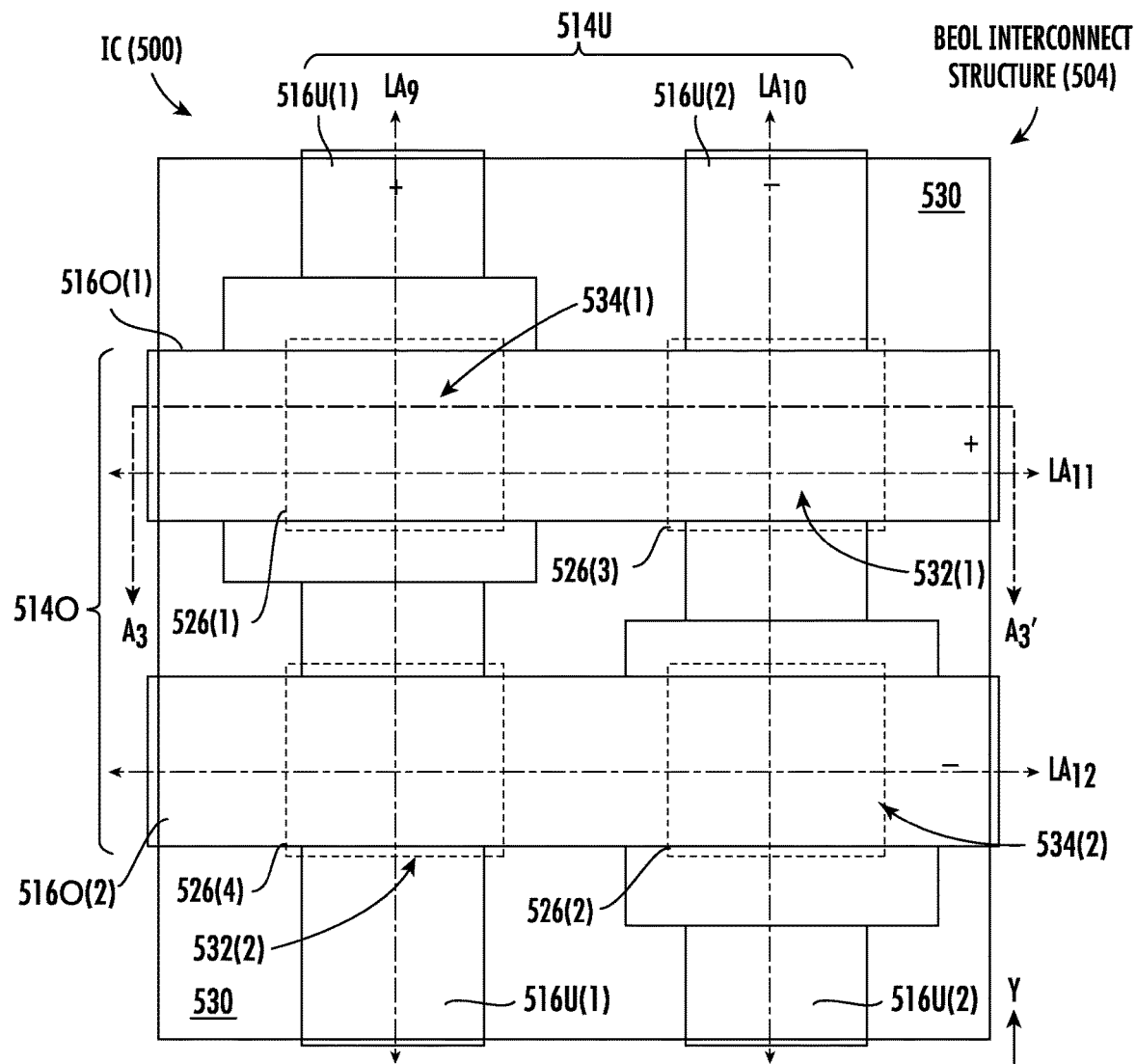
FIG. 5A is a top view of another IC that includes an overlying interconnect layer disposed on an underlying interconnect layer without an intermediate via layer, wherein first and second overlying metal lines in the overlying interconnect layer are coupled to respective first and second underlying metal lines in first and second connection regions in first vertical intersections of the metal lines, and further includes insulating layers disposed in recesses outside the first and second connection regions to insulate and isolate the first and second overlying metal lines from the respective second and first underlying metal lines.
Figure 5B:
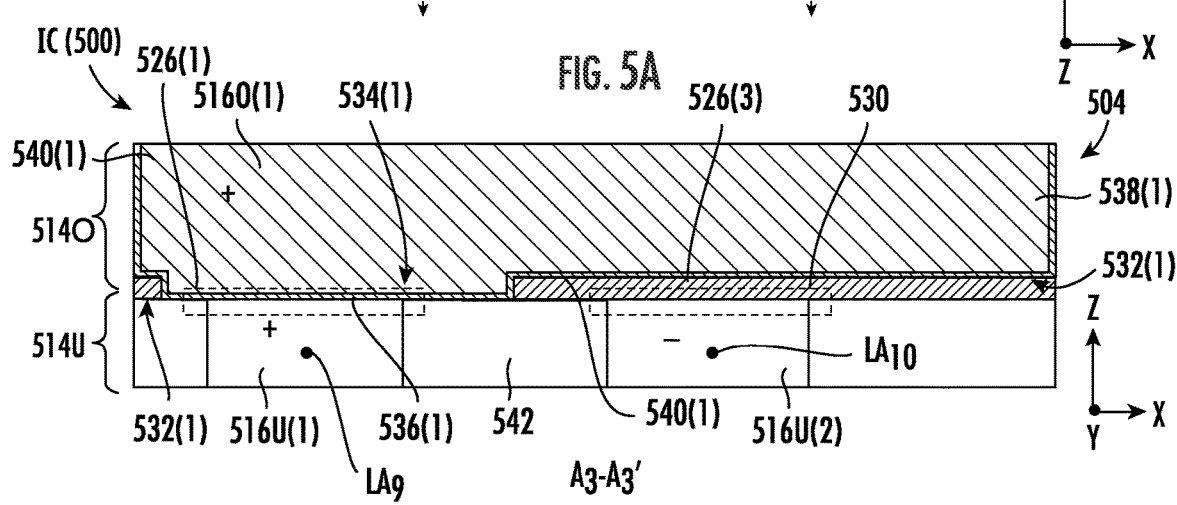
FIG. 5B is a cross-sectional side view of the IC in FIG. 5A.

As discussed above with regard to the BEOL interconnect structure 304 in FIGS. 4A and 4B, the first and second insulating layers 404(1), 404(2) are disposed in the first and second recesses 404(1), 404(2) in the respective first and second overlying metal lines 316O(1), 316O(2). However, there are alternative ways to provide for insulating of the first and second overlying metal lines 316O(1), 316O(2) to the respective second and first underlying metal lines 316U (2), 316U(1). In this regard, FIGS. 5A and 5B illustrate top and cross-sectional side views, respectively, a BEOL interconnect structure 504 that can be provided as the BEOL interconnect structure 304 in the IC 300 in FIG. 3. FIG. 5B is a cross-sectional side view across the $A_3$-$A_3$' cross-section line in FIG. 5A. As shown in FIGS. 5A and 5B as discussed below, the insulation between select underlying and overlying metal lines is provided by providing an expanded recess in an overlying metal line that extends outside the connection region where a connection is made between and overlying and underlying metal line.

In this regard, FIGS. 5A and 5B are top and cross-sectional side views, respectively, of an overlying interconnect layer 514O adjacent to an underlying interconnect layer 514U in the Z-axis direction in a BEOL interconnect structure 504 in an IC 500. The IC 500 can be similar to the IC 300 in FIG. 3. FIG. 5B is a cross-sectional side view across the $A_3$-$A_3'$ cross-section line in FIG. 5A. For example, the overlying interconnect layer 514O and underlying interconnect layer 514U could be the adjacent interconnect layers 314(3), 314(4) in the BEOL interconnect structure 304 in the IC 300 in FIG. 3. By "overlying" and "underlying" in this example, it is meant that the overlying interconnect layer 514O is disposed above the underlying interconnect layer 514U in the Z-axis direction in FIGS. 5A and 5B. As shown in FIG. 5A, a first underlying metal line 516U(1) and second underlying metal line 516U(2) are disposed in the underlying interconnect layer 514U with each extending along respective longitudinal axes $LA_9$, $LA_{10}$ in the Y-axis horizontal direction parallel to each other. As also shown in FIG. 5A, a first overlying metal line 516O(1) and a second overlying metal line 516O(2) are disposed in the overlying interconnect layer 514O with each extending along respective longitudinal axes $LA_{11}$, $LA_{12}$ in the X-axis horizontal direction parallel to each other and orthogonal to the longitudinal axes $LA_9$, $LA_{10}$ in which the first underlying metal line 516U(1) and second underlying metal line 516U(2) extend.

As shown in FIG. 5B, in this example, to interconnect the first underlying metal line 516U(1) to the first overlying metal line 516O(1), the first overlying metal line 516O(1) is disposed directly in contact with the first underlying metal line 516U(1). This is a result of the overlying interconnect layer 514O being disposed on the underlying interconnect layer 514U in the BEOL interconnect structure 504 without employing an intermediate via layer. The first overlying metal line 516O(1) is directly coupled to the first underlying metal line 516U(1) in a first connection region 526(1) where the first overlying metal line 516O(1) and the first underlying metal line 516U(1) intersect in the horizontal X- and Y-axis directions. For example, the first underlying metal line 516U(1) and the first overlying metal line 516O(1) may be electrically coupled together as part of a positive supply rails in a PDN in the IC 500 for routing a supply voltage. Similarly, as shown in FIG. 5A, the second overlying metal line 516O(2) is directly coupled to the second underlying metal line 516U(2) in a second connection region 526(2) where the second overlying metal line 516O(2) and the second underlying metal line 516U(2) intersect in the horizontal X- and Y-axis directions. For example, the second underlying metal line 516U(2) and the second overlying metal line 516O(2) may be electrically coupled together as part of ground or negative supply rails in a PDN in the IC 500.

As shown in FIG. 5A, the first overlying metal line 516O(1) also intersects the second underlying metal line 516U(2) in a third connection region 526(3). However, it may not desired to electrically couple (i.e., short) the first overlying metal line 516O(1) to the second underlying metal line 516U(2). For example, the first overlying metal line 516O(1) may be positive power rail and the second underlying metal line 516U(2) may be a ground or negative power rail that cannot be shorted. Similarly, as shown in FIG. 5A, the second overlying metal line 516O(2) also intersects the first underlying metal line 516U(1) in a fourth connection region 526(4). It may also not be desired to electrically coupled (i.e., short) the second overlying metal line 516O(2) to the first underlying metal line 516U(1). For example, the second overlying metal line 516O(1) may be ground or negative power rail and the first underlying metal line 516U(1) may be a positive power rail that cannot be shorted. Because the intermediate via layer is eliminated between the overlying and underlying interconnect layers 514O, 514U, the first overlying metal line 516O(1) and the second underlying metal line 516U(2), and the second overlying metal line 516O(2) and the first underlying metal line 516U(1), will be disposed directly in contact with each other causing a short if isolation is not provided.

In this regard, as shown in FIG. 5A, the BEOL interconnect structure 504 includes an insulating layer 530 that is disposed between and over the entire overlying interconnect layer 514O and the underlying interconnect layer 514U. The insulating layer 530 is formed from a dielectric material. However, unlike the BEOL interconnect structure 304 in FIGS. 4A and 4B, in the example BEOL interconnect structure 504 in FIGS. 5A and 5B, the insulating layer 530 is patterned and removed (e.g., etched away) in the first and second connection regions 526(1), 526(2) between the intersections of the first overlying metal line 516O(1) and the first underlying metal line 516U(1), and the intersection of the second overlying metal line 516O(2) and the second underlying metal line 516U(2). This in effect creates a first recess 532(1) in the first overlying metal line 516O(1) and the second overlying metal line 516O(2) outside of the respective first and second connection regions 526(1), 526(2). As shown in FIG. 5B for the first overlying metal line 516O(1), a first opening 534(1)(could also be referred to as a "trench") created in the insulating layer 530 that extends to a first surface 536(1) of the first underlying metal line 516U(1) as a result of patterning and removing the portion of the insulating layer 530 in the first connection region 526(1). The first opening 534(1) is filled with metal material 538(1) that forms the first overlying metal line 516O(1) in the overlying interconnect layer 514O. In this manner, the metal material 538(1) of the first overlying metal line 516O(1) is disposed in contact with the first underlying metal line 516U(1), while the remaining portions of the insulating layer 530 are left in the third connection region 526(3) to insulate and isolate the first overlying metal line 516O(1) from the second underlying metal line 516U(2). By providing the first recess 532(1) in the first overlying metal line 516O(1) in the first connection region 526(1), an extra layer of insulating material is not required to be between the entire interface between the overlying and underlying interconnect layers 514O, 514U that would contribute to additional height in the BEOL interconnect structure 504 in FIGS. 5A and 5B.

As also shown in FIG. 5B, in this example, the first overlying metal line 516O(1) is disposed on a first thin metal barrier layer 540(1) that is disposed on the underlying interconnect layer 514U. For example, the first metal barrier layer 540(1) may be Tantalum Nitride for example. The first metal barrier layer 540(1) provides a direct electrical connection between the first overlying metal line 516O(1) and the first underlying metal line 516U(1) while also providing a barrier layer that can reduce or prevent diffusion of the metal material 538(1) of the first overlying metal line 516O(1) into the underlying interconnect layer 514U during fabrication processes where temperatures sufficient to cause metal diffusion can occur. For example, the underlying interconnect layer 514U in this example includes a dielectric material 542 that the underlying metal lines 516U(1), 516U (2) are formed in to insulate and isolate the underlying metal lines 516U(1), 516U(2). If metal material from the first overlying metal line 516O(1) diffuses into the dielectric material 542 of the underlying interconnect layer 514U, the diffused metal may cause an untended short with underlying metal lines 516U that are not intended, such as between the first overlying metal line 516O(1) and the second underlying metal line 516U(1) in this example.

Also, though not directly shown in FIG. 5B, but shown in the top view of FIG. 5A, the insulating layer 530 is also patterned and removed (e.g., etched away) in the second connection region 526(2) between the second overlying metal line 516O(2) and the second underlying metal line 516U(2). This in effect creates a second recess 532(2) in the first overlying metal line 516O(1) and the second overlying metal line 516O(2) outside of the second connection region 526(2). Although not shown in FIG. 5B, a second opening 534(2) created in the insulating layer 530 that extends to a first surface of the second underlying metal line 516U(2) as a result of patterning and removing the portion of the insulating layer 530 in the second connection region 526(2) that is filled with a metal material. The metal material forms the second overlying metal line 516O(2) in the overlying interconnect layer 514O. In this manner, the metal material of the second overlying metal line 516O(2) is disposed in contact with the second underlying metal line 516U(2), while the remaining portions of the insulating layer 530 are left in the fourth connection region 526(4) to insulate and isolate the second overlying metal line 516O(2) from the first underlying metal line 516U(1). By providing the second recess 532(2) in the second overlying metal line 516O(2) in the second connection region 526(2), an extra layer of insulating material is not required to be between the entire interface between the overlying and underlying interconnect layers 514O, 514U that would contribute to additional height in the BEOL interconnect structure 504 in FIGS. 5A and 5B.

Also, although not shown in FIG. 5B, in this example, the second overlying metal line 516O(2) is disposed on a second thin metal barrier layer, like the first metal barrier layer 540(1), that is disposed on the underlying interconnect layer 514U. For example, the second metal barrier layer may be Tantalum Nitride for example. The second thin metal barrier layer provides a direct electrical connection between the second overlying metal line 516O(2) and the second underlying metal line 516U(2) while also providing a barrier layer that can reduce or prevent diffusion of the metal material of the second overlying metal line 516O(2) into the underlying interconnect layer 514U during fabrication processes where temperatures sufficient to cause metal diffusion can occur. For example, the underlying interconnect layer 514U in this example includes the dielectric material 542 that the underlying metal lines 516U(1), 516U(2) are formed in to insulate and isolate the underlying metal lines 516U(1), 516U(2). If metal material from the second overlying metal line 516O(2) diffuses into the dielectric material 542 of the underlying interconnect layer 514U, the diffused metal may cause an untended short with underlying metal lines 516U that are not intended, such as between the second overlying metal line 516O(2) and the first underlying metal line 516U(2) in this example.

Figure 6:
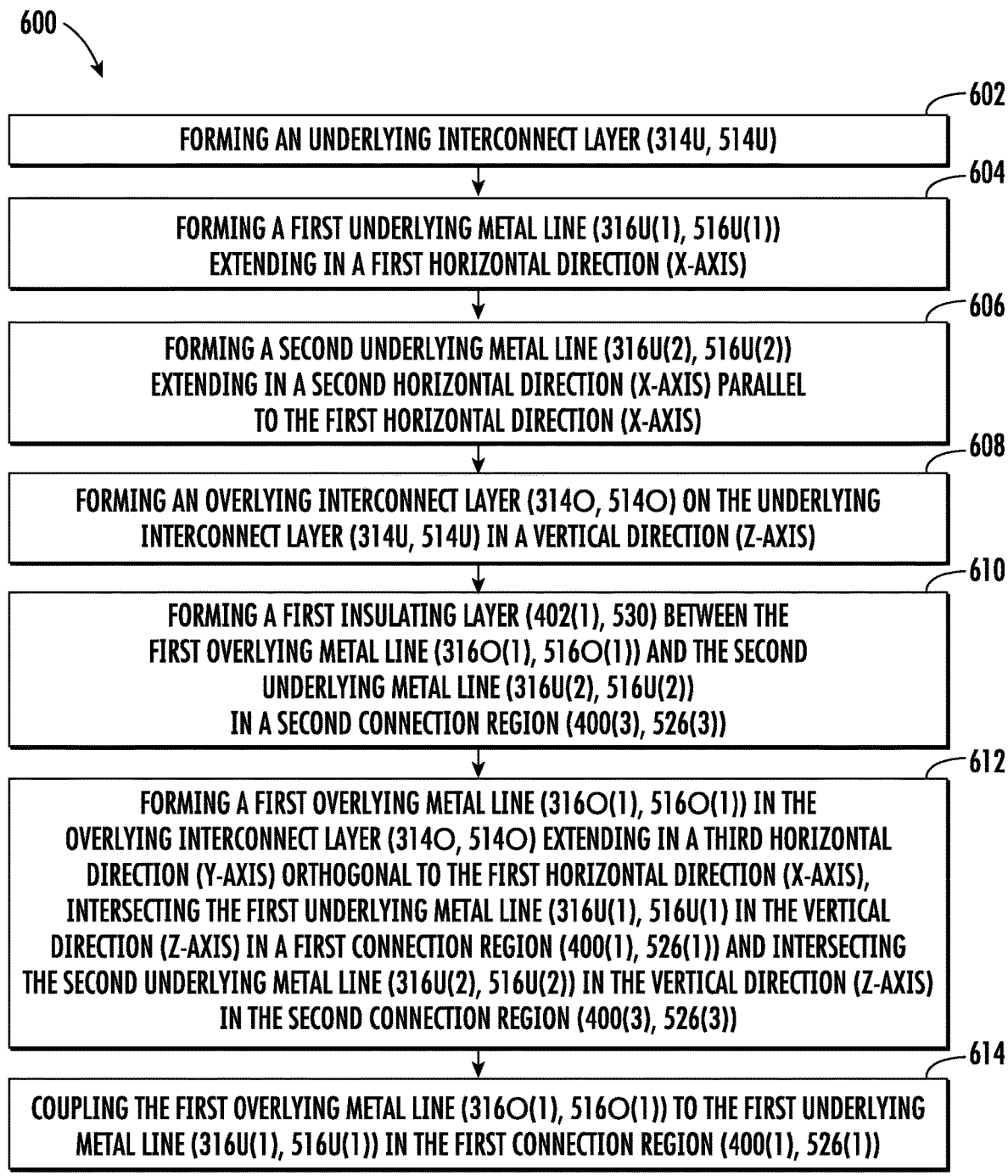
FIG. 6 is a flowchart illustrating an exemplary process of fabricating an IC that includes adjacent overlying and underlying interconnect layers without an intermediate via layer, wherein an overlying metal line in the overlying interconnect layer is directly coupled to an underlying metal line in a select connection region, including but not limited to the ICs in FIGS. 4A-4B and 5A-5B.

FIG. 6 is a flowchart illustrating an exemplary fabrication process 600 of fabricating an IC that includes adjacent overlying and underlying interconnect layers without an intermediate via layer, wherein an overlying metal line in the overlying interconnect layer is directly coupled to an underlying metal line in a select connection region, including but not limited to the ICs 300, 500 in FIGS. 4A-5B. The exemplary fabrication process steps 600 in FIG. 6 will be described with regard to the exemplary ICs 300, 500 in FIGS. 4A-5B.

In this regard, a first step in the fabrication process 600 can be forming an underlying interconnect layer 314U, 514U (block 602 in FIG. 6). This process forming an underlying interconnect layer 314U, 514U (block 602 in FIG. 6) can involve forming a first underlying metal line 316U(1), 516U(1) extending in a first horizontal direction (X-axis direction) (block 604 in FIG. 6), and forming a second underlying metal line 316U(2), 516U(2) extending in a second horizontal direction (X-axis direction) parallel to the first horizontal direction (X-axis direction) (block 606 in FIG. 6). A next step in the fabrication process 600 can include forming an overlying interconnect layer 314O, 514O on the underlying interconnect layer 314U, 514U in a vertical direction (Z-axis direction) (block 608 in FIG. 6). This process of forming an overlying interconnect layer 314O, 514O on the underlying interconnect layer 314U, 514U (block 608 in FIG. 6) can involve forming a first insulating layer 402(1), 530 between the first overlying metal line 316O(1), 516O(1) and the second underlying metal line 316U(2), 516U(2) in a second connection region 400(3), 526(3) (block 610 in FIG. 6). The process of forming an overlying interconnect layer 314O, 514O on the underlying interconnect layer 314U, 514U (block 608 in FIG. 6) can also involve forming a first overlying metal line 316O(1), 516O(1) in the overlying interconnect layer 314O, 514O extending in a third horizontal direction (Y-axis direction) orthogonal to the first horizontal direction (X-axis direction), intersecting the first underlying metal line 316U(1), 516U(1) in the vertical direction (Z-axis direction) in a first connection region 400(1), 526(1) and intersecting the second underlying metal line 316U(2), 516U(2) in the vertical direction (Z-axis direction) in the second connection region 400(3), 526(3) (block 612 in FIG. 6). The process of forming an overlying interconnect layer 314O, 514O on the underlying interconnect layer 314U, 514U (block 608 in FIG. 6) can also involve coupling the first overlying metal line 316O(1), 516O(1) to the first underlying metal line 316U(1), 516U(1)) in the first connection region 400(1), 526(1) (block 614 in FIG. 6).

Other fabrication processes can also be employed to fabricate an IC that includes adjacent overlying and underlying interconnect layers without an intermediate via layer, wherein an overlying metal line in the overlying interconnect layer is directly coupled to an underlying metal line in a select connection region, including but not limited to the ICs 300, 500 in FIGS. 4A-5B. For example, FIGS. 7A-7B-1 is a flowchart illustrating another exemplary fabrication process 700-1 of fabricating an IC that includes adjacent overlying and underlying interconnect layers without an intermediate via layer, wherein an overlying metal line in the overlying interconnect layer is directly coupled to an underlying metal line in a select connection region, and further includes insulating layers disposed in recesses in other connection regions to insulate and isolate the first and second overlying metal lines from the respective second and first underlying metal lines, like the IC 300 in FIGS. 4A and 4B. FIGS. 8A-8E-1 illustrate exemplary fabrication stages 800A-800E-1 in the fabrication process 700-1 in FIGS. 7A-7B-1. The exemplary fabrication process 700(1) steps in FIGS. 7B-1 will be discussed in conjunction with the exemplary fabrication stages 800A-800E-1 in FIGS. 8A-8E-1 referencing the IC 300 in FIGS. 4A and 4B.

In this regard, as shown in the fabrication stage 800A in FIG. 8A, a first step in the fabrication process 700 of fabricating a BEOL interconnect structure 304 in FIGS. 4A and 4B is to form a first dielectric layer 801 of the dielectric material 408 (block 702 in FIG. 7A). Also, as shown in the fabrication stage 800A in FIG. 8A, another step in the fabrication process 700 of fabricating a BEOL interconnect structure 304 is forming the first underlying metal line 316U(1) in a first horizontal direction (Y-axis direction) of in the first dielectric layer 801. The first dielectric layer 801 may be made of silicon nitride (SiN) for example. Also shown in the fabrication stage 800A in FIG. 8A, another step in the fabrication process 700 of fabricating a BEOL interconnect structure 304 is forming the second underlying metal line 316U(2) in a second horizontal direction (Y-axis direction) parallel to the first horizontal direction in the first dielectric layer 801 (block 702 in FIG. 7A). Also shown in the fabrication stage 800A in FIG. 8A, another step in the fabrication process 700 of fabricating a BEOL interconnect structure 304 is polishing a first surface 802 of the first dielectric layer 801 to expose a first surface 804(1) of the first underlying metal line 316U(1) and a first surface 804(2) of the second underlying metal line 316U(2) from the first dielectric layer 801.

Also shown in the fabrication stage 800B in FIG. 8B, another step in the fabrication process 700 of fabricating a BEOL interconnect structure 304 is forming the first insulating layer 402(1)(or insulating layer 530 with regard to the BEOL interconnect structure 504 in FIGS. 5A and 5B) over the first surface 802 of the first dielectric layer 801, the first surface 804(1) of the first underlying metal line 316U(1) and the first surface 804(2) of the second underlying metal line 316U(2) (block 704 in FIG. 7A). The first underlying interconnect layer 314U is formed as shown in the fabrication stage 800B in FIG. 8B.

The fabrication stages 800C-1-800E-1 in FIGS. 8C-1-8E-1 and described in the process 700-1 in FIGS. 7B-1 are applicable to the fabrication of the BEOL interconnect structure 304 in FIGS. 3-4B. In this regard, as shown in the fabrication stage 800C-1 in FIG. 8C-1, another step in the fabrication process 700 of fabricating a BEOL interconnect structure 304 is patterning the first insulating layer 402(1) to form an opening 806 in the first insulating layer 402(1) outside the second connection region 400(2) (block 706 in FIG. 7B). A portion of the first insulating layer 402(1) in the opening 806 outside of the second connection region 400(1) remains in the second connection region 400(2) of the second underlying metal line 316U(2) to provide eventual isolation and insulation of a first overlying metal line to be disposed on the underlying interconnect layer 314U (block 706-1 in FIG. 7B-1). Then, as shown in the fabrication stage 800D-1 in FIG. 8D-1, another step in a fabrication process 700-1 of fabricating a BEOL interconnect structure 304 is disposing the first metal barrier layer 406(1) on the first dielectric layer 801, on the first surface 804(1) of the first underlying metal line 316U(1), the first surface 804(2) of the second underlying metal line 316U(2), and the first insulating layer 404 (block 708-1 in FIG. 7B-1). Then, as shown in the fabrication stage 800E-1 in FIG. 8D-1, another step in the fabrication process 700-1 of fabricating a BEOL interconnect structure 304 is disposing a metal material 808 on the underlying insulating layer 314U, on the first surfaces 804(1), 804(2) of the first and second underlying metal lines 316U(1), 316U(2) and on the surface 802 of the first insulating layer 402(1) to form the first overlying metal line 316O(1) (block 710-1 in FIG. 7B-1).

The process steps 702, 704 in FIG. 7A can be employed as common steps to fabricate either of the ICs 300, 500 in FIGS. 3-4B and FIGS. 5A-5B. The process steps 706-2-710-2 shown in fabrication stages 800C-2-800E-2 in FIGS. 7B-2 and 8C-2-8E-2 can be employed to fabricate an IC 500 like in FIGS. 5A and 5B. The process steps 706-2-710-2 in FIGS. 7B-2 and shown in fabrication stages 800C-2-800E-2 in FIGS. 8C-2-8E-2 will be discussed with regard to the BEOL interconnect structure 504 in the IC 500 in FIGS. 5A and 5B.

In this regard, as shown in the fabrication stage 800C-2 in FIG. 8C-2, a next step in a fabrication process 700-2 of the BEOL interconnect layer 504 is patterning the insulating layer 530 to form an opening 810 in the insulating layer 530 in the first connection region 526(1) (block 706-2 in FIG. 7B-2). Another step in the fabrication process 700-2 of the BEOL interconnect layer 504, as also shown in the fabrication stage 800C-2 in FIG. 8C-2, is etching a portion of the insulating layer 530 in the opening 810 in the first connection region 526(1) to remove the portion of the insulating layer 530 on the first underlying metal line 516U(1) in the first connection region 526(1) (block 706-2 in FIG. 7B-2). As shown in the fabrication stage 800D-2 in FIG. 8D-2, a next step in a fabrication process 700-2 of the BEOL interconnect layer 504 is disposing a metal barrier layer 812 on the first dielectric layer 800, on the first surface 804(1) of the first underlying metal line 516U(1), and on the insulating layer 530 (block 708-2 in FIG. 7B-2). As shown in the fabrication stage 800E-2 in FIG. 8E-2, a next step in a fabrication process 700-2 of the BEOL interconnect layer 504 is disposing a metal material 814 on the first dielectric layer 800 above the insulating layer 530 and in the opening 810 to contact the first underlying metal line 516U(1) in the first connection region 526(1) to form the first overlying metal line 516O(1) (block 710-2 in FIG. 7B-2). The first overlying metal line 516O(1) is insulated and isolated from the second underlying metal line 516U(2) by the insulating layer 530 outside the first connection region 526(1).

It is also possible to provide for the overlying metal lines in a BEOL interconnect structure in an IC to extend from a connection region orthogonally in the longitudinal direction of a coupled underlying metal line to increase the contact area and thus further decrease contact resistance. that includes adjacent overlying and underlying interconnect layers without an intermediate via layer. This is shown by example in the ICs 900, 1000, 1100 in FIGS. 9-11, respectively. The example ICs 900-1100 in FIGS. 9-11 will be described with common elements with the IC 300 in FIGS. 3-4B as an example, but note that the ICs 900-1100 in FIGS. 9-11 could also include common elements and design with the IC 500 in FIGS. 5A-5B.

Figure 9:
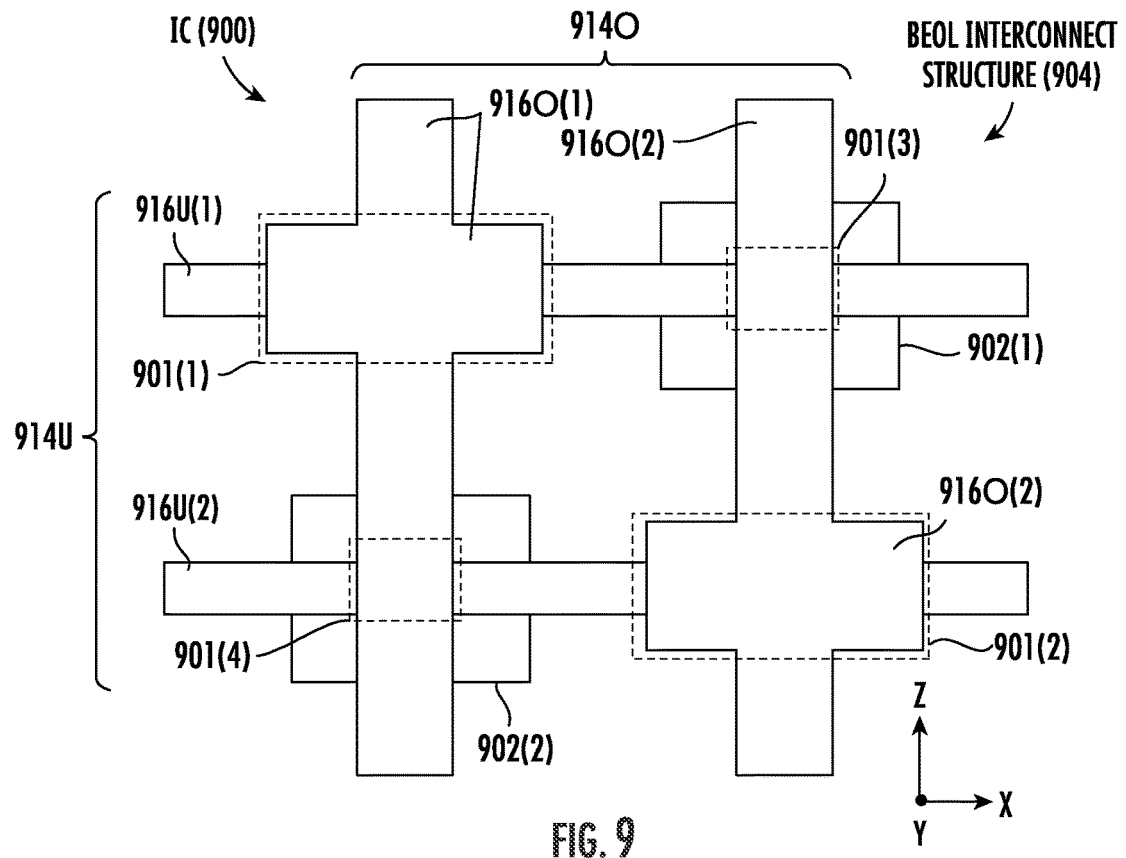
FIG. 9 is a top view of another exemplary IC that includes an overlying interconnect layer disposed on an underlying interconnect layer without an intermediate via layer, wherein first and second overlying metal lines in the overlying interconnect layer are coupled to respective first and second underlying metal lines in first and second connection regions in respective first and second vertical intersections of the metal lines, wherein the overlying metal lines also extend in both directions of their coupled underlying metal lines.

In this regard, FIG. 9 is a top view of another exemplary IC 900 that includes a BEOL interconnect structure 904 similar to the BEOL interconnect structure 304 in FIGS. 3-4B. In the BEOL interconnect structure 904 in FIG. 9, first and second overlying interconnect lines 916O(1), 916O(2) in an overlying interconnect layer 9140 are disposed over and intersect first and second underlying metal lines 916U(1), 916U(2) in respective connection regions 901(1)-901(4) without an intermediate via layer. The first overlying interconnect line 916O(1) intersects and is directly coupled to the first underlying interconnect line 916U(1) in a first connection region 901(1). The second overlying interconnect line 916O(2) intersects and is directly coupled to second underlying interconnect line 916U(2) in a second connection region 901(2). The second overlying interconnect line 916O(2) intersects the first underlying interconnect line 916U(1)

in a third connection region 901(3), but is isolated by a first insulating layer 902(1). The first overlying interconnect line 916O(1) intersects the second underlying interconnect line 916U(1) in a fourth connection region 901(4), but is isolated by a second insulating layer 902(2). In this example, the first and second overlying metal lines 916O(1), 916O(2) extend in both the horizontal X- and Y-axis directions to form an enlarged first and second connection regions 901(1), 901(2) to increase the contact area between the first and second underlying metal lines 916U(1), 916U(2) and the respective first and second overlying metal lines 916O(1), 916O(2) beyond the connection regions 901(1), 901(2), thus decreasing contact resistance.

Figure 10:
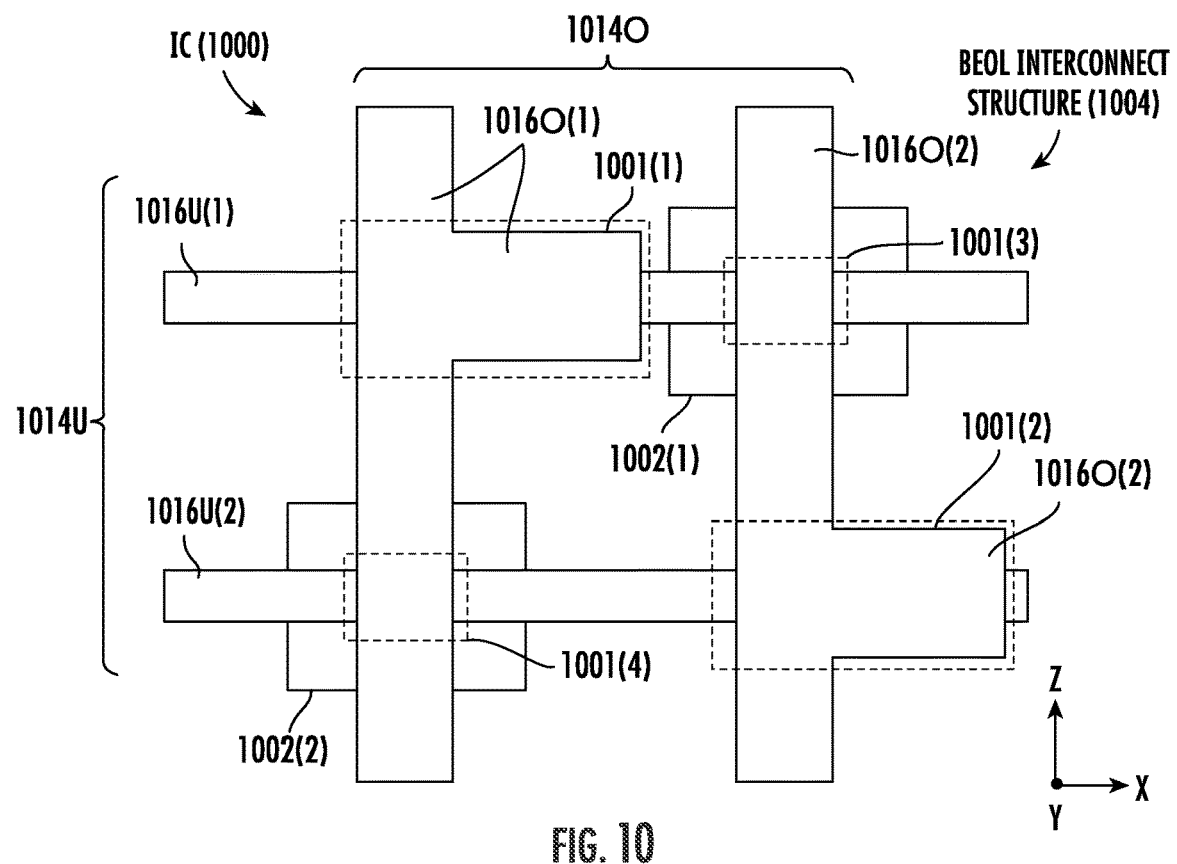
FIG. 10 is a top view of another exemplary IC that includes an overlying interconnect layer disposed on an underlying interconnect layer without an intermediate via layer, wherein first and second overlying metal lines in the overlying interconnect layer are coupled to respective first and second underlying metal lines in first and second connection regions in first and second vertical intersections of the metal lines, wherein the overlying metal lines also extend in a direction of their coupled underlying metal lines.

FIG. 10 is a top view of another exemplary IC 1000 that includes a BEOL interconnect structure 1004 similar to the BEOL interconnect structure 304 in FIGS. 3-4B. In the BEOL interconnect structure 1004 in FIG. 10, first and second overlying interconnect lines 1016O(1), 1016O(2) in an overlying interconnect layer 1014O are disposed over and intersect first and second underlying metal lines 1016U(1), 1016U(2) in respective connection regions 1001(1)-1001(4) without an intermediate via layer. The first overlying interconnect line 1016O(1) intersects and is directly coupled to the first underlying interconnect line 1016U(1) in a first connection region 1001(1). The second overlying interconnect line 1016O(2) intersects and is directly coupled to the second underlying interconnect line 1016U(2) in a second connection region 1001(2). The second overlying interconnect line 1016O(2) intersects the first underlying interconnect line 1016U(1) in a third connection region 1001(3), but is isolated by a first insulating layer 1002(1). The first overlying interconnect line 1016O(1) intersects the second underlying interconnect line 1016U(1) in a fourth connection region 1001(4), but is isolated by a second insulating layer 1002(2). In this example, the first and second overlying metal lines 1016O(1), 1016O(2) extend in both the horizontal X- and Y-axis directions and in on direction out from the respective connection regions 1001(1), 1001(2) in the horizontal X-axis direction to form an enlarged first and second connection regions 1001(1), 1001(2) to increase the contact area between the first and second underlying metal lines 1016U(1), 1016U(2) and the respective first and second overlying metal lines 1016O(1), 1016O(2) beyond the connection regions 1001(1), 1001(2), thus decreasing contact resistance.

Figure 11:
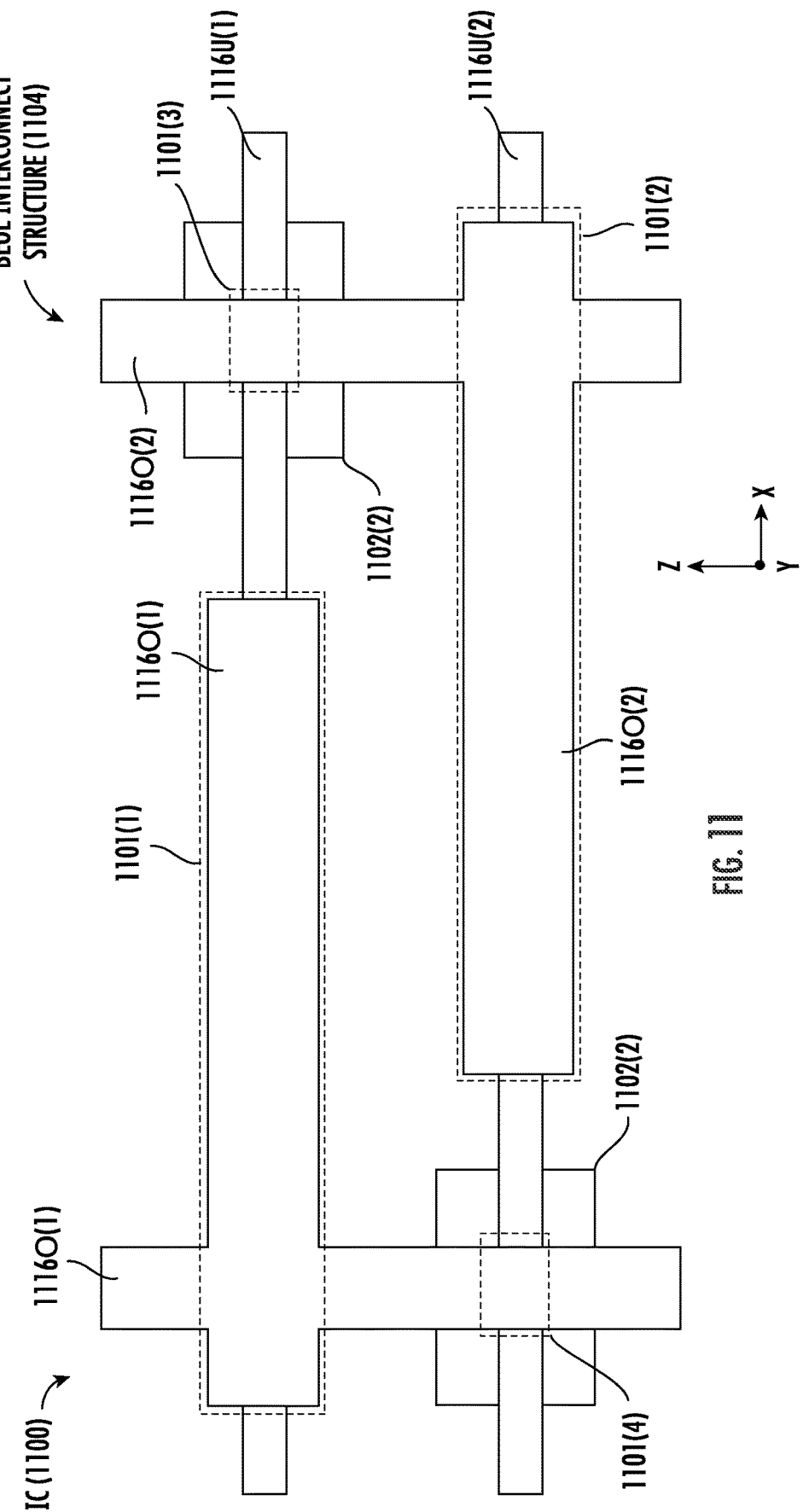
FIG. 11 is a top view of another exemplary IC that includes an overlying interconnect layer disposed on an underlying interconnect layer without an intermediate via layer, wherein first and second overlying metal lines in the overlying interconnect layer are coupled to respective first and second underlying metal lines in first and second connection regions in first and second vertical intersections of the metal lines, wherein the overlying metal lines also extend in both directions of their coupled underlying metal lines.

FIG. 11 is a top view of another exemplary IC 1100 that includes a BEOL interconnect structure 1104 similar to the BEOL interconnect structure 304 in FIGS. 3-4B. In the BEOL interconnect structure 1104 in FIG. 11, first and second overlying interconnect lines 1116O(1), 1116O(2) in an overlying interconnect layer 1114O are disposed over and intersect first and second underlying metal lines 1116U(1), 1116U(2) in respective connection regions 1101(1)-1101(4) without an intermediate via layer. The first overlying interconnect line 1116O(1) intersects and is directly coupled to the first underlying interconnect line 1116U(1) in a first connection region 1101(1). The second overlying interconnect line 1116O(2) intersects and is directly coupled to the second underlying interconnect line 1116U(2) in a second connection region 1101(2). The second overlying interconnect line 1116O(2) intersects the first underlying interconnect line 1116U(1) in a third connection region 1101(3), but is isolated by a first insulating layer 1100(1). The first overlying interconnect line 1116O(1) intersects the second underlying interconnect line 1116U(1) in a fourth connection region 1101(4), but is isolated by a second insulating layer 1100(2). In this example, the first and second overlying metal lines 1116O(1), 1116O(2) extend in both the horizontal X- and Y-axis directions and in both directions in the X-axis from respective connection regions 1101(1), 1101(2) in the horizontal X-axis direction to form an enlarged first and second connection regions 1101(1), 1100(2) to increase the contact area between the first and second underlying metal lines 1116U(1), 1116U(2) and the respective first and second overlying metal lines 1116O(1), 1116O(2) beyond the connection regions 1101(1), 1101(2), thus decreasing contact resistance. The examples of an IC described above that include directly coupled adjacent overlying and underlying interconnect layers without an intermediate via layer are provided in a BEOL interconnect structure.

Figure 12A:
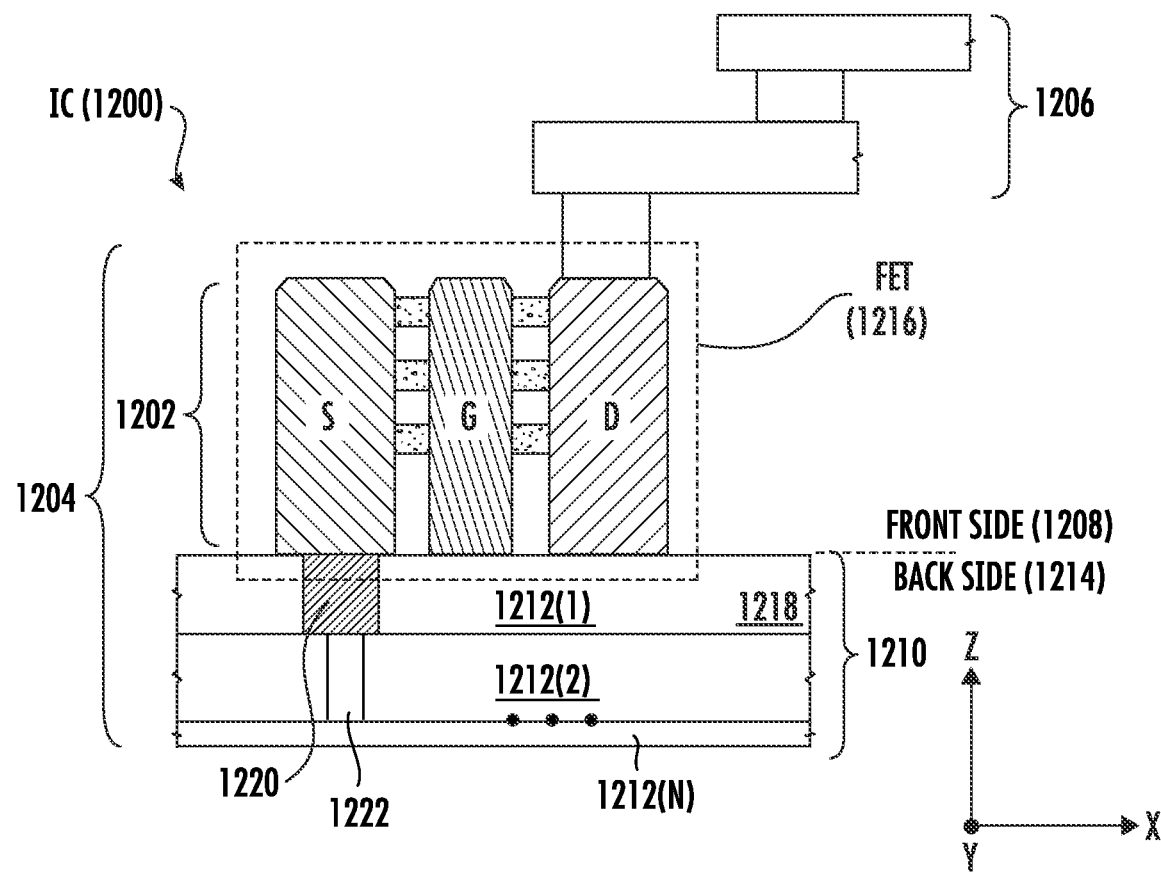
FIG. 12A is a side view of an exemplary IC that includes a field-effect transistor (FET) formed in an active semiconductor layer of a FEOL structure, a BEOL interconnect structure on a front side of the FEOL structure, and an adjacent interconnect layers on a back side of the FEOL structure that include buried metal lines in a semiconductor substrate coupled to metal lines in connection regions in an adjacent metallization layer without an intermediate via layer, and further includes insulating layers disposed in recesses in other connection regions to insulate and isolate the first and second overlying metal lines from the respective second and first underlying metal lines.
Figure 12B:
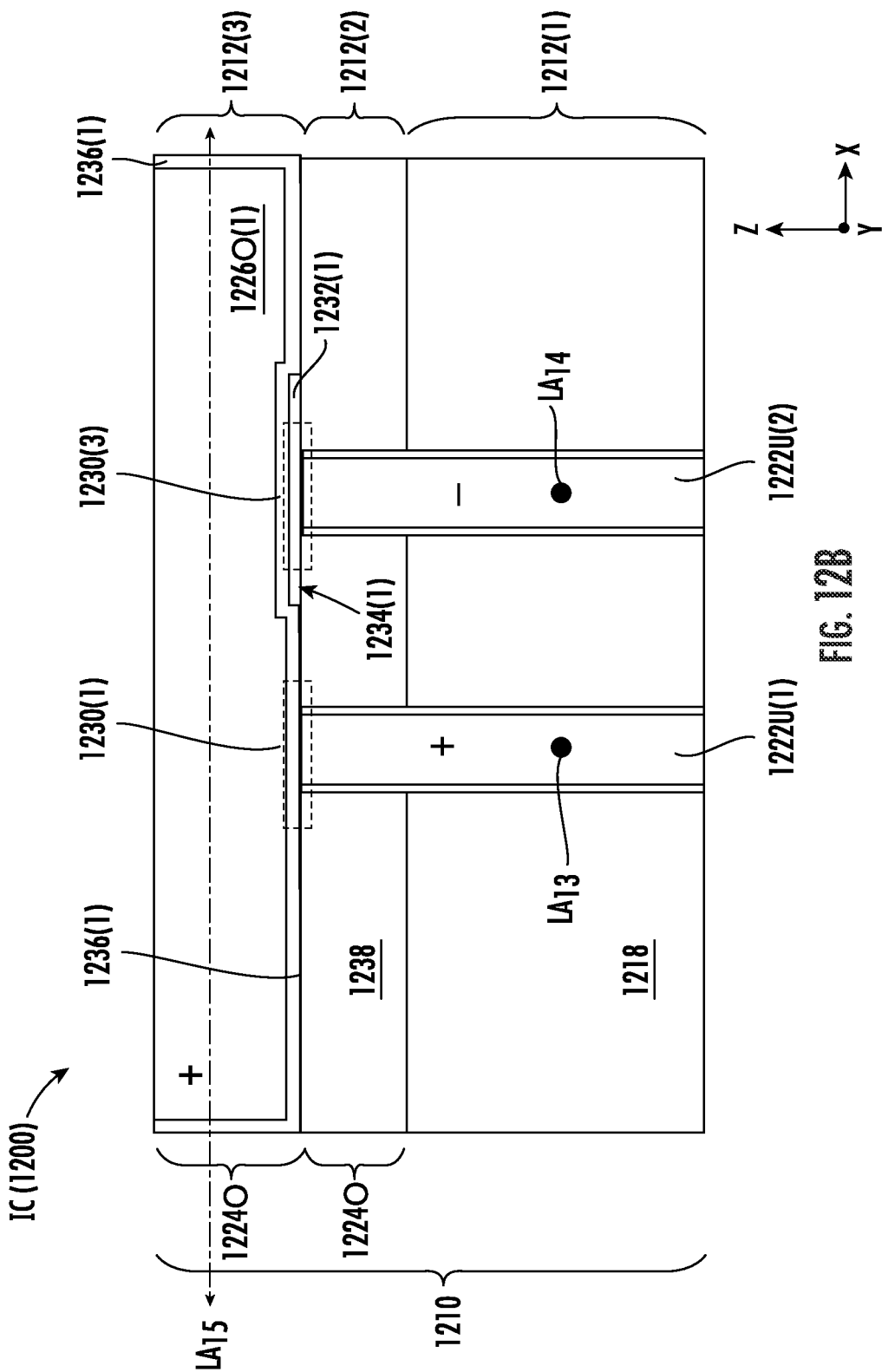
FIG. 12B is another side view of the IC in FIG. 12A.

It may be desired to provide an IC that includes directly coupled adjacent overlying and underlying interconnect layers without an intermediate via layer in a back side of the IC. In this regard, FIG. 12A is a side view of an exemplary IC 1200 that includes an active semiconductor layer 1202 in a FEOL structure 1204 and a BEOL interconnect structure 1206 disposed on a front side 1208 of the FEOL structure 1204. The IC 1200 also includes a back side interconnect structure 1210 with adjacent interconnect layers 1212(1)-1212(N) on a back side 1214 of the FEOL structure 1204. FIG. 12B is another side view of the IC 1200 in FIG. 12A illustrating the back side interconnect structure 1210 with the adjacent interconnect layers 1212(1)-1212(N) in a flipped, 180 degree orientation in the Z-axis direction from the IC 1200 in FIG. 12A. As shown in FIG. 12A, a FET 1216 is formed in the active semiconductor layer 1202. As shown in FIGS. 12A and 12B, the first interconnect layer 1212(1) of the back side interconnect structure 1210 is a substrate 1218 of the IC 1200. The substrate 1218 can be a silicon substrate. A back side metal contact 1220 of the FET 1216 is in contact with a back side metal line 1222 in the interconnect layer 1212(2) to allow routing of signals from the back side 1214 of the FEOL structure 1204 beneath the substrate 1218 as the first interconnect layer 1212(1) in the Z-axis direction. For example, the back side metal line 1222 could be electrically coupled to a power rail that is configured to carry a power signal from a power source to the source S of the FET 1216 through that the back side metal line 1222 and the back side metal contact 1220.

As shown in FIG. 12B, the back side interconnect structure 1210 includes the back side metal lines 1222(1), 1222 (2) as buried metal lines in the substrate 1218. As shown in FIG. 12B, assuming the back side interconnect structure 1210 only includes three (3) interconnect layers 1212(1)-1212(3), the interconnect layer 1212(3) serves as an overlying interconnect layer 1224O. The interconnect layer 1212(2) serves as an underlying interconnect layer 1224U that is adjacent to the overlying interconnect layer 1224O. The overlying interconnect layer 1224O and underlying interconnect layer 1224U serve as adjacent interconnect layers 1212(2), 1213(3) in the back side interconnect structure 1210 in FIG. 12B. By "overlying" and "underlying" in this example, it is meant that the overlying interconnect layer 1224O is disposed above the underlying interconnect layer 1224U in the Z-axis direction in FIG. 12B. As shown in FIG. 12B, a first underlying metal line 1222U(1) and second underlying metal line 1222U(2) are disposed in the underlying interconnect layer 1224U with each extending along respective longitudinal axes $LA_{13}$, $LA_{14}$ in the Y-axis horizontal direction parallel to each other. As also shown in FIG. 12B, a first overlying metal line 1222O(1) is disposed in the overlying interconnect layer 1224O extend along respective longitudinal axis $LA_{15}$ in the X-axis horizontal direction and orthogonal to the longitudinal axes $LA_{13}$, LA₁₄ in which the first underlying metal line 1222U(1) and second underlying metal line 1222U(2) extend.

As further shown in FIG. 12B, in this example, to interconnect the first underlying metal line 1222U(1) to the first overlying metal line 1222O(1), the first overlying metal line 1222O(1) is disposed directly in contact with the first underlying metal line 1222U(1). This is a result of the overlying interconnect layer 1224O being disposed on the underlying interconnect layer 1224U in the back side interconnect structure 1210 without employing an intermediate via layer. The first overlying metal line 1222O(1) intersects the first underlying metal line 1222U(1) in the horizontal X-axis direction. The first overlying metal line 1222O(1) is directly coupled to the first underlying metal line 1222U(1) in a first connection region 1230(1) where the first overlying metal line 1222O(1) and the first underlying metal line 1222U(1) intersect in the horizontal X- and Y-axis directions. For example, the first underlying metal line 1222U(1) and the first overlying metal line 1222O(1) may be electrically coupled together as part of a positive supply rails in a PDN in the IC 1200 in FIG. 12 for routing a supply voltage. As another example, the first underlying metal line 1222U(1) and the first overlying metal line 1222O(1) may be electrically coupled together as part of ground or negative supply rails in a PDN in the IC 1200. Note that although not shown directly in FIG. 12B, the overlying interconnect layer 1224O may also include a second overlying metal line that is not shown and that is directly coupled to the second underlying metal line 1222U(2) in a second connection region where the second overlying metal line and the second underlying metal line 1222U(2) intersect in the horizontal X- and Y-axis directions.

As shown in FIG. 12B, the first overlying metal line 1222O(1) also intersects the second underlying metal line 1222U(2) in a third connection region 1230(3). However, it may not be desired to electrically couple (i.e., short) the first overlying metal line 1222O(1) to the second underlying metal line 1222U(2). For example, the first overlying metal line 1222O(1) may be positive power rail and the second underlying metal line 1222U(2) may be a ground or negative power rail that cannot be shorted. Because the intermediate via layer is eliminated between the overlying and underlying interconnect layers 1224O, 1224U, the first overlying metal line 1222O(1) and the second underlying metal line 1222U(2) will be disposed directly in contact with each other causing a short if isolation is not provided. In this regard, as shown in FIG. 12B, the back side interconnect structure 1210 includes a first insulating layer 1232(1) that is disposed between first overlying metal line 1222O(1) and the second underlying metal line 1222U(2) in the third connection region 1230(3). The first insulating layer 1232(1) is formed from a dielectric material. In this example, the first insulating layer 1232(1) is disposed in a first recess 1234(1) in the first overlying metal line 1222O(1) that is adjacent to the third connection region 1230(3). The first insulating layer 1232(1) isolates and insulates the second underlying metal line 1222U(2) from the first overlying metal line 1222O(1) to avoid an electrical connection between the second underlying metal line 1222U(2) and the first overlying metal line 1222O(1). By providing the first recess 1234(1) in the second underlying metal line 1216U(2) in the third connection region 1230(3), an extra layer of insulating material is not required to be between the entire interface between the overlying and underlying interconnect layers 1224O, 1224U that would contribute to additional height (in the Z-axis direction) in the back side interconnect structure 1210 in FIG. 12B, and thus contribute to the overall height (in the Z-axis direction) of the IC 1200.

As also shown in FIG. 12B, in this example, the first overlying metal line 1222O(1) is disposed on a thin metal barrier layer 1236(1) that is disposed on the underlying interconnect layer 1224U. For example, the thin metal barrier layer 1236(1) may be Tantalum Nitride. The thin metal barrier layer 1236(1) provides a direct electrical connection between the first overlying metal line 1222O(1) and the first underlying metal line 1222U(1) while also providing a barrier layer that can reduce or prevent diffusion of the metal material of the first overlying metal line 1222O(1) into the underlying interconnect layer 1224U during fabrication processes where temperatures sufficient to cause metal diffusion can occur. For example, the underlying interconnect layer 1224U in this example includes a dielectric material 1238 that the underlying metal lines 1222U(1), 1222U(2) are formed in to insulate and isolate the underlying metal lines 1222U(1), 1222U(2). If metal material from the first overlying metal line 1222O(1) diffuses into the dielectric material 1238 of the underlying interconnect layer 1224U, the diffused metal may cause an unintended short with underlying metal lines 1222U that are not intended, such as between the first overlying metal line 1222O(1) and the second underlying metal line 1222U(2) in this example.

Also, though not directly shown in FIG. 12B, note that a second insulating layer also disposed in a second recess (similar to the first insulating layer 404(1) in the first recess 404(1) in the first underlying metal line 1222U(1) that is adjacent to another, fourth connection region. The second insulating layer is formed from a dielectric material. The second insulating layer isolates and insulates the first underlying metal line 1222U(1) from a second overlying metal line formed in the overlying interconnect layer 1224O to avoid an electrical connection between the first underlying metal line 1222U(1) and the second overlying metal line. The details regarding the first recess 1234(1) in the first overlying metal line 1222U(1) shown in FIG. 12B are also applicable to the second recess in the second overlying metal line. Also, though not directly shown in FIG. 12B, in this example, the second overlying metal line is disposed on a thin metal barrier layer like the first metal barrier layer 406(1) that is disposed on the underlying interconnect layer 1224U. The thin metal barrier layer provides a direct electrical connection between the second overlying metal line 1222O(2) and the second underlying metal line 1226U(2) while also providing a barrier layer that can reduce or prevent diffusion of the metal material of the second overlying metal line into the underlying interconnect layer 1224U during fabrication processes where temperatures sufficient to cause metal diffusion can occur.

The IC 1200 in FIGS. 12A and 12B can be fabricated according to the exemplary fabrication process 600 described above with regard to FIG. 6. Other fabrication processes can also be employed to fabricate the IC 1200 that includes adjacent overlying and underlying interconnect layers without an intermediate via layer in a back interconnect structure, wherein an overlying metal line in the overlying interconnect layer is directly coupled to an underlying metal line in a select connection region. For example, FIGS. 13A and 13B is a flowchart illustrating another exemplary fabrication process 1300 of fabricating the IC 1200 in FIGS. 12A and 12B. FIGS. 14A-14E illustrate exemplary fabrication stages 1400A-1400E in the fabrication process 1300 in FIGS. 13A and 13B. The exemplary fabrication process 1300 in FIGS. 13A and 13B will be discussed in conjunction with the exemplary fabrication stages 1400A-1400E in FIGS. 14A-14E referencing the IC 1200 in FIGS. 12A and 12B.

In this regard, as shown in the fabrication stage 1400A in FIG. 14A, a first step in the fabrication process 1300 of fabricating the back side interconnect structure 1210 in FIGS. 12A and 12B is forming the first underlying metal line 1222U(1) extending in a first horizontal direction (Y-axis direction) in substrate 1218 of the FEOL structure 1204 as an underlying interconnect layer 1224U(1) in back side interconnect structure 1210 (block 1302 in FIG. 13A). As also shown in the fabrication stage 1400A in FIG. 14A, the fabrication process 1300 includes forming the second underlying metal line 1222U(2) in the substrate 1218 extending in the second horizontal direction (Y-axis direction) parallel to the first horizontal direction (Y-axis direction) in the underlying interconnect layer 1224U(1) of the back side interconnect structure 1210 (block 1302 in FIG. 13A). As also shown in the fabrication stage 1400B in FIG. 14B, the fabrication process 1300 includes grinding a top surface 1402 of the substrate 1218 in FIG. 14A to the second surface 1403 (FIG. 14B) to expose a first surface 1404(1) of the first underlying metal line 1222U(1) and a first surface 1404(2) of the second underlying metal line 1222U(2), from a top surface 1402 of the substrate 1218 (block 1304 in FIG. 13A).

As shown in the fabrication stage 1400C in FIG. 14C, the fabrication process 1300 also includes recessing the second surface 1403 of the substrate 1218 of the underlying interconnect layer 1224U down to a third surface 1406 of the substrate 1218 to prepare for the deposition of a dielectric layer to isolate the first overlying metal line 1222O(1) to be disposed on the substrate 1218 from the substrate 1218 (block 1306 in FIG. 13A). As also shown in the fabrication stage 1400D in FIG. 14D, the fabrication process 1300 also includes disposing a dielectric layer 1408 on the third surface 1406 of the substrate 1218 and adjacent to the first and second underlying metal lines 1222U(1), 1222U(2) (block 1308 in FIG. 13B). As also shown in the fabrication stage 1400D in FIG. 14D, the fabrication process 1300 also includes forming the first overlying metal line 1222O(1) in an overlying metallization layer 1224O on the dielectric layer 1408 and the first surfaces 1404(1), 1404(2) of the first and second underlying metal lines 1222U(1), 1222U(2) (block 1310 in FIG. 13B). The first overlying metal line 1222O(1) is disposed to extend in a horizontal direction (X-axis direction) orthogonal to the horizontal direction (Y-axis direction) of the first and second underlying metal lines 1222U(1), 1222U(2) such that the first overlying metal line 1222O(1) intersects the first and second underlying metal lines 1222U(1), 1222U(2) in the vertical direction (Z-axis direction) in respective first and third connection areas 1230(1), 1230(3). The first overlying metal line 1222U(1) is disposed on the dielectric layer 1408 after the dielectric layer 1408 is patterned to form the first insulating layer 1232(1) on the second underlying metal line 1222U(2) in the third connection area 1230(3). This then provides the first recess 1234(1) in the first overlying metal line 1222U(1) such that the first insulating layer 1232(1) insulates and isolates the first overlying metal line 1222U(1) from the second underlying metal line 1222U(2).

Figure 15:
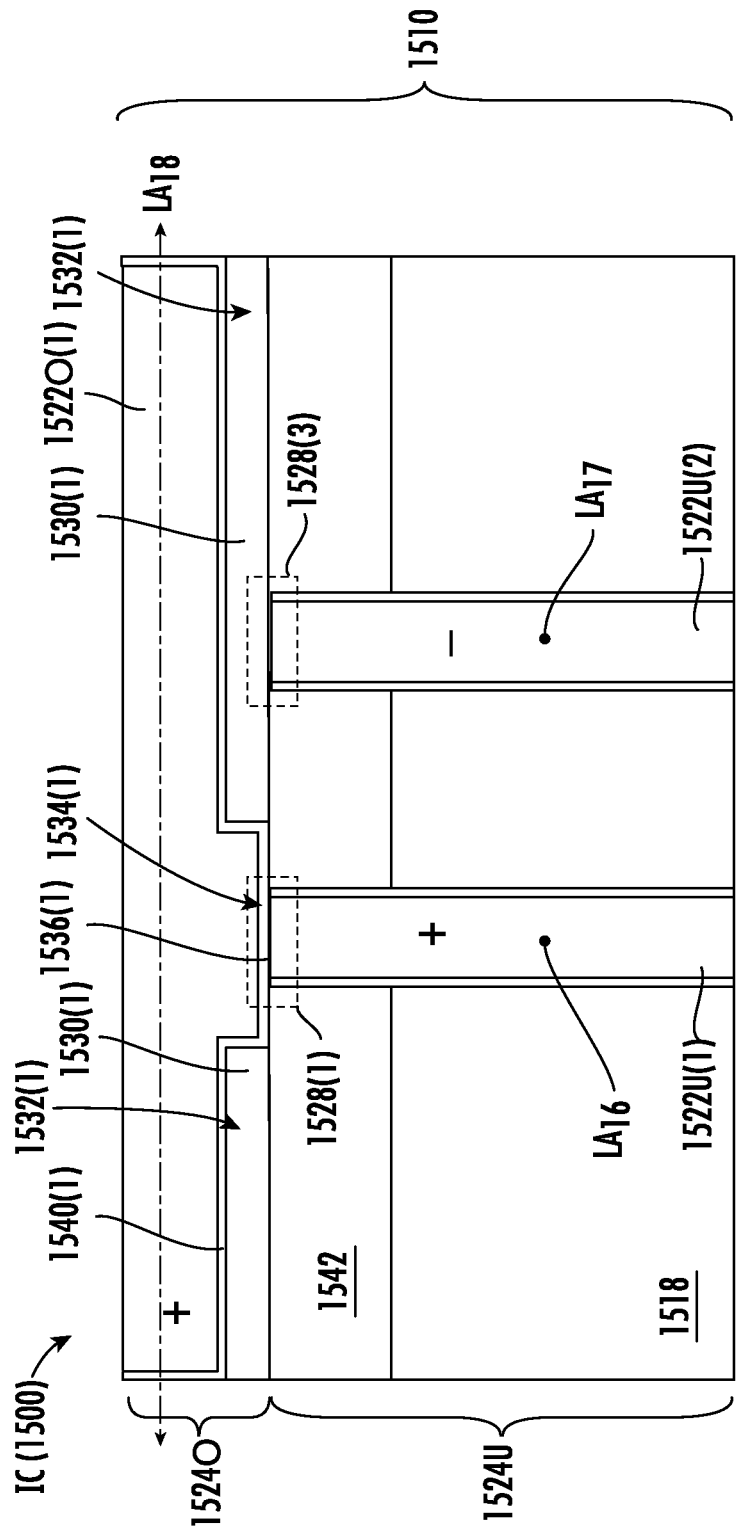
FIG. 15 is a side view of another exemplary IC that includes a FET formed in an active semiconductor layer of a FEOL structure, a BEOL interconnect structure on a front side of the FEOL structure, and an adjacent interconnect layers on a back side of the FEOL structure that include buried metal lines in a semiconductor substrate coupled to metal lines in connection regions in an adjacent metallization layer without an intermediate via layer, and further includes insulating layers disposed in recesses outside the connection regions to insulate and isolate the first and second overlying metal lines from the respective second and first underlying metal lines.

As discussed above with regard to the back side interconnect structure 1210 in the IC 1200 in FIGS. 12A and 12B, the first insulating layer 1232(1) is disposed in the first recess 1234(1) in the respective first overlying metal lines 1222O(1). However, there are alternative ways to provide for insulating of the first overlying metal line 1222O(1) to the respective second and first underlying metal lines 1222U (2), 1222U(1). In this regard, FIG. 15 is a side view of an alternative back side interconnect structure 1510 that can be provided in an IC 1500 similar to the back side interconnect structure 1210 in the IC 1200 in FIGS. 12A and 12B. As shown in FIG. 15, an overlying interconnect layer 1524O is adjacent to an underlying interconnect layer 1524U in the Z-axis direction in the back side interconnect structure 1510 in the IC 1500. The IC 1500 can be similar to the IC 300 in FIG. 3. The first underlying metal line 1522U(1) and second underlying metal line 1522U(2) are disposed in the underlying interconnect layer 1524U with each extending along respective longitudinal axes $LA_{16}$, $LA_{17}$ in the Y-axis horizontal direction parallel to each other. The first underlying metal line 1522U(1) and second underlying metal line 1522U(2) can be buried metal lines in a substrate 1518 as part of the underlying interconnect layer 1524U. As also shown in FIG. 15, a first overlying metal line 1522O(1) is disposed in the overlying interconnect layer 1524O that extends along longitudinal axis $LA_{18}$ in the X-axis horizontal direction orthogonal to the longitudinal axes $LA_{16}$, $LA_{17}$ in which the first underlying metal line 1522U(1) and second underlying metal line 1522U(2) extend.

In this example, to interconnect the first underlying metal line 1522U(1) to the first overlying metal line 1522O(1), the first overlying metal line 1522O(1) is disposed directly in contact with the first underlying metal line 1522U(1). This is a result of the overlying interconnect layer 1524O being disposed on the underlying interconnect layer 1524U in the back side interconnect structure 1510 without employing an intermediate via layer. The first overlying metal line 1522O(1) is directly coupled to the first underlying metal line 1522U(1) in a first connection region 1528(1) where the first overlying metal line 1522O(1) and the first underlying metal line 1522U(1) intersect in the horizontal X- and Y-axis directions. As shown in FIG. 15, the first overlying metal line 1522O(1) also intersects the second underlying metal line 1522U(2) in a third connection region 1528(3). However, it may not desired to electrically coupled (i.e., short) the first overlying metal line 1522O(1) to the second underlying metal line 1522U(2). For example, the first overlying metal line 1522O(1) may be positive power rail and the second underlying metal line 1522U(2) may be a ground or negative power rail that cannot be shorted. Because the intermediate via layer is eliminated between the overlying and underlying interconnect layers 1524O, 1524U, the first overlying metal line 1522O(1) and the second underlying metal line 1522U(2) will be disposed directly in contact with each other causing a short if isolation is not provided.

In this regard, as shown in FIG. 15, the back side interconnect structure 1510 includes an insulating layer 1530(1) that is disposed between and over the entire overlying interconnect layer 1524O and the underlying interconnect layer 1524U. The insulating layer 1530(1) is formed from a dielectric material. However, unlike the back side interconnect structure 1210 in FIGS. 12A and 12B, in the example back side interconnect structure 1510 in FIG. 15, the insulating layer 1530(1) is patterned and removed (e.g., etched away) in the first connection region 1528(1) between the first overlying metal line 1522O(1) and the first underlying metal line 1522U(1). This in effect creates a first recess 1532(1) in the first overlying metal line 1522O(1) outside of the respective first connection region 1528(1). As shown in FIG. 15 for the first overlying metal line 1522O(1), a first opening 1534(1) (could also be referred to as a "trench") created in the insulating layer 1530(1) that extends to a first surface 1536(1) of the first underlying metal line 1522U(1) as a result of patterning and removing the portion of the insulating layer 1530(1) in the first connection region 1528(1) is filled with metal material 1538(1) that forms the first overlying metal line 1522O(1) in the overlying interconnect layer 1524O. In this manner, the metal material 1538(1) of the first overlying metal line 1522O(1) is disposed in contact with the first underlying metal line 1522U(1), while the remaining portions of the insulating layer 1530(1) are left in the third connection region 1528(3) to insulate and isolate the first overlying metal line 1522O(1) from the second underlying metal line 1522U(2). By providing the first recess 1532(1) in the first overlying metal line 1522O(1) in the first connection region 1528(1), an extra layer of insulating material is not required to be disposed between the entire interface between the overlying and underlying interconnect layers 1524O, 1524U. Disposing an extra layer of insulating material would contribute to additional height in the back side interconnect structure 1510.

As also shown in FIG. 15, in this example, the first overlying metal line 1522O(1) is disposed on a first thin metal barrier layer 1540(1) that is disposed on the underlying interconnect layer 1524U. For example, the first thin metal barrier layer 1540(1) may be Tantalum Nitride for example. The first thin metal barrier layer 1540(1) provides a direct electrical connection between the first overlying metal line 1522O(1) and the first underlying metal line 1522U(1), while also providing a barrier layer that can reduce or prevent diffusion of the metal material 1538(1) of the first overlying metal line 1522O(1) into the underlying interconnect layer 1524U during fabrication processes where temperatures sufficient to cause metal diffusion can occur. For example, the underlying interconnect layer 1524U in this example includes a dielectric material 1542 that the underlying metal lines 1522U(1), 1522U(2) are formed in, to insulate and isolate the underlying metal lines 1522U(1), 1522U(2). If metal material from the first overlying metal line 1522O(1) diffuses into the dielectric material 1542 of the underlying interconnect layer 1524U, the diffused metal may cause an untended short with underlying metal lines 1522U that are not intended, such as between the first overlying metal line 1522O(1) and the second underlying metal line 1522U(1) in this example.

Other structures in addition to metal lines that carry signals, such as power signals, can be formed in an interconnect structure of an IC that include directly coupled metal lines in adjacent interconnect layers without an intermediate via layer. For example, a metal-oxide-metal (MoM) capacitor can be formed in an interconnect structure, such as a BEOL interconnect structure for example, with directly coupled metal lines in adjacent interconnect layers (e.g., metallization layers) without an intermediate via layer. The formation of a capacitor (e.g., a metal-oxide-metal (MoM) capacitor) out of directly coupled metal lines in adjacent interconnect layers without an intermediate via layer may be advantageous to reduce size (e.g., in the vertical direction) in an interconnect structure where capacitors are formed. Also as discussed above, directly coupled metal lines in adjacent interconnect layers can reduce contact resistance between the coupled metal lines.

Figure 16A:
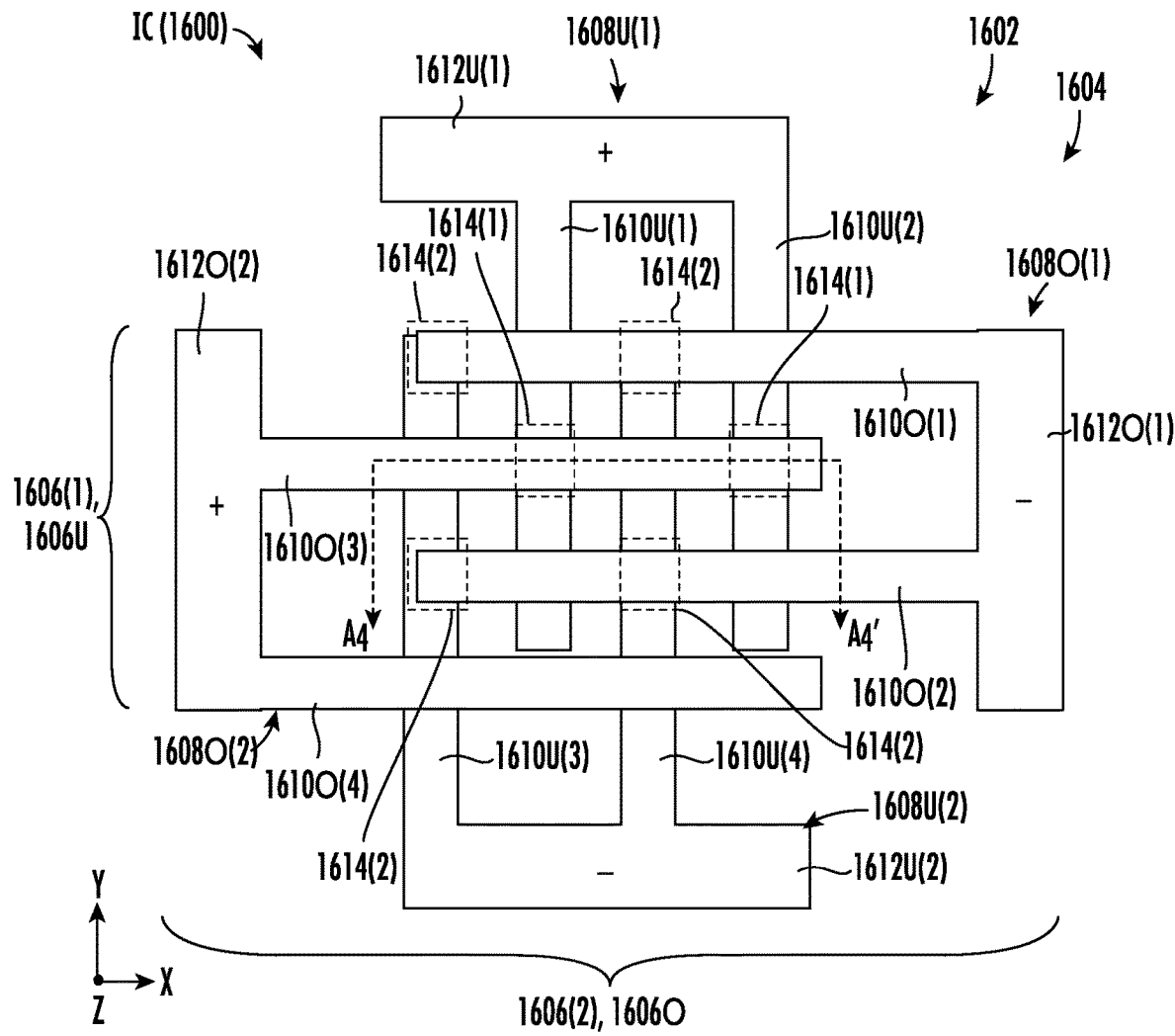
FIG. 16A is a top view of an exemplary IC that includes a capacitor formed in an interconnect structure that includes an underlying interconnect layer that includes interdigitated first and second underlying metal finger structures and an overlying interconnect layer that includes interdigitated first and second overlying metal finger structures extending orthogonal to the first and second underlying metal fingers, wherein the first overlying metal finger structure is coupled to the first underlying metal finger structure in the first connection region, with the first overlying metal finger structure coupled to the first underlying metal finger structure in a first intersecting connection region, and the second overlying metal finger structure coupled to the second underlying metal finger structure in a second intersecting connection region, without an intermediate via layer.
Figure 16B:
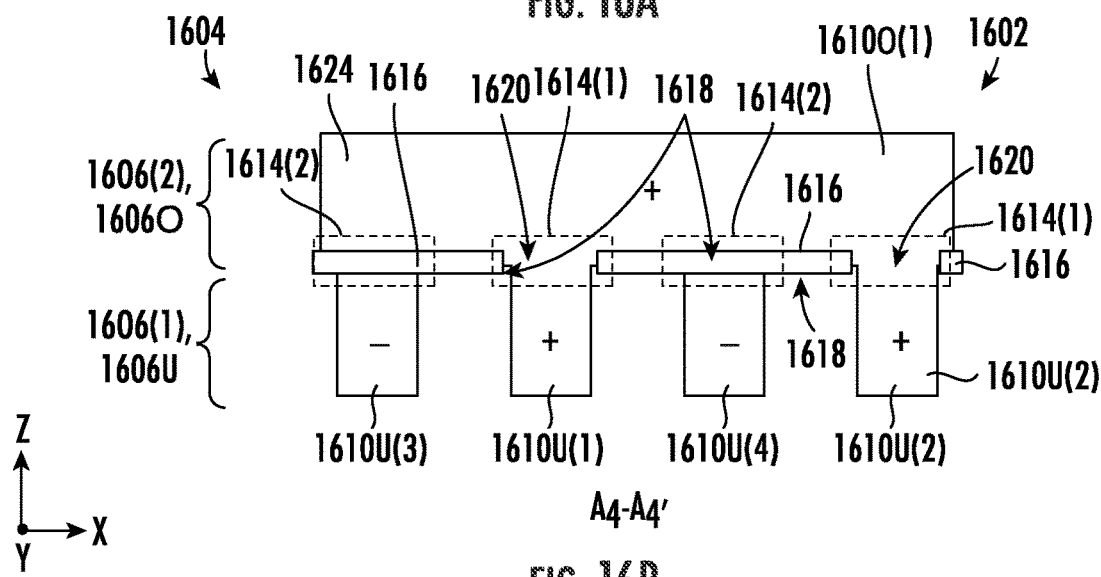
FIG. 16B is a cross-sectional side view of the IC in FIG. 16A.

In this regard, FIG. 16A is a top view of an exemplary IC 1600 that includes a capacitor 1602. For example, the capacitor 1602 may be a MoM capacitor. FIG. 16B is a cross-sectional side view across the $A_4$-$A_4'$ cross-section line in FIG. 16A. As discussed in more detail below, the capacitor 1602 is formed in an interconnect structure 1604 that includes directly coupled metal lines in adjacent interconnect layers 1606(1), 1606(2). For example, the interconnect structure 1604 may be a BEOL interconnect structure, such as like the BEOL interconnect structure 304 in the IC 300 in FIG. 3. There is no via layer in between the adjacent interconnect layers 1606(1), 1606(2). As shown in FIGS. 16A and 16B, the first interconnect layer 1606(1) is an underlying interconnect layer 1606U that is disposed underneath the second interconnect layer 1606(2) as an overlying interconnect layer 1606O in the Z-axis direction. The underlying interconnect layer 1606U includes a first underlying metal finger structure 1608U(1) that includes first and second underlying metal lines 1610U(1), 1610U(2) extending in the horizontal Y-axis direction in parallel to each other. The first and second underlying metal lines 1610U(1), 1610U(2) are coupled together through a first underlying metal line 1612U(1) disposed in the horizontal X-axis direction. The underlying interconnect layer 1606U also includes a second underlying metal finger structure 1608U(2) that includes a third and fourth underlying metal lines 1610U(3), 1610U(4) extending in the horizontal Y-axis direction in parallel to each other. The third and fourth underlying metal lines 1610U(3), 1610U(4) are coupled together through a second underlying metal line 1612U(2) disposed in the horizontal X-axis direction.

With continuing reference to FIG. 16A, the first underlying metal finger structure 1608U(1) is interdigitated with the second underlying metal finger structure 1608U(2). In this regard, the first and second underlying metal lines 1610U(1), 1610U(2) of the first underlying metal finger structure 1608U(1) are interdigitated with the respective third and fourth underlying metal lines 1610U(3), 1610U(4) of the second underlying metal finger structure 1608U(2). The first underlying metal line 1610U(1) is disposed adjacent to and between the third and fourth underlying metal lines 1610U(3), 1610U(4). The second underlying metal line 1610U(2) is disposed adjacent to the fourth underlying metal line 1610U(4). The fourth underlying metal line 1610U(4) is disposed adjacent to and between the first and second underlying metal lines 1610U(1), 1610U(2).

Also, as shown in FIG. 16A, the overlying interconnect layer 1606O includes a first overlying metal finger structure 1608O(1) that includes first and second overlying metal lines 1610O(1), 1610O(2) extending in the horizontal Y-axis direction in parallel to each other. The first and second overlying metal lines 1610O(1), 1610O(2) are coupled together through a first overlying metal line 1612O(1) disposed in the horizontal X-axis direction. The overlying interconnect layer 1606O also includes a second overlying metal finger structure 1608O(2) that includes a third and fourth overlying metal lines 1610O(3), 1610O(4) extending in the horizontal Y-axis direction in parallel to each other. The third and fourth overlying metal lines 1610O(3), 1610O(4) are coupled together through a second overlying metal line 1612O(2) disposed in the horizontal X-axis direction. The first overlying metal finger structure 1608O(1) is interdigitated with the second overlying metal finger structure 1608O(2). In this regard, the first and second overlying metal lines 1610O(1), 1610O(2) and the first underlying metal finger structure 1608U(1) are interdigitated with the respective third and fourth overlying metal lines 1610O(3), 1610O(4) of the second overlying metal finger structure 1608O(2). The third overlying metal line 1610O(3) is disposed adjacent to and between the first and second overlying metal lines 1610O(1), 1610O(2). The fourth overlying metal line 1610O(4) is disposed adjacent to the second underlying metal line 1610U(2). The second overlying metal line 1610O(2) is disposed adjacent to and between the third and fourth overlying metal lines 1610O(3), 1610O(4). As an example, the first underlying metal finger structure 1608U (1) and the second overlying metal structure 1608O(2) may be of the same polarity (+), and the second underlying metal finger structure 1608U(2) and the first overlying metal structure 1608O(1) may be of the second, different polarity (−).

With continued reference to FIG. 16A, the first overlying metal finger structure 1608O(1) intersects the first underlying metal finger structure 1608U(1) in the horizontal X- and Y-axis directions in first connection region 1614(1). The first overlying metal finger structure 1608O(1) is coupled to the first underlying metal finger structure 1608U(1) in the first connection region 1614(1) without an intermediate via layer. In this example, the third overlying metal line 1610O(3) intersects and is directly coupled to the first and second underlying metal lines 1610U(1), 1610U(2) in the horizontal X- and Y-axis directions. The second overlying metal finger structure 1608O(2) intersects the second underlying metal finger structure 1608U(2) in the horizontal X- and Y-axis directions in section connection region 1614(2). The second overlying metal finger structure 1608O(2) is directly coupled to the second underlying metal finger structure 1608U(2) in the second connection region 1614(2) without an intermediate via layer. In this example, the first and second overlying metal lines 1610O(1), 1610O(2) intersect and are directly coupled to the third and fourth underlying metal lines 1610U(3), 1610U(3) in the horizontal X- and Y-axis directions.

As shown in FIG. 16B, the capacitor 1602 includes an insulating layer 1616 that is disposed between the overlying interconnect layer 1606O and the underlying interconnect layer 1606U on the underlying interconnect layer 1606U to insulate the first overlying metal line 1610O(1) from the third and fourth underlying metal lines 1610U(3), 1610U(4). The insulating layer 1616 is formed from a dielectric material. In this example, insulating layer 1616 is patterned and removed (e.g., etched away) in the first connection regions 1614(1) between the first overlying metal line 1610O(1) and the first and second underlying metal lines 1610U(1), 1610U(2). Similar to the IC 500 in FIGS. 5A and 5B, this in effect creates recesses 1618 in the first overlying metal line 1610O(1) outside of the first connection regions 1614(1). As shown in FIG. 16B for the first overlying metal line 1610O(1), openings 1620 (could also be referred to as a "trenches") created in the insulating layer 1616 that extend to the first underlying metal lines 1610U(1), 1610U(2) as a result of patterning and removing the portion of the insulating layer 1616 in the first connection regions 1614(1) is filed with metal material 1624 that forms the first overlying metal line 1610O(1) in the overlying interconnect layer 1606O. In this manner, the metal material 1624 of the first overlying metal line 1610O(1) is disposed in contact with the first and second underlying metal lines 1610U(1), 1610U(2), while the remaining portions of the insulating layer 1616 are left to insulate and isolate the first overlying metal line 1610O(1) from the third and fourth underlying metal lines 1610U(3), 161U(4) in the second connection regions 1614(2). By providing the first recess 1618 in the first overlying metal line 1610O(1) in the first connection regions 1614 (1), an extra layer of insulating material is not required to be between the entire interface between the overlying and underlying interconnect layers 1606O, 1606U that would contribute to additional height in the interconnect structure 1604.

Note that instead of the recesses being formed in the first connection region 1614(1), the recesses could be formed in the second connection region 1614(2), similar to the IC 300 in FIGS. 4A and 4B. In this manner, those recesses could contain the insulating layer 1616 that remained resident from patterning and etching to insulate and isolate the third and fourth underlying metal lines 1610U(3), 161U(4) in the second connection region 1614(2) from the first overlying metal line 1610O(1). A thin barrier metal layer, as described above, can also be disposed between overlying metal lines 1610O coupled to underlying metal lines 1610U.

Figure 17A:
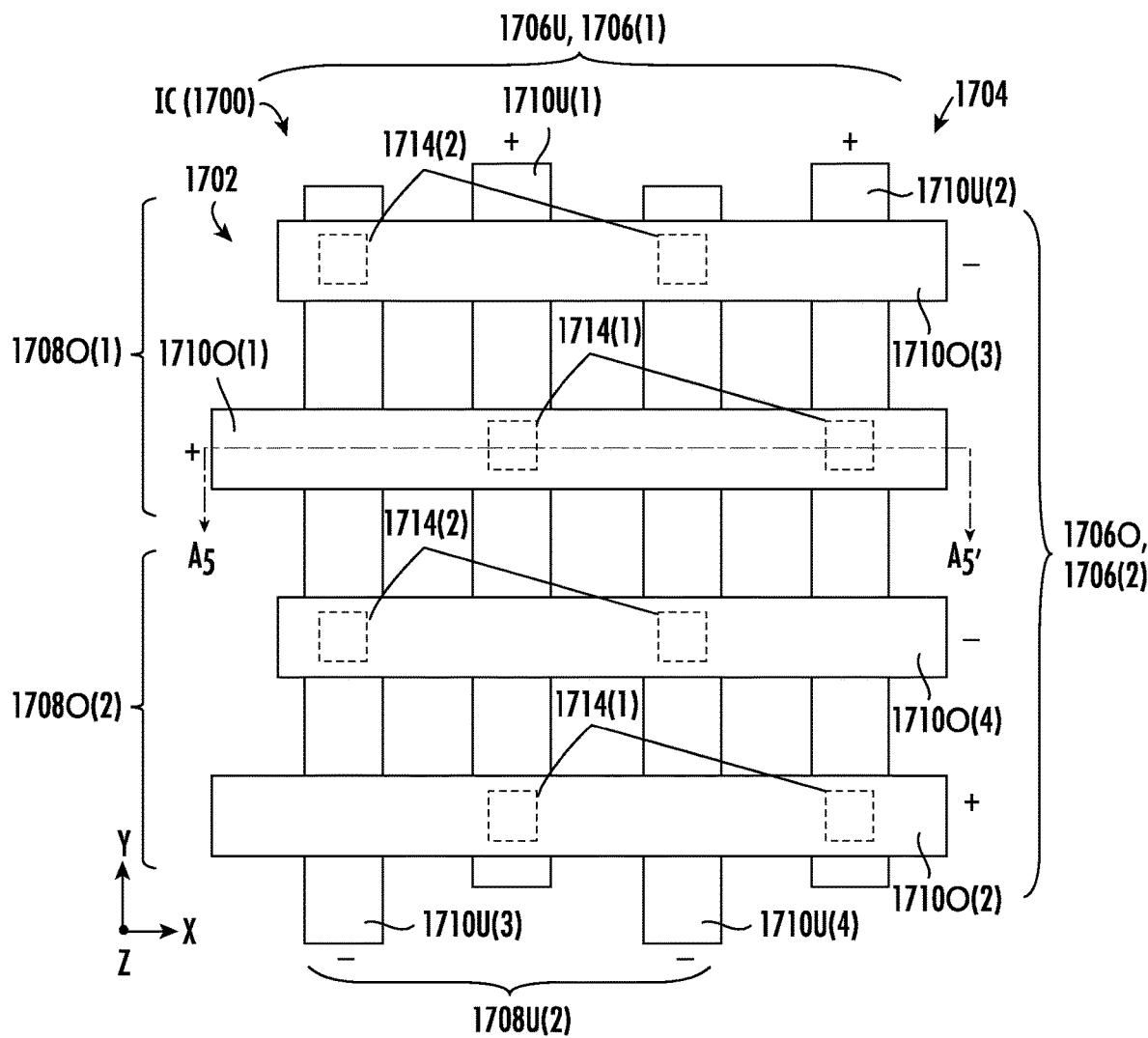
FIG. 17A is a top view of another exemplary IC that includes a capacitor formed in an interconnect structure that includes an underlying interconnect layer that includes interdigitated first and second underlying metal finger structures and an overlying interconnect layer that includes interdigitated first and second overlying metal finger structures extending orthogonal to the first and second underlying metal fingers, wherein the first overlying metal finger structure is coupled to the first underlying metal finger structure in the first connection region, with the first overlying metal finger structure coupled to the first underlying metal finger structure in a first intersecting connection region, and the second overlying metal finger structure coupled to the second underlying metal finger structure in a second intersecting connection region, without an intermediate via layer.
Figure 17B:
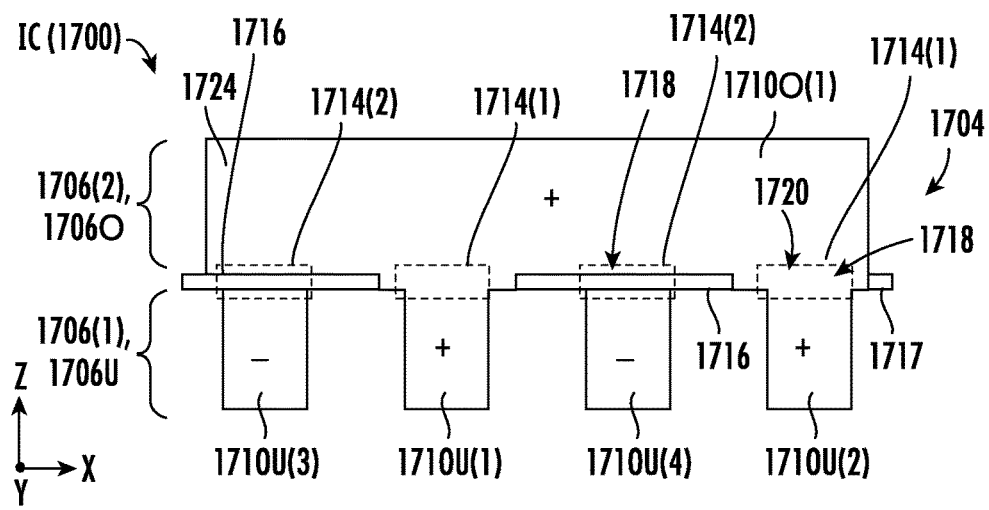
FIG. 17B is a cross-sectional side view of the IC in FIG. 17A.

FIG. 17A is a top view of another exemplary IC 1700 that includes a capacitor 1702. For example, the capacitor 1702 may be a MoM capacitor. FIG. 17B is a cross-sectional side view across the $A_5$-$A_5'$ cross-section line in FIG. 17A. As discussed in more detail below, the capacitor 1702 formed in an interconnect structure 1704 that includes directly coupled metal lines in adjacent interconnect layers 1706(1), 1706(2). For example, the interconnect structure 1704 may be a BEOL interconnect structure, such as like the BEOL interconnect structure 304 in the IC 300 in FIG. 3. There is no via layer in between the adjacent interconnect layers 1706(1), 1706(2). As shown in FIGS. 17A and 17B, the first interconnect layer 1706(1) is an underlying interconnect layer 1706U that is disposed underneath the second interconnect layer 1706(2) as an overlying interconnect layer 1706O in the Z-axis direction. The underlying interconnect layer 1706U includes a first underlying metal finger structure 1708U(1) that includes a first and second underlying metal lines 1710U(1), 1710U(2) extending in the horizontal Y-axis direction in parallel to each other. The underlying interconnect layer 1706U also includes a second underlying metal finger structure 1708U(2) that includes a third and fourth underlying metal lines 1710U(3), 1710U(4) extending in the horizontal Y-axis direction in parallel to each other.

With continuing reference to FIG. 17A, the first underlying metal finger structure 1708U(1) is interdigitated with the second underlying metal finger structure 1708U(2). In this regard, the first and second underlying metal lines 1710U(1), 1710U(2) and the first underlying metal finger structure 1708U(2) are interdigitated with the respective third and fourth underlying metal lines 1710U(3), 1710U(4) of the second underlying metal finger structure 1708U(2). The first underlying metal line 1710U(1) is disposed adjacent to and between the third and fourth underlying metal lines 1710U(3), 1710U(4). The second underlying metal line 1710U(2) is disposed adjacent to the fourth underlying metal line 1710U(4). The fourth underlying metal line 1710U(4) is disposed adjacent to and between the first and second underlying metal lines 1710U(1), 1710U(2).

Also, as shown in FIG. 17A, the overlying interconnect layer 1706O includes a first overlying metal finger structure 1708O(1) that includes a first and second overlying metal lines 1710O(1), 1710O(2) extending in the horizontal X-axis direction in parallel to each other. The overlying interconnect layer 1706O also includes a second overlying metal finger structure 1708O(2) that includes a third and fourth overlying metal lines 1710O(3), 1710O(4) extending in the horizontal X-axis direction in parallel to each other. The first overlying metal finger structure 1708O(1) is interdigitated with the second overlying metal finger structure 1708O(2). In this regard, the first and second overlying metal lines 1710O(1), 1710O(2) of the first overlying metal finger structure 1708O(1) are interdigitated with the respective third and fourth overlying metal lines 1710O(3), 1710O(4) of the second overlying metal finger structure 1708O(2). The fourth overlying metal line 1710O(4) is disposed adjacent to and between the first and second overlying metal lines 1710U(1), 1710O(2). The third overlying metal line 1710O(3) is disposed adjacent to the first underlying metal line 1710U(1). The first overlying metal line 1710O(1) is disposed adjacent to and between the third and fourth overlying metal lines 1710O(3), 1710O(4). As an example, the first underlying metal finger structure 1708U(1) and the first overlying metal structure 1708O(1) may be of the same polarity (+), and the second underlying metal finger structure 1708U(2) and the second overlying metal structure 1708O (2) may be of the second, different polarity (−).

With continued reference to FIG. 17A, the first overlying metal finger structure 1708O(1) intersects the first underlying metal finger structure 1708U(1) in the horizontal X- and Y-axis directions in first connection region 1714(1). The first overlying metal finger structure 1708O(1) is coupled to the first underlying metal finger structure 1708U(1) in the first connection region 1714(1) without an intermediate via layer. In this example, the first and second overlying metal lines 1710O(1), 1710O(2) intersect and are directly coupled to the first and second underlying metal lines 1710U(1), 1710U(2) in the horizontal X- and Y-axis directions. The second overlying metal finger structure 1708O(2) intersects the second underlying metal finger structure 1708U(2) in the horizontal X- and Y-axis directions in section connection region 1714(2). The second overlying metal finger structure 1708O(2) is directly coupled to the second underlying metal finger structure 1708U(2) in the second connection region 1714(2) without an intermediate via layer. In this example, the third and fourth overlying metal lines 1710O(3), 1710O (4) intersect and are directly coupled to the third and fourth underlying metal lines 1710U(3), 1710U(4) in the horizontal X- and Y-axis directions.

As shown in FIG. 17B, the capacitor 1702 includes an insulating layer 1716 that is disposed between the overlying interconnect layer 1706O and the underlying interconnect layer 1706U on the underlying interconnect layer 1706U to insulate the first overlying metal line 1710O(1) from the first and second underlying metal lines 1710U(1), 1710U(2). The insulating layer 1716 is formed from a dielectric material. In this example, insulating layer 1716 is patterned and removed (e.g., etched away) in the first connection region 1714(1) between the first overlying metal line 1710O(1) and the first and second underlying metal lines 1710U(1), 1710U(2). Similar to the IC 500 in FIGS. 5A and 5B, this in effect creates recesses 1718 in the first overlying metal line 1710O (1) outside of the first connection region 1714(1). As shown in FIG. 17B for the first overlying metal line 1710O(1), openings 1720 (could also be referred to as a "trenches") created in the insulating layer 1716 that extends to the first underlying metal lines 1710U(1), 1710U(2), as a result of patterning and removing the portion of the insulating layer 1716 in the first connection region 1714(1) are filled with metal material 1724 that forms the first overlying metal line 1710O(1) in the overlying interconnect layer 1706O. In this manner, the metal material 1724 of the first overlying metal line 1710O(1) is disposed in contact with the first and second underlying metal lines 1710U(1), 1710U(2), while the remaining portions of the insulating layer 1716 are left to insulate and isolate the first overlying metal line 1710O(1) from the third and fourth underlying metal lines 1710U(3), 171U(4) in the second connection region 1714(2). By providing the first recess 1718 in the first overlying metal line 1710O(1) in the first connection region 1714(1), an extra layer of insulating material is not required to be between the entire interface between the overlying and underlying interconnect layers 1706O, 1706U that would contribute to additional height in the interconnect structure 1704.

Note that instead of the recesses being formed in the first connection region 1714(1), the recesses could be formed in the second connection region 1714(2), similar to the IC 300 in FIGS. 4A and 4B. In this manner, those recesses could contain the insulating layer 1716 that remained resident from patterning and etching to insulate and isolate the third and fourth underlying metal lines 1710U(3), 1710U(4) in the second connection region 1714(2) from the first overlying metal line 1710O(1). A thin barrier metal layer, as described above, can also be disposed between overlying metal lines 1710O coupled to underlying metal lines 1710U.

FIG. 18A is a top view of another exemplary IC 1700 that includes a capacitor 1802. For example, the capacitor 1802 may be a MoM capacitor. FIG. 17B is a cross-sectional side view across the $A_6$-$A_6'$ cross-section line in FIG. 18A. As discussed in more detail below, the capacitor 1802 formed in an interconnect structure 1804 that includes directly coupled metal lines in adjacent interconnect layers 1806(1), 1806(2). For example, the interconnect structure 1804 may be a BEOL interconnect structure, such as like the BEOL interconnect structure 304 in the IC 300 in FIG. 3. There is no via layer in between the adjacent first and second interconnect layers 1806(1), 1806(2). As shown in FIGS. 18A and 18B, the first interconnect layer 1806(1) is an underlying interconnect layer 1806U that is disposed underneath the second interconnect layer 1806(2) as an overlying interconnect layer 1806O in the Z-axis direction. The underlying interconnect layer 1806U includes a first underlying metal finger structure 1808U(1) that includes first and second underlying metal lines 1810U(1), 1810U(2) extending in the horizontal Y-axis direction in parallel to each other. The first and second underlying metal lines 1810U(1), 1810U(2) are coupled to each other by a first underlying metal line 1812U(1) extending in the horizontal X-axis direction. The underlying interconnect layer 1806U also includes a second underlying metal finger structure 1808U(2) that includes a third and fourth underlying metal lines 1810U(3), 1810U(4) extending in the horizontal Y-axis direction in parallel to each other. The third and fourth underlying metal lines 1810U(3), 1810U(4) are coupled to each other by a second underlying metal line 1812U(1) extending in the horizontal X-axis direction.

With continuing reference to FIG. 18A, the first underlying metal finger structure 1808U(1) is interdigitated with the second underlying metal finger structure 1808U(2). In this regard, the first and second underlying metal lines 1810U(1), 1810U(2) the first underlying metal finger structure 1808U (2) are interdigitated with the respective third and fourth underlying metal lines 1810U(3), 1810U(4) of the second underlying metal finger structure 1808U(2). The first underlying metal line 1810U(1) is disposed adjacent to and between the third and fourth underlying metal lines 1810U (3), 1810U(4). The second underlying metal line 1810U(2) is disposed adjacent to the fourth underlying metal line 1810U(4). The fourth underlying metal line 1810U(4) is disposed adjacent to and between the first and second underlying metal lines 1810U(1), 1810U(2).

Also, as shown in FIG. 18A, the overlying interconnect layer 1806O includes a first overlying metal finger structure 1808O(1) that includes first and second overlying metal lines 1810O(1), 1810O(2) extending in the horizontal X-axis direction in parallel to each other. The first and second overlying metal lines 1810U(1), 1810U(2) are coupled to each other by a first overlying metal line 1812O(1) extending in the horizontal X-axis direction. The overlying interconnect layer 1806O also includes a second overlying metal finger structure 1808O(2) that includes a third and fourth overlying metal lines 1810O(3), 1810O(4) extending in the horizontal X-axis direction in parallel to each other. The third and fourth overlying metal lines 1810O(3), 1810O(4)

are coupled to each other by a second overlying metal line 1812O(2) extending in the horizontal X-axis direction. The first overlying metal finger structure 1808O(1) is interdigitated with the second overlying metal finger structure 1808O (2). In this regard, the first and second overlying metal lines 1810O(1), 1810O(2) of the first overlying metal finger structure 1808O(1) are interdigitated with the respective third and fourth overlying metal lines 1810O(3), 1810O(4) of the second overlying metal finger structure 1808O(2). The third overlying metal line 1810O(3) is disposed adjacent to and between the first and second overlying metal lines 1810U(1), 1810O(2). The fourth overlying metal line 1810O (4) is disposed adjacent to the second underlying metal line 1810U(2). The third overlying metal line 1810O(1) is disposed adjacent to and between the first and second overlying metal lines 1810O(1), 1810O(2). As an example, the first underlying metal finger structure 1808U(1) and the first overlying metal finger structure 1808O(1) may be of the same polarity (+), and the second underlying metal finger structure 1808U(2) and the second overlying metal structure 1808O(2) may be of the second, different polarity (−).

With continued reference to FIG. 18A, the first overlying metal finger structure 1808O(1) intersects the first underlying metal finger structure 1808U(1) in the horizontal X- and Y-axis directions. The first overlying metal finger structure 1808O(1), and first underlying metal finger structure 1808U (1) are coupled to each other in a first connection region 1814(1) without an intermediate via layer. In this example, the first overlying metal line 1812O(1) intersects and is directly coupled to the first underlying metal lines 1812U(1) in the horizontal X- and Y-axis directions. The second overlying metal finger structure 1808O(2) intersects the second underlying metal finger structure 1808U(2) in the horizontal X- and Y-axis directions. The second overlying metal finger structure 1808O(2) is directly coupled to the second underlying metal finger structure 1808U(2) in a second connection region 1814(2) without an intermediate via layer. In this example, the second overlying metal line 1810O(2) intersects and is directly coupled to the second underlying metal line 1810U(2) in the horizontal X- and Y-axis directions.

As shown in FIG. 18B, the capacitor 1802 includes an insulating layer 1816 that is disposed between the overlying interconnect layer 1806O and the underlying interconnect layer 1806U on the underlying interconnect layer 1806U, to insulate and isolate the first and second overlying metal lines 1810O(1), 1810O(2) from the third and fourth underlying metal lines 1810U(3), 1810U(3). The insulating layer 1816 also insulates and isolates the third and fourth overlying metal lines 1810O(3), 1810O(4) from the first and second underlying metal lines 1810U(1), 1810U(2). The insulating layer 1816 is formed from a dielectric material. In this example, insulating layer 1816 can be patterned to provide recesses in the first and/or second connection regions 1814 (1), 1814(2) like the examples of the ICs 300, 500 in FIGS. 3-4B and 5A-5B, respectively. A thin barrier metal layer, as described above, can also be disposed between overlying metal lines 1810O coupled to underlying metal lines 1810U.

Other structures in addition to metal lines that carry signals, such as power signals, can be formed in an interconnect structure of an IC that include directly coupled metal lines in adjacent interconnect layers without an intermediate via layer. For example, an inductor can be formed in an interconnect structure, such as a BEOL interconnect structure for example, with directly coupled coil-shaped metal lines in adjacent interconnect layers (e.g., metallization layers) without an intermediate via layer. The formation of an inductor out of directly coupled metal lines in adjacent interconnect layers without an intermediate via layer may be advantageous to reduce size (e.g., in the vertical direction) in an interconnect structure where inductors are formed. Also, as discussed above, directly coupled metal lines in adjacent interconnect layers can reduce contact resistance between the coupled metal lines.

In this regard, FIG. 19A is a top view of an exemplary IC 1900 that includes an inductor 1902. FIG. 19B is a cross-sectional side view across the $A_7$-$A_7'$ cross-section line in FIG. 19A. As discussed in more detail below, the inductor 1902 is formed in an interconnect structure 1904 that includes an overlying metal coil structure of metal line segments in a coil-shaped pattern directly coupled to an underlying metal coil structure of metal line segments in a coil-shaped pattern in adjacent interconnect layers 1906(1), 1906(2). For example, the interconnect structure 1904 may be a BEOL interconnect structure, such as like the BEOL interconnect structure 304 in the IC 300 in FIG. 3. There is no via layer in between the adjacent interconnect layers 1906(1), 1906(2).

As shown in FIGS. 19A and 19B, the first interconnect layer 1906(1) is an underlying interconnect layer 1906U that is disposed underneath the second interconnect layer 1906 (2) as an overlying interconnect layer 1906O in the Z-axis direction. The underlying interconnect layer 1906U includes a first underlying metal coil structure 1908U that includes a plurality of underlying metal line segments 1910U(1)-1910U(8) coupled to each other in an end-to-end configuration. The overlying interconnect layer 1906O includes a first overlying metal coil structure 1908O(2) includes a plurality of overlying metal line segments 1910O(1)-1910O (8) coupled to each other in an end-to-end configuration. Each respective overlying metal line segment 1910O(1)-1910O(8) in the overlying metal coil structure 1908O in the overlying interconnect layer 1906O is disposed above in the vertical direction (Z-axis direction) and directly coupled to each respective overlying metal line segment 1910U(1)-1910U(8) in the underlying metal coil structure 1908U in the underlying interconnect layer 1906U. This is also shown in the cross-section of the inductor 1902 in FIG. 19B, wherein the overlying metal line segments 1910O(2), 1910O(6) are disposed and directly coupled to respective underlying metal line segments 1910U(2), 1910U(6).

With continuing reference to FIG. 19A, the underlying metal line segments 1910U(1)-1910U(8) of the underlying metal coil structure 1908U are coupled to each other to form a coil-shaped pattern. The underlying metal line segment 1910U(1) includes a first end portion 1912(1) of the underlying metal coil structure 1908U. The underlying metal line segment 1910U(8) includes a second end portion 1912(2) of the underlying metal coil structure 1908U. The overlying metal line segment 1910U(8) includes a first end portion 1912(1) of the underlying metal coil structure 1908U. The underlying metal line segment 1910U(8) includes a second end portion 1912(2) of the underlying metal coil structure 1908U. The overlying metal line segment 1910O(1) includes a third end portion 1912(3) of the overlying metal coil structure 1908O. The overlying metal line segment 1910O(8) includes a fourth end portion 1912(4) of the overlying metal coil structure 1908O. The overlying metal coil structure 1908O, between its third and fourth end portions 1912(3), 1912(4), intersects the underlying metal coil structure 1908U between first and second end portions 1912(1), 1912(2) in a vertical direction (Z-axis direction).

As shown in FIGS. 19A and 19B, the third end portion 1912(3) of the overlying metal coil structure 1908O is coupled to the second end portion 1912(2) of the underlying metal coil structure 1908U in a first connection region 1916(1). As shown in FIG. 19B, an insulating layer 1914 is disposed between the overlying metal coil structure 1908O and the underlying metal coil structure 1908U in a first connection region 1916(1) to prevent unintended shorting of the overlying metal coil structure 1908O and the underlying metal coil structure 1908U in places outside of where the overlying metal coil structure 1908O and the underlying metal coil structure 1908U intersect the first and second connection regions 1916(1), 1916(2). The insulating layer 1914 is formed from a dielectric material. In this example, insulating layer 1914 is patterned and removed (e.g., etched away) in the first and second connection regions 1916(1), 1916(2) between the overlying metal coil structure 1908O and the underlying metal coil structure 1908U. Similar to the IC 500 in FIGS. 5A and 5B, this in effect creates recesses in the overlying metal coil structure 1908O outside of the first connection region 1916(1). In this manner, a metal material 1924 of the overlying metal coil structure 1908O is disposed in contact with the underlying metal coil structure 1908U in the first and second connection regions 1916(1), 1916(2), while the remaining portions of the insulating layer 1914 are left to insulate and isolate the overlying metal coil structure 1908O and the underlying metal coil structure 1908U. Note that instead of the recesses being formed in the first connection region 1916(1), the recesses could be formed in the second connection region 1916(2), similar to the IC 300 in FIGS. 4A and 4B. In this manner, those recesses could contain the insulating layer 1914 that remained resident from patterning and etching to insulate and isolate the overlying metal coil structure 1908O and the underlying metal coil structure 1908U.

Figure 20A:
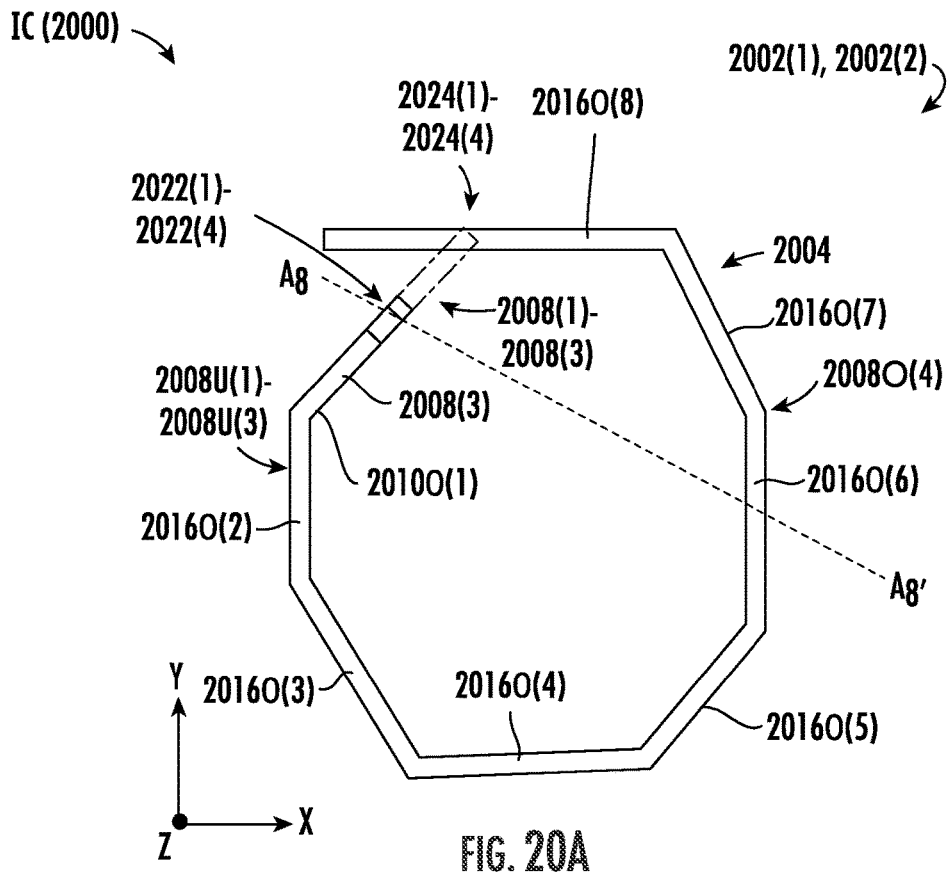
FIG. 20A is a top view of another exemplary IC that includes an inductor formed in an interconnect structure that includes an underlying interconnect layer that includes an underlying metal coil structure and multiple overlying interconnect layers that include respective overlying metal coil structure without intermediate via layer disposed between the interconnect layers, and wherein the overlying metal coil structure is coupled to the underlying metal coil structures to form a multiple interconnect layer inductor.
Figure 20B:
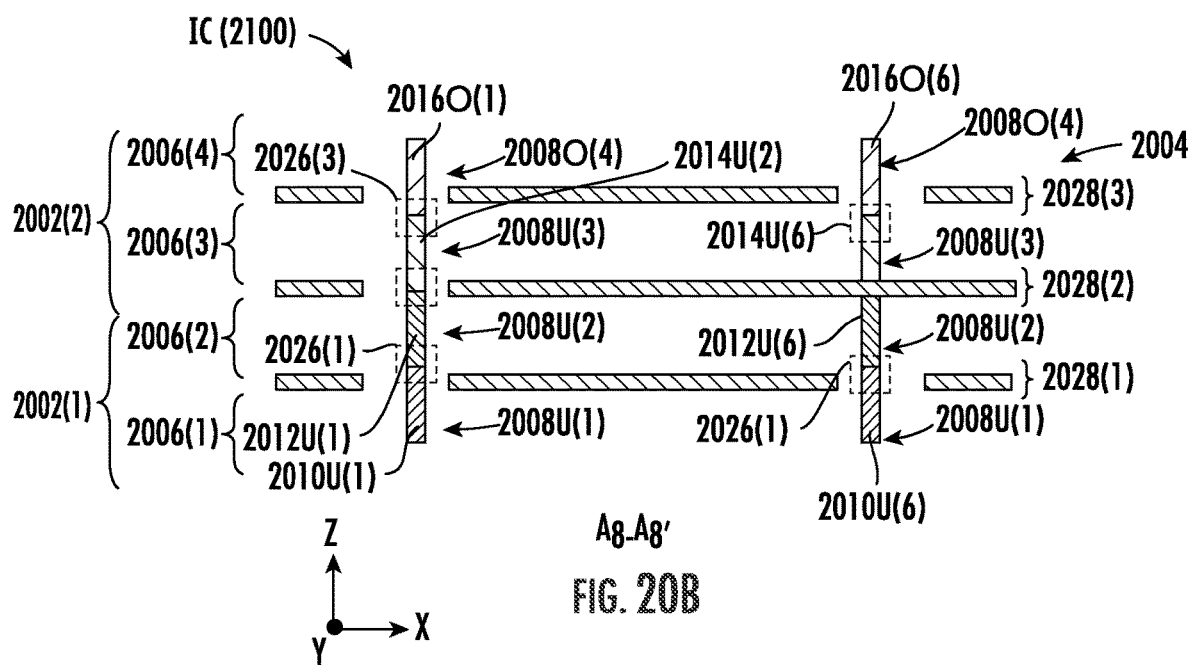
FIG. 20B is a cross-sectional side view of the IC in FIG. 20B.

FIG. 20A is a top view of another exemplary IC 2000 that includes two (2) inductors 2002(1), 2002(2). FIG. 20B is a cross-sectional side view across the $A_8$-$A_8'$ cross-section line in FIG. 20A. As discussed in more detail below, the inductors 2002(1), 2002(2) are formed in an interconnect structure 2004 that includes multiple overlying metal coil structures of metal line segments in a coil-shaped pattern coupled to an underlying metal coil structure of metal line segments in a coil-shaped pattern in adjacent interconnect layers 1906(1)-1906(4). For example, the interconnect structure 2004 may be a BEOL interconnect structure, such as like the BEOL interconnect structure 304 in the IC 300 in FIG. 3. There is no via layer in between the adjacent interconnect layers 2006(1)-2006(4) in this example. As shown in FIGS. 20A and 20B, the first interconnect layer 2006(1) is an underlying interconnect layer that is disposed underneath the second interconnect layer 2006(2) as an overlying interconnect layer in the Z-axis direction. The second interconnect layer 2006(2) as an underlying interconnect layer is disposed underneath the third interconnect layer 2006(3) as an overlying interconnect layer in the Z-axis direction. The third interconnect layer 2006(3) as an underlying interconnect layer is disposed underneath the fourth interconnect layer 2006(4) as an overlying interconnect layer in the Z-axis direction.

The underlying interconnect layer 2006(1) includes a first underlying metal coil structure 2008U(1) that includes a plurality of underlying metal line segments 2010U(1)-2010U(8) coupled to each other in an end-to-end configuration. The overlying interconnect layer 2006(2) includes a second underlying metal coil structure 2008U(2) that includes a plurality of underlying metal line segments 2012U(1)-2012U(8) coupled to each other in an end-to-end configuration. The overlying interconnect layer 2006(3) includes a third underlying metal coil structure 2008U(3) that includes a plurality of underlying metal line segments 2014U(1)-2014U(8) coupled to each other in an end-to-end configuration. The overlying interconnect layer 2006O(4) includes an overlying metal coil structure 2008O(4) that includes a plurality of underlying metal line segments 2016U(1)-2016U(8) coupled to each other in an end-to-end configuration. Each respective overlying metal line segment 2016O(1)-2016O(8) in the overlying metal coil structure 2008O(4) in the overlying interconnect layer 2006O(4) is disposed above in the vertical direction (Z-axis direction) to each respective underlying metal line segment 2014U(1)-2014U(8) in the underlying metal coil structure 2008U(3) in the underlying interconnect layer 1906U(3) to form the second inductor 2002(2). Each respective overlying metal line segment 2012O(1)-2012O(8) in the overlying metal coil structure 2008U(2) is disposed above in the vertical direction (Z-axis direction) to each respective underlying metal line segment 2010U(1)-2010U(8) in the underlying metal coil structure 2008U(1) to form the first inductor 2002(1). This is also shown in the cross-section of the inductors 2002(1), 2002(2) in FIG. 20B.

With continuing reference to FIG. 20A, the underlying metal line segments 2010U(1)-2010U(8) of the underlying metal coil structure 2008U(1) are coupled to each other to form a coil-shaped pattern. The underlying metal line segment 2010U(1) includes a first end portion 2022(1) of the underlying metal coil structure 2008U(1). The underlying metal line segment 2010U(8) includes a second end portion 2024(1) of the underlying metal coil structure 2008U(1). The underlying metal line segment 2012U(1) includes a first end portion 2022(2) of the underlying metal coil structure 2008(2). The underlying metal line segment 2012U(8) includes a second end portion 2024(2) of the underlying metal coil structure 2008U(2). The underlying metal line segment 2014U(1) includes a first end portion 2022(3) of the underlying metal coil structure 2008(3). The underlying metal line segment 2014U(8) includes a second end portion 2024(3) of the underlying metal coil structure 2008(3). The overlying metal line segment 2016O(1) includes a first end portion 2022(4) of the underlying metal coil structure 2008(4). The overlying metal line segment 2016O(8) includes a second end portion 2024(4) of the underlying metal coil structure 2008U(4).

As shown in FIG. 20B, the overlying metal coil structure 2008O(4) intersects the underlying metal coil structure 2008U(3) in a vertical direction (Z-axis direction) at the connection region 2026(3). The overlying metal coil structure 2008O(4) is coupled to the underlying metal coil structure 2008U(3) at the connection region 2026(3). The underlying metal coil structure 2008O(2) intersects the underlying metal coil structure 2008U(1) in a vertical direction (Z-axis direction) at connection region 2026(1). The underlying metal coil structure 2008O(2) is coupled to the underlying metal coil structure 2008U(1) at the connection region 2026(1). Insulating layers 2028(1)-2028(3) are disposed between the respective metal coil structures 2008(1)-2008(4) to prevent unintended shorting of the metal coil structures 2008(1)-2008(4) that form the separate inductors 2002(2), 2002(1). The insulating layers 2028(1)-2028(3) are formed from a dielectric material. In this example, insulating layers 2028(1)-2028(3) are patterned and removed (e.g., etched away) in the connection regions 2026(1), 2026(3). Similar to the IC 500 in FIGS. 5A and 5B, this in effect creates recesses in the metal coil structures 2008(1)-2008(4) outside of the connection regions 2026(1), 2026(3). In this manner, a metal material of the respective metal coil structures 2008O(4), 2008U(2) is disposed in contact with a respective underlying metal coil structures 2008U(3), 2008U(1), while the remaining portions of the insulating layer 2028(1)-2028(3) are left to insulate and isolate the metal coil structures 2008(1)-2008(4). Note that insulating layer 2028(2) is not removed between the metal line segment 2014U(6) and metal line segment 2012U(6) to provide a discontinuity between metal coil structures 2008(2), 2008(3) to form the two (2) separate inductors 2002(1), 2002(2). Note that instead of the recesses being formed in the connection regions 2026(1), 2026(3), the recesses could be formed outside the connection regions 2026(1), 2026(3), similar to the IC 300 in FIGS. 4A and 4B.

Note that the terms "overlying" and "underlying" where used herein are relative terms and are not meant to limit or imply a strict orientation that a "top" referenced element must always be oriented to be above a "bottom" referenced element with respect to ground, and vice versa. "Underlying" means something disposed below something that is "overlying" in an example, but if the orientation is reversed, something that is "underlying" can be disposed above something that is "overlying." Also note that the terms "top" and "bottom" where used herein are relative terms and are not meant to limit or imply a strict orientation that an element referenced as being "above" another referenced element must always be oriented to be above the other referenced element with respect to ground, or that an element referenced as being "below" another referenced element must always be oriented to be below the other referenced element with respect to ground.

ICs that can each include a one or more interconnect structures that include vertically-adjacent underlying and overlying interconnect layers without an intermediate via layer, wherein the vertically-adjacent underlying and overlying interconnect layers include respective underlying and overlying metal lines that are coupled to each other, including, but not limited to, the exemplary ICs in FIGS. 3-5B, 8A-12B, 15-20B, and according to the exemplary fabrication processes in FIGS. 6-7B-2 and 14A-14E, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 21:
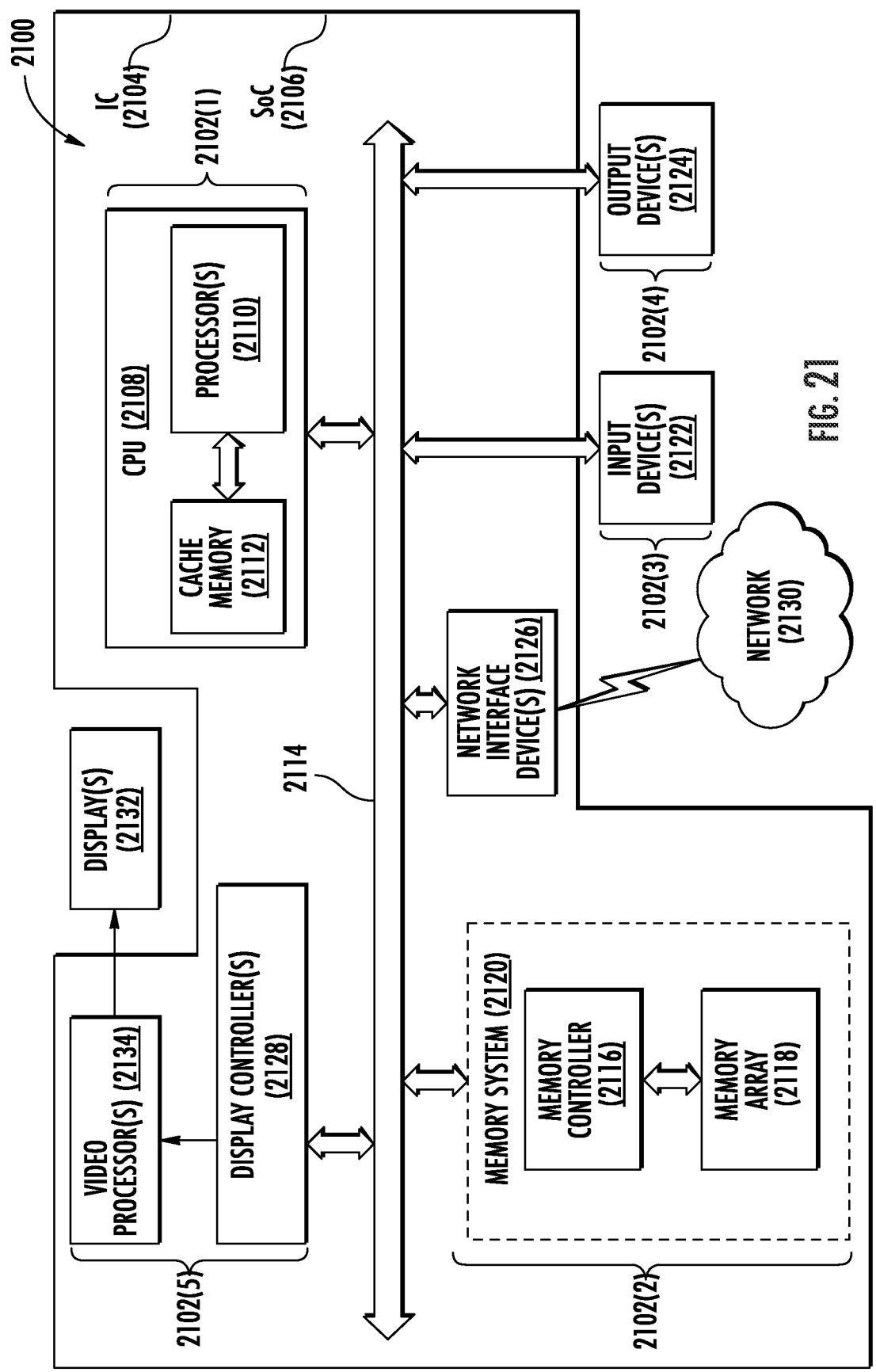
FIG. 21 is a block diagram of an exemplary processor-based system that can be provided in one or more ICs that can each include one or more interconnect structures that include vertically-adjacent underlying and overlying interconnect layers without an intermediate via layer, wherein the vertically-adjacent underlying and overlying interconnect layers include respective underlying and overlying metal lines that are coupled to each other, including, but not limited to, the exemplary ICs in FIGS. 3-5B, 8A-12B, and 15-20B, and according to the exemplary fabrication processes in FIGS. 6-7B-2 and 14A-14E.

In this regard, FIG. 21 illustrates an example of a processor-based system 1400 including a circuit that can be provided in one or more IC 2102(1)-2102(5) each ICs each including one or more interconnect structures that include a vertically-adjacent underlying and overlying interconnect layers without an intermediate via layer, wherein the vertically-adjacent underlying and overlying interconnect layers include respective underlying and overlying metal lines that are coupled to each other, including, but not limited to, the exemplary ICs in FIGS. 3-5B, 8A-12B, 15-20B, and according to the exemplary fabrication processes in FIGS. 6-7B-2 and 14A-14E. In this example, the processor-based system 2100 may be formed as an IC 2104 in an IC package 2102 as a system-on-a-chip (SoC) 2106. The processor-based system 2100 includes a central processing unit (CPU) 2108 that includes one or more processors 2110, which may also be referred to as CPU cores or processor cores. The CPU 2108 may have cache memory 2112 coupled to the CPU 2108 for rapid access to temporarily stored data. The CPU 2108 is coupled to a system bus 2114 and can intercouple master and slave devices included in the processor-based system 2100. As is well known, the CPU 2108 communicates with these other devices by exchanging address, control, and data information over the system bus 2114. For example, the CPU 2108 can communicate bus transaction requests to a memory controller 2116 as an example of a slave device. Although not illustrated in FIG. 21, multiple system buses 2114 could be provided, wherein each system bus 2114 constitutes a different fabric.

Other master and slave devices can be connected to the system bus 2114. As illustrated in FIG. 21, these devices can include a memory system 2120 that includes the memory controller 2116 and a memory array(s)2118, one or more input devices 2122, one or more output devices 2124, one or more network interface devices 2126, and one or more display controllers 2128, as examples. Each of the memory system 2120, the one or more input devices 2122, the one or more output devices 2124, the one or more network interface devices 2126, and the one or more display controllers 2128 can be provided in the same IC package 2102 or different IC packages 2102(3), 2102(4). The input device(s) 2122 can include any type of input device, including, but not limited to, input keys, switches, voice processors, etc. The output device(s) 2124 can include any type of output device, including, but not limited to, audio, video, other visual indicators, etc. The network interface device(s) 2126 can be any device configured to allow exchange of data to and from a network 2130. The network 2130 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 2126 can be configured to support any type of communications protocol desired.

The CPU 2108 may also be configured to access the display controller(s) 2128 over the system bus 2114 to control information sent to one or more displays 2132. The display controller(s) 2128 sends information to the display(s) 2132 to be displayed via one or more video processors 2134, which process the information to be displayed into a format suitable for the display(s) 2132. The display controller(s) 2128 and video processor(s) 2134 can be included as ICs in the same IC package 2102(5), and in the same or different IC package 2102, 2102(1) containing the CPU 2108 as an example. The display(s) 2132 can include any type of display, including, but not limited to, a cathode ray tube (CRT), a liquid crystal display (LCD), a plasma display, a light emitting diode (LED) display, etc.

Figure 22:
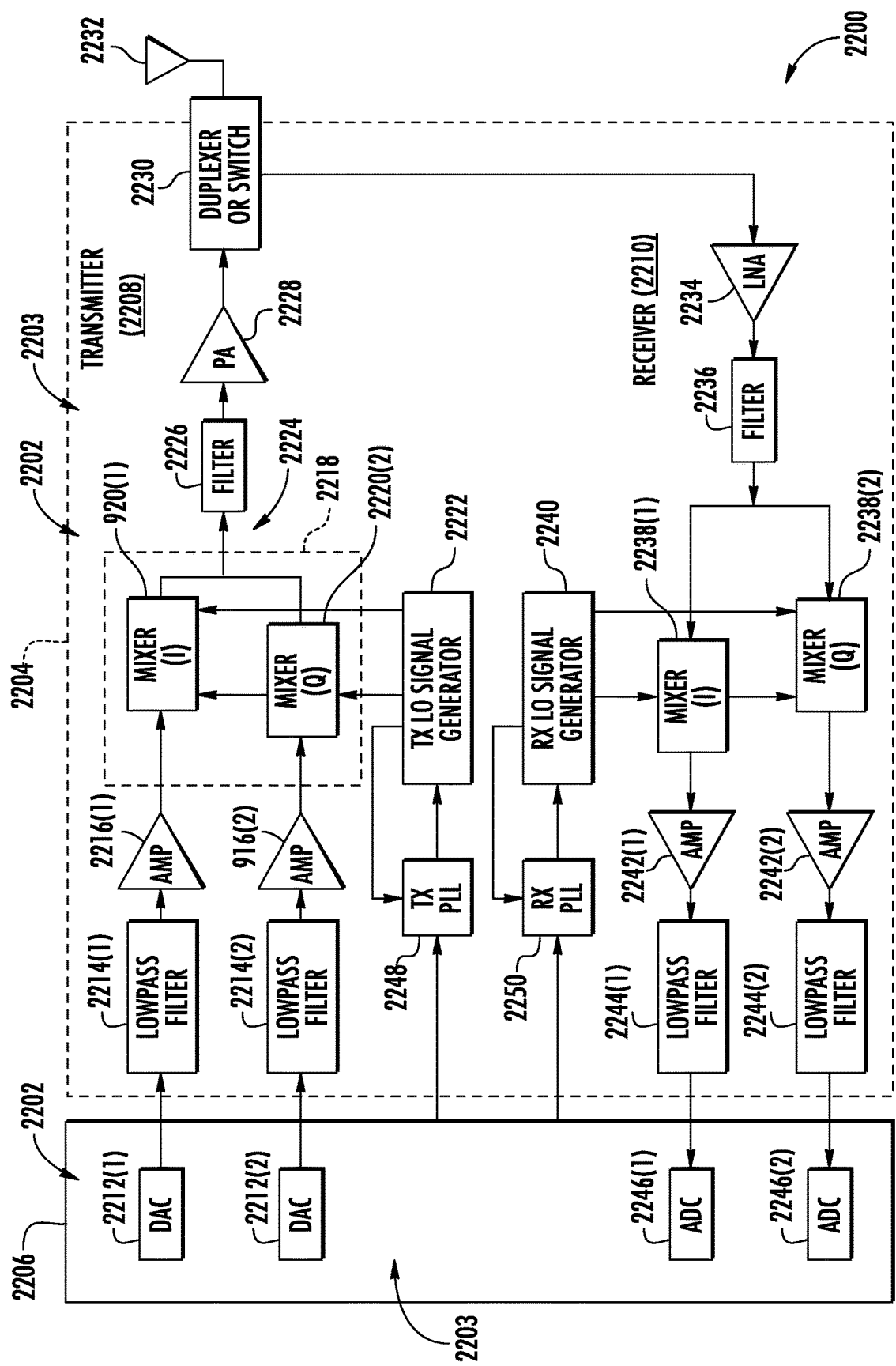
FIG. 22 is a block diagram of an exemplary wireless communications device that includes radio frequency (RF) components provided in one or more ICs that can each include one or more interconnect structures that include a vertically-adjacent underlying and overlying interconnect layers without an intermediate via layer, wherein the vertically-adjacent underlying and overlying interconnect layers include respective underlying and overlying metal lines that are coupled to each other, including, but not limited to, the exemplary ICs in FIGS. 3-5B, 8A-12B, and 15-20B, and according to the exemplary fabrication processes in FIGS. 6-7B-2 and 14A-14E.

FIG. 22 illustrates an exemplary wireless communications device 2200 that includes radio frequency (RF) components formed from one or more ICs 2202, wherein any of the ICs 2202 can include one or more interconnect structures that include a vertically-adjacent underlying and overlying interconnect layers without an intermediate via layer, wherein the vertically-adjacent underlying and overlying interconnect layers include respective underlying and overlying metal lines that are coupled to each other, including, but not limited to, the exemplary ICs in FIGS. 3-5B, 8A-12B,

15-20B, and according to the exemplary fabrication processes in FIGS. 6-7B-2 and 14A-14E. The wireless communications device 2200 may include or be provided in any of the above-referenced devices, as examples. As shown in FIG. 22, the wireless communications device 2200 includes a transceiver 2204 and a data processor 2206. The data processor 2206 may include a memory to store data and program codes. The transceiver 2204 includes a transmitter 2208 and a receiver 2210 that support bi-directional communications. In general, the wireless communications device 2200 may include any number of transmitters 2208 and/or receivers 2210 for any number of communication systems and frequency bands. All or a portion of the transceiver 2204 may be implemented on one or more analog ICs, RF ICs(RFICs), mixed-signal ICs, etc.

The transmitter 2208 or the receiver 2210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 2210. In the direct-conversion architecture, a signal is frequency-converted between RF and baseband in one stage. The super-heterodyne and direct-conversion architectures may use different circuit blocks and/or have different requirements. In the wireless communications device 2200 in FIG. 22, the transmitter 2208 and the receiver 2210 are implemented with the direct-conversion architecture.

In the transmit path, the data processor 2206 processes data to be transmitted and provides I and Q analog output signals to the transmitter 2208. In the exemplary wireless communications device 2200, the data processor 2206 includes digital-to-analog converters (DACs) 2212(1), 2212(2) for converting digital signals generated by the data processor 2206 into the I and Q analog output signals, e.g., I and Q output currents, for further processing.

Within the transmitter 2208, lowpass filters 2214(1), 2214(2) filter the I and Q analog output signals, respectively, to remove undesired signals caused by the prior digital-to-analog conversion. Amplifiers (AMPs) 2216(1), 2216(2) amplify the signals from the lowpass filters 2214(1), 2214(2), respectively, and provide I and Q baseband signals. An upconverter 2218 upconverts the I and Q baseband signals with I and Q transmit (TX) local oscillator (LO) signals through mixers 2220(1), 2220(2) from a TX LO signal generator 2222 to provide an upconverted signal 2224. A filter 2226 filters the upconverted signal 2224 to remove undesired signals caused by the frequency up-conversion as well as noise in a receive frequency band. A power amplifier (PA) 2228 amplifies the upconverted signal 2224 from the filter 2226 to obtain the desired output power level and provides a transmit RF signal. The transmit RF signal is routed through a duplexer or switch 2230 and transmitted via an antenna 2232.

In the receive path, the antenna 2232 receives signals transmitted by base stations and provides a received RF signal, which is routed through the duplexer or switch 2230 and provided to a low noise amplifier (LNA) 2234. The duplexer or switch 2230 is designed to operate with a specific receive (RX)-to-TX duplexer frequency separation, such that RX signals are isolated from TX signals. The received RF signal is amplified by the LNA 2234 and filtered by a filter 2236 to obtain a desired RF input signal. Down-conversion mixers 2238(1), 2238(2) mix the output of the filter 2236 with I and Q RX LO signals (i.e., LO_I and LO_Q) from an RX LO signal generator 2240 to generate I and Q baseband signals. The I and Q baseband signals are amplified by AMPs 2242(1), 2242(2) and further filtered by lowpass filters 2244(1), 2244(2) to obtain I and Q analog input signals, which are provided to the data processor 2206. In this example, the data processor 2206 includes analog-to-digital converters (ADCs) 2246(1), 2246(2) for converting the analog input signals into digital signals to be further processed by the data processor 2206.

In the wireless communications device 2200 of FIG. 22, the TX LO signal generator 2222 generates the I and Q TX LO signals used for frequency up-conversion, while the RX LO signal generator 2240 generates the I and Q RX LO signals used for frequency down-conversion. Each LO signal is a periodic signal with a particular fundamental frequency. A TX phase-locked loop (PLL) circuit 2248 receives timing information from the data processor 2206 and generates a control signal used to adjust the frequency and/or phase of the TX LO signals from the TX LO signal generator 2222. Similarly, an RX PLL circuit 2250 receives timing information from the data processor 2206 and generates a control signal used to adjust the frequency and/or phase of the RX LO signals from the RX LO signal generator 2240.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A capacitor, comprising:
    an interconnect structure, comprising:
        an underlying interconnect layer, comprising:
            a first underlying metal finger structure comprising a plurality of first underlying metal lines extending in parallel to each other, and
            a second underlying metal finger structure comprising a plurality of second underlying metal lines extending in parallel to each other;
            the first underlying metal finger structure interdigitated with the second underlying metal finger structure; and
        an overlying interconnect layer disposed adjacent to the underlying interconnect layer in a vertical direction, comprising:
            a first overlying metal finger structure comprising a plurality of first overlying metal lines extending in parallel to each other, and
            a second overlying metal finger structure comprising a plurality of second overlying metal lines extending in parallel to each other,
            the first overlying metal finger structure interdigitated with the second overlying metal finger structure,
            wherein the first overlying metal finger structure intersects the first underlying metal finger structure in the vertical direction in a first connection region;
            the first overlying metal finger structure coupled to the first underlying metal finger structure in the first connection region;
            the second overlying metal finger structure intersects the second underlying metal finger structure in the vertical direction in a second connection region; and
            the second overlying metal finger structure coupled to the second underlying metal finger structure in the second connection region.

2. The capacitor of clause 1, not comprising:
    a via layer disposed between the first overlying metal finger structure and the first underlying metal finger structure; and
    a via layer disposed between the second overlying metal finger structure and the second underlying metal finger structure.

3. The capacitor of any of clauses 1-2, further comprising:
    a first metal barrier layer disposed between the first overlying metal finger structure and the first underlying metal finger structure in the first connection region, the first metal barrier layer electrically coupling the first overlying metal finger structure to the first underlying metal finger structure in the first connection region; and
    a second metal barrier layer disposed between the second overlying metal finger structure and the second underlying metal finger structure in the second connection region, the second metal barrier layer electrically coupling the second overlying metal finger structure to the second underlying metal finger structure in the second connection region.

4. The capacitor of any of clauses 1-3, wherein:
    the first overlying metal finger structure intersects the second underlying metal finger structure in the vertical direction in a third connection region; and
    the second overlying metal finger structure intersects the first underlying metal finger structure in the vertical direction in a fourth connection region; and
    further comprising:
        a first insulating layer disposed between the first overlying metal finger structure and the second underlying metal finger structure in the third connection region; and
        a second insulating layer disposed between the second overlying metal finger structure and the first underlying metal finger structure in the fourth connection region.

5. The capacitor of clause 4, wherein:
    the first overlying metal finger structure comprises a first recess adjacent to the third connection region;
    the first insulating layer is disposed in the first recess of the first overlying metal finger structure to insulate the first overlying metal finger structure from the second underlying metal finger structure;
    the second overlying metal finger structure comprises a second recess adjacent to the fourth connection region; and
    the second insulating layer is disposed in the second recess of the second overlying metal finger structure to insulate the second overlying metal finger structure from the first underlying metal finger structure.

6. The capacitor of clause 4, wherein:
    the first overlying metal finger structure comprises a first recess outside of the first connection region;
    the first insulating layer is disposed in the first recess of the first overlying metal finger structure to insulate the first overlying metal finger structure from the second underlying metal finger structure;

the second overlying metal finger structure comprises a second recess outside of the second connection region; and the second insulating layer is disposed in the second recess of the second overlying metal finger structure to insulate the second overlying metal finger structure from the first underlying metal finger structure.

7. The capacitor of any of clauses 1-6, further comprising a back-end-of-line (BEOL) interconnect structure, comprising:

an underlying metallization layer comprising the underlying interconnect layer; and an overlying metallization layer comprising the overlying interconnect layer;

the overlying metallization layer disposed adjacent to the underlying metallization layer in the vertical direction.

8. The capacitor of any of clauses 1-7, wherein:

the plurality of first underlying metal lines are of a first polarity;

the plurality of second underlying metal lines are of a second polarity;

the plurality of first overlying metal lines are of the first polarity; and the plurality of second overlying metal lines are of the second polarity.

9. The capacitor of any of clauses 1-8, wherein:

the plurality of first underlying metal lines and the plurality of second underlying metal lines each extends in a first horizontal direction parallel to each other; and the plurality of first overlying metal lines and the plurality of second overlying metal lines each extends in a second horizontal direction parallel to each other, and orthogonal to the first horizontal direction.

10. The capacitor of any of clauses 1-3 and 7-8, wherein:

the plurality of first underlying metal lines and the plurality of second underlying metal lines each extends in a first horizontal direction parallel to each other, and the plurality of first overlying metal lines and the plurality of second overlying metal lines each extends in the first horizontal direction parallel to each other.

11. The capacitor of clause 10, wherein:

each of the plurality of first underlying metal lines is disposed directly underneath a respective second overlying metal line among the plurality of second overlying metal lines in the vertical direction; and each of the plurality of second underlying metal lines is disposed directly underneath a respective first overlying metal line among the plurality of first overlying metal lines in the vertical direction.

12. The capacitor of any of clauses 1-11 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server, a computer; a portable computer, a mobile computing device; a wearable computing device; a desktop computer; a personal digital assistant (PDA); a monitor, a computer monitor; a television; a tuner; a radio; a satellite radio; a music player; a digital music player; a portable music player, a digital video player; a video player; a digital video disc (DVD) player, a portable digital video player, an automobile; a vehicle component; an avionics system; a drone; and a multicopter.

13. An inductor, comprising:

an interconnect structure, comprising:

an underlying interconnect layer, comprising:

an underlying metal coil structure comprising a plurality of underlying metal segment lines coupled to each other in a coil-shaped pattern;

an overlying interconnect layer disposed adjacent to the underlying interconnect layer in a vertical direction, comprising:

an overlying metal coil structure comprising a plurality of overlying metal segment lines coupled to each other in a coil-shaped pattern, wherein the overlying metal coil structure intersects the underlying metal coil structure in the vertical direction in a first connection region; and an insulating layer disposed between the overlying metal coil structure and the underlying metal coil structure in a second connection region;

the overlying metal coil structure coupled to the underlying metal coil structure in the first connection region.

14. The inductor of clause 13, wherein the interconnect structure further comprises:

a second overlying interconnect layer disposed adjacent to the overlying interconnect layer in the vertical direction, comprising:

a second overlying metal coil structure comprising a plurality of second overlying metal segment lines coupled to each other in a coil-shaped pattern, wherein the second overlying metal coil structure intersects the overlying metal coil structure in the vertical direction in a third connection region; and a second insulating layer disposed between the second overlying metal coil structure and the overlying metal coil structure in a fourth connection region;

the second overlying metal coil structure coupled to the overlying metal coil structure in the third connection region.

15. The inductor of any of clauses 13-14, not comprising a via layer disposed between the overlying metal coil structure and the underlying metal coil structure.

16. The inductor of any of clauses 13-15, further comprising a metal barrier layer disposed between the overlying metal coil structure and the underlying metal coil structure in the first connection region, the metal barrier layer electrically coupling the overlying metal coil structure to the underlying metal coil structure.

17. The inductor of any of clauses 13-16, wherein:

the overlying metal coil structure comprises a first recess adjacent to the second connection region; and the insulating layer is disposed in the first recess of the overlying metal coil structure to insulate the overlying metal coil structure from the underlying metal coil structure.

18. The inductor of any of clauses 14-16, wherein:

the overlying metal coil structure comprises a first recess adjacent to the second connection region;

the insulating layer is disposed in the first recess of the overlying metal coil structure to insulate the overlying metal coil structure from the underlying metal coil structure;

the second overlying metal coil structure comprises a second recess adjacent to the fourth connection region; and the second insulating layer is disposed in the second recess of the second overlying metal coil structure to insulate the second overlying metal coil structure from the overlying metal coil structure.

19. The inductor of any of clauses 13-16, wherein:
   the overlying metal coil structure comprises a first recess outside of the first connection region; and
   the insulating layer is disposed in the first recess of the overlying metal coil structure to insulate the overlying metal coil structure from the underlying metal coil structure.
20. The inductor of any of clauses 14-16, wherein:
   the overlying metal coil structure comprises a first recess outside of the first connection region;
   the insulating layer is disposed in the first recess of the overlying metal coil structure to insulate the overlying metal coil structure from the underlying metal coil structure;
   the second overlying metal coil structure comprises a second recess outside of the third connection region; and
   the second insulating layer is disposed in the second recess of the second overlying metal coil structure to insulate the second overlying metal coil structure from the overlying metal coil structure.
21. The inductor of any of clauses 13-20, further comprising a back-end-of-line (BEOL) interconnect structure, comprising:
   an underlying metallization layer comprising the underlying interconnect layer; and
   an overlying metallization layer comprising the overlying interconnect layer,
   the overlying metallization layer disposed adjacent to the underlying metallization layer in the vertical direction.
22. The inductor of any of clauses 13-21 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer, a portable computer, a mobile computing device; a wearable computing device; a desktop computer; a personal digital assistant (PDA); a monitor, a computer monitor, a television; a tuner, a radio; a satellite radio; a music player; a digital music player, a portable music player, a digital video player; a video player; a digital video disc (DVD) player, a portable digital video player, an automobile; a vehicle component; an avionics system; a drone; and a multicopter.

What is claimed is:
1. A capacitor, comprising:
   an interconnect structure, comprising:
      an underlying interconnect layer, comprising:
         a first underlying metal finger structure comprising a plurality of first underlying metal lines extending in parallel to each other; and
         a second underlying metal finger structure comprising a plurality of second underlying metal lines extending in parallel to each other;
         the first underlying metal finger structure interdigitated with the second underlying metal finger structure; and
      an overlying interconnect layer disposed adjacent to the underlying interconnect layer in a vertical direction, comprising:
         a first overlying metal finger structure comprising a plurality of first overlying metal lines extending in parallel to each other; and
         a second overlying metal finger structure comprising a plurality of second overlying metal lines extending in parallel to each other;
         the first overlying metal finger structure interdigitated with the second overlying metal finger structure,
      wherein the first overlying metal finger structure intersects the first underlying metal finger structure in the vertical direction in a first connection region;
      the first overlying metal finger structure directly coupled to the first underlying metal finger structure in the first connection region;
      the second overlying metal finger structure intersects the second underlying metal finger structure in the vertical direction in a second connection region; and
      the second overlying metal finger structure directly coupled to the second underlying metal finger structure in the second connection region.
2. The capacitor of claim 1, not comprising:
   a via layer disposed between the first overlying metal finger structure and the first underlying metal finger structure; and
   a via layer disposed between the second overlying metal finger structure and the second underlying metal finger structure.
3. The capacitor of claim 1, further comprising:
   a first metal barrier layer disposed between the first overlying metal finger structure and the first underlying metal finger structure in the first connection region, the first metal barrier layer electrically coupling the first overlying metal finger structure to the first underlying metal finger structure in the first connection region; and
   a second metal barrier layer disposed between the second overlying metal finger structure and the second underlying metal finger structure in the second connection region, the second metal barrier layer electrically coupling the second overlying metal finger structure to the second underlying metal finger structure in the second connection region.
4. The capacitor of claim 1, wherein:
   the first overlying metal finger structure intersects the second underlying metal finger structure in the vertical direction in a third connection region; and
   the second overlying metal finger structure intersects the first underlying metal finger structure in the vertical direction in a fourth connection region; and
   further comprising:
      a first insulating layer disposed between the first overlying metal finger structure and the second underlying metal finger structure in the third connection region; and
      a second insulating layer disposed between the second overlying metal finger structure and the first underlying metal finger structure in the fourth connection region.
5. The capacitor of claim 4, wherein:
   the first overlying metal finger structure comprises a first recess adjacent to the third connection region;
   the first insulating layer is disposed in the first recess of the first overlying metal finger structure to insulate the first overlying metal finger structure from the second underlying metal finger structure;
   the second overlying metal finger structure comprises a second recess adjacent to the fourth connection region; and
   the second insulating layer is disposed in the second recess of the second overlying metal finger structure to insulate the second overlying metal finger structure from the first underlying metal finger structure.

6. The capacitor of claim 4, wherein:
the first overlying metal finger structure comprises a first recess outside of the first connection region;
the first insulating layer is disposed in the first recess of the first overlying metal finger structure to insulate the first overlying metal finger structure from the second underlying metal finger structure;
the second overlying metal finger structure comprises a second recess outside of the second connection region; and
the second insulating layer is disposed in the second recess of the second overlying metal finger structure to insulate the second overlying metal finger structure from the first underlying metal finger structure.

7. The capacitor of claim 1, further comprising a back-end-of-line (BEOL) interconnect structure, comprising:
an underlying metallization layer comprising the underlying interconnect layer; and
an overlying metallization layer comprising the overlying interconnect layer;
the overlying metallization layer disposed adjacent to the underlying metallization layer in the vertical direction.

8. The capacitor of claim 1, wherein:
the plurality of first underlying metal lines are of a first polarity;
the plurality of second underlying metal lines are of a second polarity;
the plurality of first overlying metal lines are of the first polarity; and
the plurality of second overlying metal lines are of the second polarity.

9. The capacitor of claim 1, wherein:
the plurality of first underlying metal lines and the plurality of second underlying metal lines each extends in a first horizontal direction parallel to each other; and
the plurality of first overlying metal lines and the plurality of second overlying metal lines each extends in a second horizontal direction parallel to each other, and orthogonal to the first horizontal direction.

10. The capacitor of claim 1, wherein:
the plurality of first underlying metal lines and the plurality of second underlying metal lines each extends in a first horizontal direction parallel to each other; and
the plurality of first overlying metal lines and the plurality of second overlying metal lines each extends in the first horizontal direction parallel to each other.

11. The capacitor of claim 10, wherein:
each of the plurality of first underlying metal lines is disposed directly underneath a respective second overlying metal line among the plurality of second overlying metal lines in the vertical direction; and
each of the plurality of second underlying metal lines is disposed directly underneath a respective first overlying metal line among the plurality of first overlying metal lines in the vertical direction.

12. The capacitor of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

13. The capacitor of claim 1, wherein a first surface of the overlying interconnect layer adjacent to the underlying interconnect layer is disposed directly in contact with a first surface of the underlying interconnect layer adjacent to the overlying interconnect layer.

14. The capacitor of claim 1, not comprising a via layer disposed between the overlying interconnect layer and the underlying interconnect layer.

15. The capacitor of claim 1, wherein the first overlying metal finger structure further extends horizontally from the first connection region in a first horizontal direction of the first underlying metal finger structure.

* * * * *